US005871656A

United States Patent [19]
Silverbrook

[11] Patent Number: 5,871,656
[45] Date of Patent: Feb. 16, 1999

[54] CONSTRUCTION AND MANUFACTURING PROCESS FOR DROP ON DEMAND PRINT HEADS WITH NOZZLE HEATERS

[75] Inventor: Kia Silverbrook, Leichhardt, Australia

[73] Assignee: Eastman Kodak Company, Rochester, N.Y.

[21] Appl. No.: 733,711

[22] Filed: Oct. 17, 1996

[30] Foreign Application Priority Data

Oct. 30, 1995 [AU] Australia ............................ PN95/6238

[51] Int. Cl.[6] ............................... H01L 21/00; B44C 1/22

[52] U.S. Cl. .................................. 216/27; 216/2; 216/16; 216/56

[58] Field of Search .................................. 216/2, 27, 16, 216/18, 39, 41, 56

[56] References Cited

U.S. PATENT DOCUMENTS

| | | | |
|---|---|---|---|
| 1,941,001 | 12/1933 | Hansell . | |
| 3,373,437 | 3/1968 | Sweet et al. . | |
| 3,416,153 | 12/1968 | Hertz et al. . | |
| 3,946,398 | 3/1976 | Kyser et al. . | |
| 4,047,184 | 9/1977 | Bassous et al. | 216/27 X |
| 4,164,745 | 8/1979 | Cielo et al. | 347/61 |
| 4,275,290 | 6/1981 | Cielo et al. | 347/56 X |
| 4,490,728 | 12/1984 | Vaught et al. . | |
| 4,580,158 | 4/1986 | Macheboeuf . | |
| 4,737,803 | 4/1988 | Fujimura et al. . | |
| 4,748,458 | 5/1988 | Inoue et al. . | |
| 5,308,442 | 5/1994 | Taub et al. | 216/27 |
| 5,371,527 | 12/1994 | Miller et al. . | |
| 5,565,113 | 10/1996 | Hadimioglu et al. | 216/27 X |

FOREIGN PATENT DOCUMENTS

| | | | |
|---|---|---|---|
| 0 244 214 | 11/1987 | European Pat. Off. | B41J 3/04 |
| 0 498 292 A2 | 8/1992 | European Pat. Off. | B41J 2/16 |
| 2 007 162 A | 5/1979 | United Kingdom | B41J 3/04 |

OTHER PUBLICATIONS

Terajima Shigeru et al, Liquid Jet Recording Head, Journal:M, Mar. 16, 1990 , section No. 950, vol. 14, No. 140 p. 92.

Miura Masayoshi et al, Ink Jet Recording Head and Its Preparation, Jun. 18, 1985; Section M, Section No. 388, vol. 09, No. 142 p. 162.

*Primary Examiner*—William Powell
*Attorney, Agent, or Firm*—Milton S. Sales

[57] ABSTRACT

A construction and manufacturing process for drop on demand print heads provides electrothermal heating elements which are in close proximity to the tip of the nozzle, and therefore achieve efficient thermal coupling to the ink.

The construction utilizes metal layer electrodes formed as part of a CMOS drive circuit fabrication on a silicon wafer. A nozzle tip hole is then etched with an axis generally normal to the electrode layers. A heater substance and a passivation layer are deposited on the wafer. These layers are then anisotropically etched, leaving heater and passivation layers on the vertical sidewalls of the nozzle tip hole. Ink channels and nozzle barrels are then etched in the wafer, preferably using an etchant which has a high selectivity against the passivation layer and heater material, such as EDP.

13 Claims, 38 Drawing Sheets

CONSTRUCTION AND MANUFACTURING PROCESS FOR DROP ON DEMAND PRINT HEADS WITH NOZZLE HEATERS

CROSS REFERENCE TO RELATED APPLICATIONS

Reference is made to my commonly assigned, co-pending U.S. patent applications: Ser. No. 08/701,021 entitled CMOS PROCESS COMPATIBLE FABRICATION OF PRINT HEADS filed Aug. 21, 1996; Ser. No. 08/734,822 entitled A MODULAR PRINT HEAD ASSEMBLY filed Oct. 22, 1996; Ser. No. 08/736,537 entitled PRINT HEAD CONSTRUCTIONS FOR REDUCED ELECTROSTATIC INTERACTION BETWEEN PRINTED DROPLETS filed Oct. 24, 1996; Ser. No. 08/750,320 entitled NOZZLE DUPLICATION FOR FAULT TOLERANCE IN INTEGRATED PRINTING HEADS and Ser. No. 08/750,312 entitled HIGH CAPACITY COMPRESSED DOCUMENT IMAGE STORAGE FOR DIGITAL COLOR PRINTERS both filed Nov. 26, 1996; Ser. No. 08/753,718 entitled NOZZLE PLACEMENT IN MONOLITHIC DROP-ON-DEMAND PRINT HEADS and Ser. No. 08/750,606 entitled A COLOR VIDEO PRINTER AND A PHOTO CD SYSTEM WITH INTEGRATED PRINTER both filed on Nov. 27, 1996; Ser. No. 08/750,438 entitled A LIQUID INK PRINTING APPARATUS AND SYSTEM, Ser. No. 08/750,599 entitled COINCIDENT DROP SELECTION, DROP SEPARATION PRINTING METHOD AND SYSTEM, Ser. No. 08/750,435 entitled MONOLITHIC PRINT HEAD STRUCTURE AND A MANUFACTURING PROCESS THEREFOR USING ANISTROPIC WET ETCHING, Ser. No. 08/750,436 entitled POWER SUPPLY CONNECTION FOR MONOLITHIC PRINT HEADS, Ser. No. 08/750,437 entitled MODULAR DIGITAL PRINTING, Ser. No. 08/750,439 entitled A HIGH SPEED DIGITAL FABRIC PRINTER, Ser. No. 08/750,763 entitled A COLOR PHOTOCOPIER USING A DROP ON DEMAND INK JET PRINTING SYSTEM, Ser. No. 08/765,756 entitled PHOTOGRAPH PROCESSING AND COPYING SYSTEMS, Ser. No. 08/750,646 entitled FAX MACHINE WITH CONCURRENT DROP SELECTION AND DROP SEPARATION INK JET PRINTING, Ser. No. 08/759,774 entitled FAULT TOLERANCE IN HIGH VOLUME PRINTING PRESSES, Ser. No. 08750,429 entitled INTEGRATED DRIVE CIRCUITRY IN DROP ON DEMAND PRINT HEADS, Ser. No. 08/750,433 entitled HEATER POWER COMPENSATION FOR TEMPERATURE IN THERMAL PRINTING SYSTEMS, Ser. No. 08/750,640 entitled HEATER POWER COMPENSATION FOR THERMAL LAG IN THERMAL PRINTING SYSTEMS, Ser. No. 08/750,650 entitled DATA DISTRIBUTION IN MONOLITHIC PRINT HEADS, and Ser. No. 08/750,642 entitled PRESSURIZABLE LIQUID INK CARTRIDGE FOR COINCIDENT FORCES PRINTERS all filed Dec. 3, 1996; Ser. No. 08/750,647 entitled MONOLITHIC PRINTING HEADS AND MANUFACTURING PROCESSES THEREFOR, Ser. No. 08/750,604 entitled INTEGRATED FOUR COLOR PRINT HEADS, Ser. No. 08/750,605 entitled A SELF-ALIGNED CONSTRUCTION AND MANUFACTURING PROCESS FOR MONOLITHIC PRINT HEADS, Ser. No. 08/682,603 entitled A COLOR PLOTTER USING CONCURRENT DROP SELECTION AND DROP SEPARATION INK JET PRINTING TECHNOLOGY, Ser. No. 08/750,603 entitled A NOTEBOOK COMPUTER WITH INTEGRATED CONCURRENT DROP SELECTION AND DROP SEPARATION COLOR PRINTING SYSTEM, Ser. No. 08/765,130 entitled INTEGRATED FAULT TOLERANCE IN PRINTING MECHANISMS; Ser. No. 08/750,431 entitled BLOCK FAULT TOLERANCE IN INTEGRATED PRINTING HEADS, Ser. No. 08/750,607 entitled FOUR LEVEL INK SET FOR BI-LEVEL COLOR PRINTING, Ser. No. 08/750,430 entitled A NOZZLE CLEARING PROCEDURE FOR LIQUID INK PRINTING, Ser. No. 08/750,600 entitled METHOD AND APPARATUS FOR ACCURATE CONTROL OF TEMPERATURE PULSES IN PRINTING HEADS, Ser. No. 08/750,608 entitled A PORTABLE PRINTER USING A CONCURRENT DROP SELECTION AND DROP SEPARATION PRINTING SYSTEM, and Ser. No. 08/750,602 entitled IMPROVEMENTS IN IMAGE HALFTONING all filed Dec. 4, 1996; Ser. No. 08/765,127 entitled PRINTING METHOD AND APPARATUS EMPLOYING ELECTROSTATIC DROP SEPARATION, Ser. No. 08/750,643 entitled COLOR OFFICE PRINTER WITH A HIGH CAPACITY DIGITAL PAGE IMAGE STORE, and Ser. No. 08/765,035 entitled HEATER POWER COMPENSATION FOR PRINTING LOAD IN THERMAL PRINTING SYSTEMS all filed Dec. 5, 1996; Ser. No. 08/765,036 entitled APPARATUS FOR PRINTING MULTIPLE DROP SIZES AND FABRICATION THEREOF, Ser. No. 08/765,017 entitled HEATER STRUCTURE AND FABRICATION PROCESS FOR MONOLITHIC PRINT HEADS, Ser. No. 08/750,772 entitled DETECTION OF FAULTY ACTUATORS IN PRINTING HEADS, Ser. No. 08/765,037 entitled PAGE IMAGE AND FAULT TOLERANCE CONTROL APPARATUS FOR PRINTING SYSTEMS all filed Dec. 9, 1996; and Ser. No. 08/765,038 entitled CONSTRUCTIONS AND MANUFACTURING PROCESSES FOR THERMALLY ACTIVATED PRINT HEADS filed Dec. 10, 1996.

FIELD OF THE INVENTION

The present invention is in the field of computer controlled printing devices. In particular, the field is manufacturing processes for thermally activated drop on demand (DOD) printing heads.

BACKGROUND OF THE INVENTION

Many different types of digitally controlled printing systems have been invented, and many types are currently in production. These printing systems use a variety of actuation mechanisms, a variety of marking materials, and a variety of recording media. Examples of digital printing systems in current use include: laser electrophotographic printers; LED electrophotographic printers; dot matrix impact printers; thermal paper printers; film recorders; thermal wax printers; dye diffusion thermal transfer printers; and ink jet printers. However, at present, such electronic printing systems have not significantly replaced mechanical printing presses, even though this conventional method requires very expensive setup and is seldom commercially viable unless a few thousand copies of a particular page are to be printed. Thus, there is a need for improved digitally controlled printing systems, for example, being able to produce high quality color images at a high-speed and low cost, using standard paper.

Inkjet printing has become recognized as a prominent contender in the digitally controlled, electronic printing arena because, e.g., of its non-impact, low-noise characteristics, its use of plain paper and its avoidance of toner transfers and fixing.

Many types of ink jet printing mechanisms have been invented. These can be categorized as either continuous ink jet (CIJ) or drop on demand (DOD) ink jet. Continuous ink jet printing dates back to at least 1929: Hansell, U.S. Pat. No. 1,941,001.

Sweet et al U.S. Pat. No. 3,373,437, 1967, discloses an array of continuous ink jet nozzles where ink drops to be printed are selectively charged and deflected towards the recording medium. This technique is known as binary deflection CIJ, and is used by several manufacturers, including Elmjet and Scitex.

Hertz et al U.S. Pat. No. 3,416,153, 1966, discloses a method of achieving variable optical density of printed spots in CIJ printing using the electrostatic dispersion of a charged drop stream to modulate the number of droplets which pass through a small aperture. This technique is used in ink jet printers manufactured by Iris Graphics.

Kyser et al U.S. Pat. No. 3,946,398, 1970, discloses a DOD ink jet printer which applies a high voltage to a piezoelectric crystal, causing the crystal to bend, applying pressure on an ink reservoir and jetting drops on demand. Many types of piezoelectric drop on demand printers have subsequently been invented, which utilize piezoelectric crystals in bend mode, push mode, shear mode, and squeeze mode. Piezoelectric DOD printers have achieved commercial success using hot melt inks (for example, Tektronix and Dataproducts printers), and at image resolutions up to 720 dpi for home and office printers (Seiko Epson). Piezoelectric DOD printers have an advantage in being able to use a wide range of inks. However, piezoelectric printing mechanisms usually require complex high voltage drive circuitry and bulky piezoelectric crystal arrays, which are disadvantageous in regard to manufacturability and performance.

Endo et al GB Pat. No. 2,007,162, 1979, discloses an electrothermal DOD ink jet printer which applies a power pulse to an electrothermal transducer (heater) which is in thermal contact with ink in a nozzle. The heater rapidly heats water based ink to a high temperature, whereupon a small quantity of ink rapidly evaporates, forming a bubble. The formation of these bubbles results in a pressure wave which cause drops of ink to be ejected from small apertures along the edge of the heater substrate. This technology is known as Bubblejet™ (trademark of Canon K. K. of Japan), and is used in a wide range of printing systems from Canon, Xerox, and other manufacturers.

Vaught et al U.S. Pat. No. 4,490,728, 1982, discloses an electrothermal drop ejection system which also operates by bubble formation. In this system, drops are ejected in a direction normal to the plane of the heater substrate, through nozzles formed in an aperture plate positioned above the heater. This system is known as Thermal Ink Jet, and is manufactured by Hewlett-Packard. In this document, the term Thermal Ink Jet is used to refer to both the Hewlett-Packard system and systems commonly known as Bubblejet™.

Thermal Ink Jet printing typically requires approximately 20 $\mu$J over a period of approximately 2 $\mu$s to eject each drop. The 10 Watt active power consumption of each heater is disadvantageous in itself and also necessitates special inks, complicates the driver electronics and precipitates deterioration of heater elements.

Other ink jet printing systems have also been described in technical literature, but are not currently used on a commercial basis. For example, U.S. Pat. No. 4,275,290 discloses a system wherein the coincident address of predetermined print head nozzles with heat pulses and hydrostatic pressure, allows ink to flow freely to spacer-separated paper, passing beneath the print head. U.S. Pat. Nos. 4,737,803 and 4,748,458 disclose ink jet recording systems wherein the coincident address of ink in print head nozzles with heat pulses and an electrostatically attractive field cause ejection of ink drops to a print sheet.

Each of the above-described inkjet printing systems has advantages and disadvantages. However, there remains a widely recognized need for an improved ink jet printing approach, providing advantages for example, as to cost, speed, quality, reliability, power usage, simplicity of construction and operation, durability and consumables.

SUMMARY OF THE INVENTION

My prior applications Ser. No. 08/750,438 entitled A LIQUID INK PRINTING APPARATUS AND SYSTEM and Ser. No. 08/750,599 entitled COINCIDENT DROP SELECTION, DROP SEPARATION PRINTING METHOD AND SYSTEM, both filed on Dec. 3, 1996, describe new methods and apparatus that afford significant improvements toward overcoming the prior art problems discussed above. Those inventions offer important advantages, e.g. in regard to drop size and placement accuracy, as to printing speeds attainable, as to power usage, as to durability and operative thermal stresses encountered and as to other printer performance characteristics, as well as in regard to manufacturability and the characteristics of useful inks. One important purpose of the present invention is to further enhance the structures and methods described in those applications and thereby contribute to the advancement of printing technology.

One important object of the invention is to provide a manufacturing process for fabricating nozzle structures for a thermally activated drop on demand printing heads.

In one aspect the invention provides a process for manufacturing a thermally activated drop on demand printing head and includes 1) forming a plurality of electrodes on a substrate 2) forming a surface layer on the front surface of the substrate 3) etching a plurality of nozzle tip holes through the surface layer, intersecting the electrodes 4) coating the nozzle tip holes with a heater substance, in such a manner that electrical contact is made between the electrodes and the heater substance; and 5) removing the heater substance from regions apart from the nozzle tip holes.

A further preferred aspect of the invention, the manufacturing process also includes the process step of etching part of the surface layer so that the heater forms a rim protruding from the surface layer.

A further preferred aspect of the invention is that the manufacturing process also includes coating the heater with a passivation layer before removing the heater substance from regions apart from the nozzle tip holes, and removing the passivation layer from regions apart from the nozzle tip holes.

A further preferred aspect of the invention is that the passivation layer is composed of silicon nitride.

A further preferred aspect of the invention is that the manufacturing process also includes the process step of simultaneously etching a plurality of barrel holes wherein the etchant accesses the front surface of the substrate through the nozzle tip holes.

A further preferred aspect of the invention is that the manufacturing process also includes the process step of anisotropically etching one or more ink channels from the back surface of the substrate.

A further preferred aspect of the invention is that the substrate is composed of single crystal silicon.

A further preferred aspect of the invention is that the substrate is a single crystal silicon wafer of <100> crystallographic orientation.

A further preferred aspect of the invention is that the surface layer is substantially composed of silicon dioxide.

A further preferred aspect of the invention is that the nozzle tip hole is fabricated with a radius less than 50 microns.

A further preferred aspect of the invention is that the substrate is composed of single crystal silicon, and the ink channels are etched exposing {111} crystallographic planes of the substrate.

A further preferred aspect of the invention is that drive circuitry is fabricated on the same substrate as the nozzles.

BRIEF DESCRIPTION OF THE DRAWINGS

FIG. 1 (*b*) shows a cross section of one variety of nozzle tip in accordance with the invention.

FIG. 3(*b*) shows successive meniscus positions during drop selection and separation.

FIG. 3(*c*) shows the temperatures at various points during a drop selection cycle.

FIG. 3(*d*) shows measured surface tension versus temperature curves for various ink additives.

FIG. 3(*e*) shows the power pulses which are applied to the nozzle heater to generate the temperature curves of FIG. 3(*c*).

DETAILED DESCRIPTION OF PREFERRED EMBODIMENTS

Figure 1A:
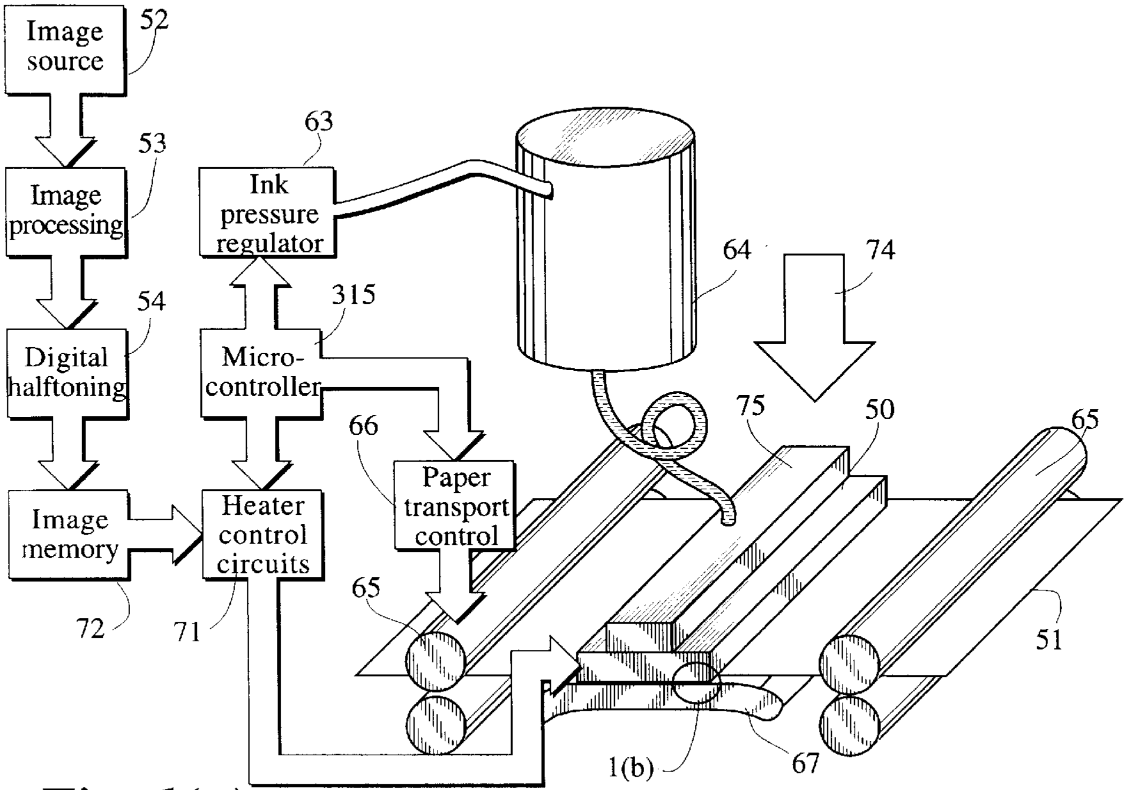
FIG. 1 (*a*) shows a simplified block schematic diagram of one exemplary printing apparatus according to the present invention.

In one general aspect, the invention constitutes a drop-on-demand printing mechanism wherein the means of selecting drops to be printed produces a difference in position between selected drops and drops which are not selected, but which is insufficient to cause the ink drops to overcome the ink surface tension and separate from the body of ink, and wherein an alternative means is provided to cause separation of the selected drops from the body of ink.

The separation of drop selection means from drop separation means significantly reduces the energy required to select which ink drops are to be printed. Only the drop selection means must be driven by individual signals to each nozzle. The drop separation means can be a field or condition applied simultaneously to all nozzles.

The drop selection means may be chosen from, but is not limited to, the following list:

1) Electrothermal reduction of surface tension of pressurized ink
2) Electrothermal bubble generation, with insufficient bubble volume to cause drop ejection
3) Piezoelectric, with insufficient volume change to cause drop ejection
4) Electrostatic attraction with one electrode per nozzle The drop separation means may be chosen from, but is not limited to, the following list:

1) Proximity (recording medium in close proximity to print head)
2) Proximity with oscillating ink pressure
3) Electrostatic attraction
4) Magnetic attraction The table "DOD printing technology targets" shows some desirable characteristics of drop on demand printing technology. The table also lists some methods by which some embodiments described herein, or in other of my related applications, provide improvements over the prior art.

DOD printing technology targets

| Target | Method of achieving improvement over prior art |
|---|---|
| High speed operation | Practical, low cost, pagewidth printing heads with more than 10,000 nozzles. Monolithic A4 pagewidth print heads can be manufactured using standard 300 mm |

-continued

| DOD printing technology targets | |
|---|---|
| Target | Method of achieving improvement over prior art |
| | (12") silicon wafers |
| High image quality | High resolution (800 dpi is sufficient for most applications), six color process to reduce image noise |
| Full color operation | Halftoned process color at 800 dpi using stochastic screening |
| Ink flexibility | Low operating ink temperature and no requirement for bubble formation |
| Low power requirements | Low power operation results from drop selection means not being required to fully eject drop |
| Low cost | Monolithic print head without aperture plate, high manufacturing yield, small number of electrical connections, use of modified existing CMOS manufacturing facilities |
| High manufacturing yield | Integrated fault tolerance in printing head |
| High reliability | Integrated fault tolerance in printing head. Elimination of cavitation and kogation. Reduction of thermal shock. |
| Small number of electrical connections | Shift registers, control logic, and drive circuitry can be integrated on a monolithic print head using standard CMOS processes |
| Use of existing VLSI manufacturing facilities | CMOS compatibility. This can be achieved because the heater drive power is less is than 1% of Thermal Ink Jet heater drive power |
| Electronic collation | A new page compression system which can achieve 100:1 compression with insignificant image degradation, resulting in a compressed data rate low enough to allow real-time printing of any combination of thousands of pages stored on a low cost magnetic disk drive. |

In thermal ink jet (TIJ) and piezoelectric ink jet systems, a drop velocity of approximately 10 meters per second is preferred to ensure that the selected ink drops overcome ink surface tension, separate from the body of the ink, and strike the recording medium. These systems have a very low efficiency of conversion of electrical energy into drop kinetic energy. The efficiency of TIJ systems is approximately 0.02%). This means that the drive circuits for TIJ print heads must switch high currents. The drive circuits for piezoelectric ink jet heads must either switch high voltages, or drive highly capacitive loads. The total power consumption of pagewidth TIJ printheads is also very high. An 800 dpi A4 full color pagewidth TIJ print head printing a four color black image in one second would consume approximately 6 kW of electrical power, most of which is converted to waste heat. The difficulties of removal of this amount of heat precludes the production of low cost, high speed, high resolution compact pagewidth TIJ systems.

One important feature of embodiments of the invention is a means of significantly reducing the energy required to select which ink drops are to be printed. This is achieved by separating the means for selecting ink drops from the means for ensuring that selected drops separate from the body of ink and form dots on the recording medium. Only the drop selection means must be driven by individual signals to each nozzle. The drop separation means can be a field or condition applied simultaneously to all nozzles.

The table "Drop selection means" shows some of the possible means for selecting drops in accordance with the invention. The drop selection means is only required to create sufficient change in the position of selected drops that the drop separation means can discriminate between selected and unselected drops.

| Drop selection means | | |
|---|---|---|
| Method | Advantage | Limitation |
| 1. Electrothermal reduction of surface tension of pressurized ink | Low temperature increase and low drop selection energy. Can be used with many ink types. Simple fabrication. CMOS drive circuits can be fabricated on same substrate | Requires ink pressure regulating mechanism. Ink surface tension must reduce substantially as temperature increases |
| 2. Electrothermal reduction of ink viscosity, combined with oscillating ink pressure | Medium drop selection energy, suitable for hot melt and oil based inks. Simple fabrication. CMOS drive circuits can | Requires ink pressure oscillation mechanism. Ink must have a large decrease in viscosity as temperature increases |

-continued

| Drop selection means | | |
|---|---|---|
| Method | Advantage | Limitation |
| | be fabricated on same substrate | |
| 3. Electrothermal bubble generation, with insufficient bubble volume to cause drop ejection | Well known technology, simple fabrication, bipolar drive circuits can be fabricated on same substrate | High drop selection energy, requires water based ink, problems with kogation, cavitation, thermal stress |
| 4. Piezoelectric, with insufficient volume change to cause drop ejection | Many types of ink base can be used | High manufacturing cost, incompatible with integrated circuit processes, high drive voltage, mechanical complexity, bulky |
| 5. Electrostatic attraction with one electrode per nozzle | Simple electrode fabrication | Nozzle pitch must be relatively large. Crosstalk between adjacent electric fields. Requires high voltage drive circuits |

Other drop selection means may also be used.

The preferred drop selection means for water based inks is method 1: "Electrothermal reduction of surface tension of pressurized ink". This drop selection means provides many advantages over other systems, including; low power operation (approximately 1% of TIJ), compatibility with CMOS VLSI chip fabrication, low voltage operation (approx. 10 V), high nozzle density, low temperature operation, and wide range of suitable ink formulations. The ink must exhibit a reduction in surface tension with increasing temperature.

The preferred drop selection means for hot melt or oil based inks is method 2: "Electrothermal reduction of ink viscosity, combined with oscillating ink pressure". This drop selection means is particularly suited for use with inks which exhibit a large reduction of viscosity with increasing temperature, but only a small reduction in surface tension. This occurs particularly with non-polar ink carriers with relatively high molecular weight. This is especially applicable to hot melt and oil based inks.

The table "Drop separation means" shows some of the possible methods for separating selected drops from the body of ink, and ensuring that the selected drops form dots on the printing medium. The drop separation means discriminates between selected drops and unselected drops to ensure that unselected drops do not form dots on the printing medium.

| Drop separation means | | |
|---|---|---|
| Means | Advantage | Limitation |
| 1. Electrostatic attraction | Can print on rough surfaces, simple implementation | Requires high voltage power supply |
| 2. AC electric field | Higher field strength is possible than electrostatic, operating margins can be increased, ink pressure reduced, and dust accumulation is reduced | Requires high voltage AC power supply synchronized to drop ejection phase. Multiple drop phase operation is difficult |
| 3. Proximity (print head in close proximity to, but not touching, recording medium) | Very small spot sizes can be achieved. Very low power dissipation. High drop position accuracy | Requires print medium to be very close to print head surface, not suitable for rough print media, usually requires transfer roller or belt |
| 4. Transfer Proximity (print head is in close proximity to a transfer roller or belt | Very small spot sizes can be achieved, very low power dissipation, high accuracy, can print on rough paper | Not compact due to size of transfer roller or transfer belt. |
| 5. Proximity with oscillating ink pressure | Useful for hot melt inks using viscosity reduction drop selection method, reduces possibility of nozzle clogging, can use pigments instead of dyes | Requires print medium to be very close to print head surface, not suitable for rough print media. Requires ink pressure oscillation apparatus |
| 6. Magnetic | Can print on rough | Requires uniform high |

-continued

| Drop separation means | | |
|---|---|---|
| Means | Advantage | Limitation |
| attraction | surfaces. Low power if permanent magnets are used | magnetic field strength, requires magnetic ink |

Other drop separation means may also be used.

The preferred drop separation means depends upon the intended use. For most applications, method 1: "Electrostatic attraction", or method 2: "AC electric field" are most appropriate. For applications where smooth coated paper or film is used, and very high speed is not essential, method 3: "Proximity" may be appropriate. For high speed, high quality systems, method 4: "Transfer proximity" can be used. Method 6: "Magnetic attraction" is appropriate for portable printing systems where the print medium is too rough for proximity printing, and the high voltages required for electrostatic drop separation are undesirable. There is no clear 'best' drop separation means which is applicable to all circumstances.

Further details of various types of printing systems according to the present invention are described in the following Australian patent specifications filed on 12 Apr. 1995, the disclosure of which are hereby incorporated by reference:

'A Liquid ink Fault Tolerant (LIFT) printing mechanism' (Filing no.: PN2308);

'Electrothermal drop selection in LIFT printing' (Filing no.: PN2309);

'Drop separation in LIFT printing by print media proximity' (Filing no.: PN2310);

'Drop size adjustment in Proximity LIFT printing by varying head to media distance' (Filing no.: PN2311);

'Augmenting Proximity LIFT printing with acoustic ink waves' (Filing no.: PN2312);

'Electrostatic drop separation in LIFT printing' (Filing no.: PN2313);

'Multiple simultaneous drop sizes in Proximity LIFT printing' (Filing no.: PN2321);

'Self cooling operation in thermally activated print heads' (Filing no.: PN2322); and 'Thermal Viscosity Reduction LIFT printing' (Filing no.: PN2323).

Figure 1B:
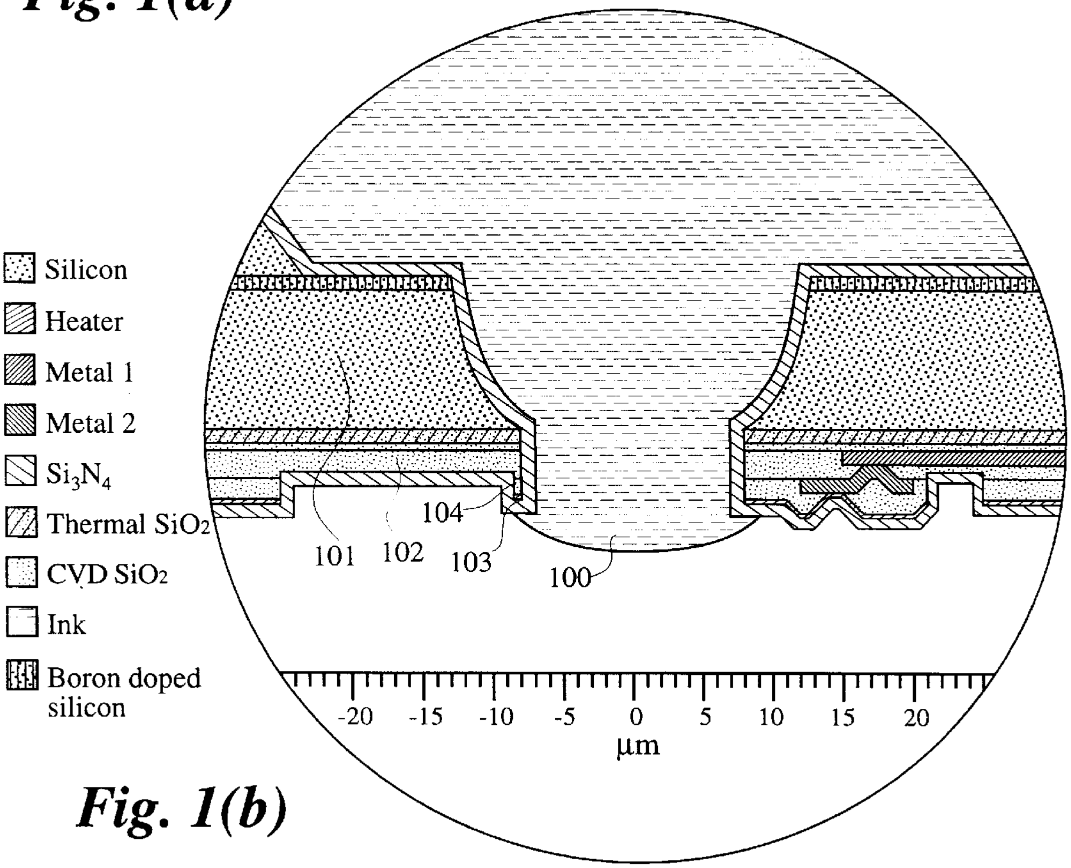
Figure 2A:
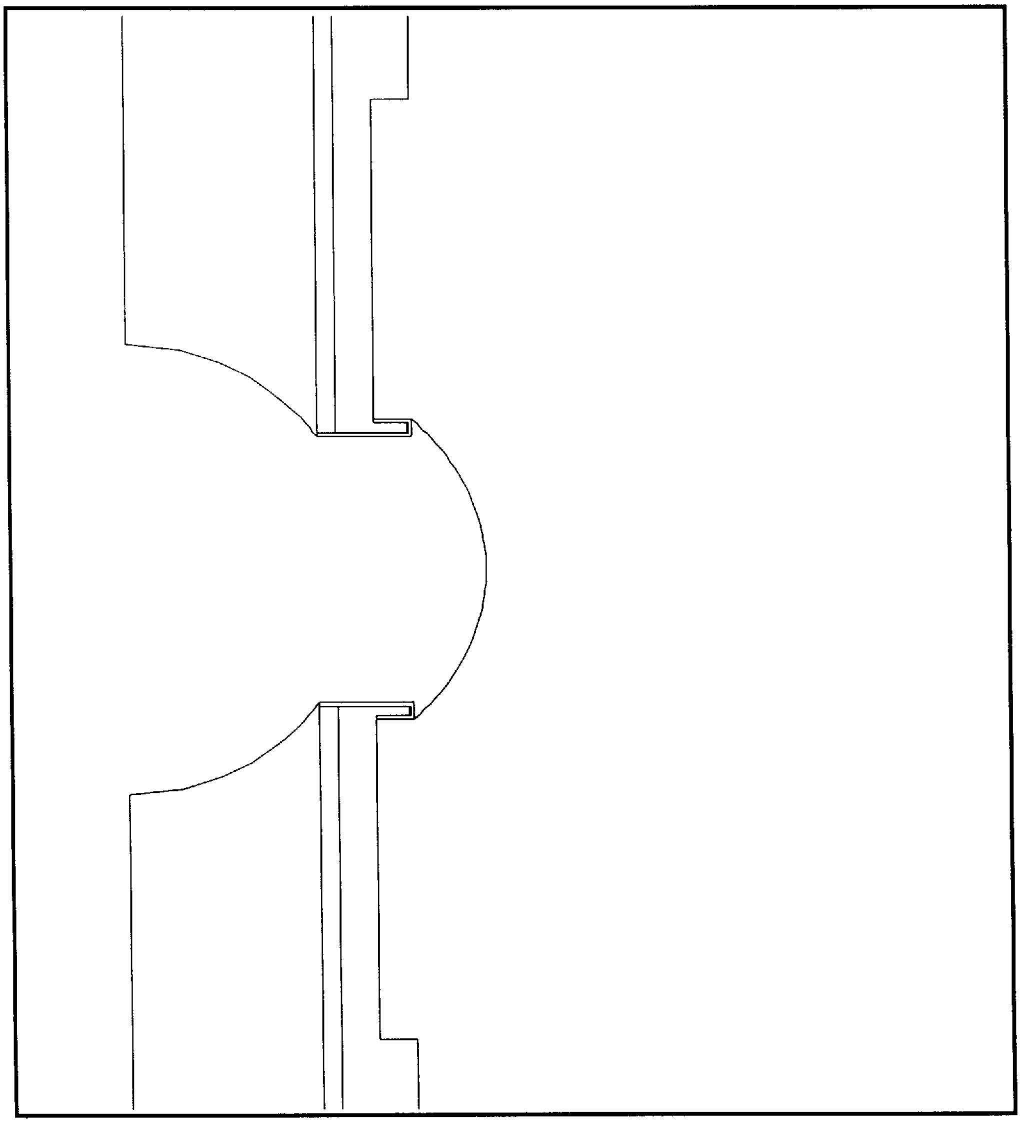
FIGS. 2(*a*) to 2(*f*) show fluid dynamic simulations of drop selection.
Figure 2B:
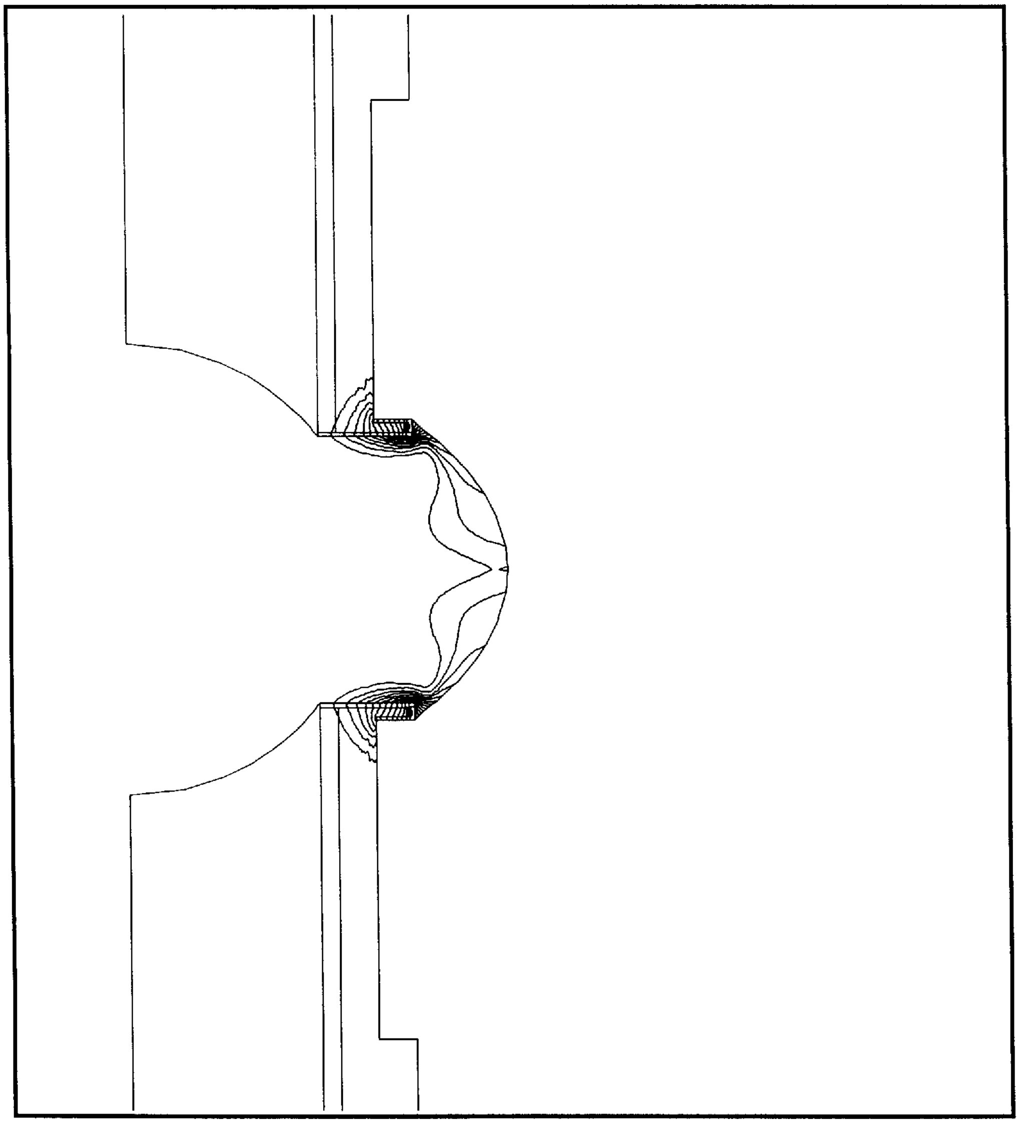
Figure 2C:
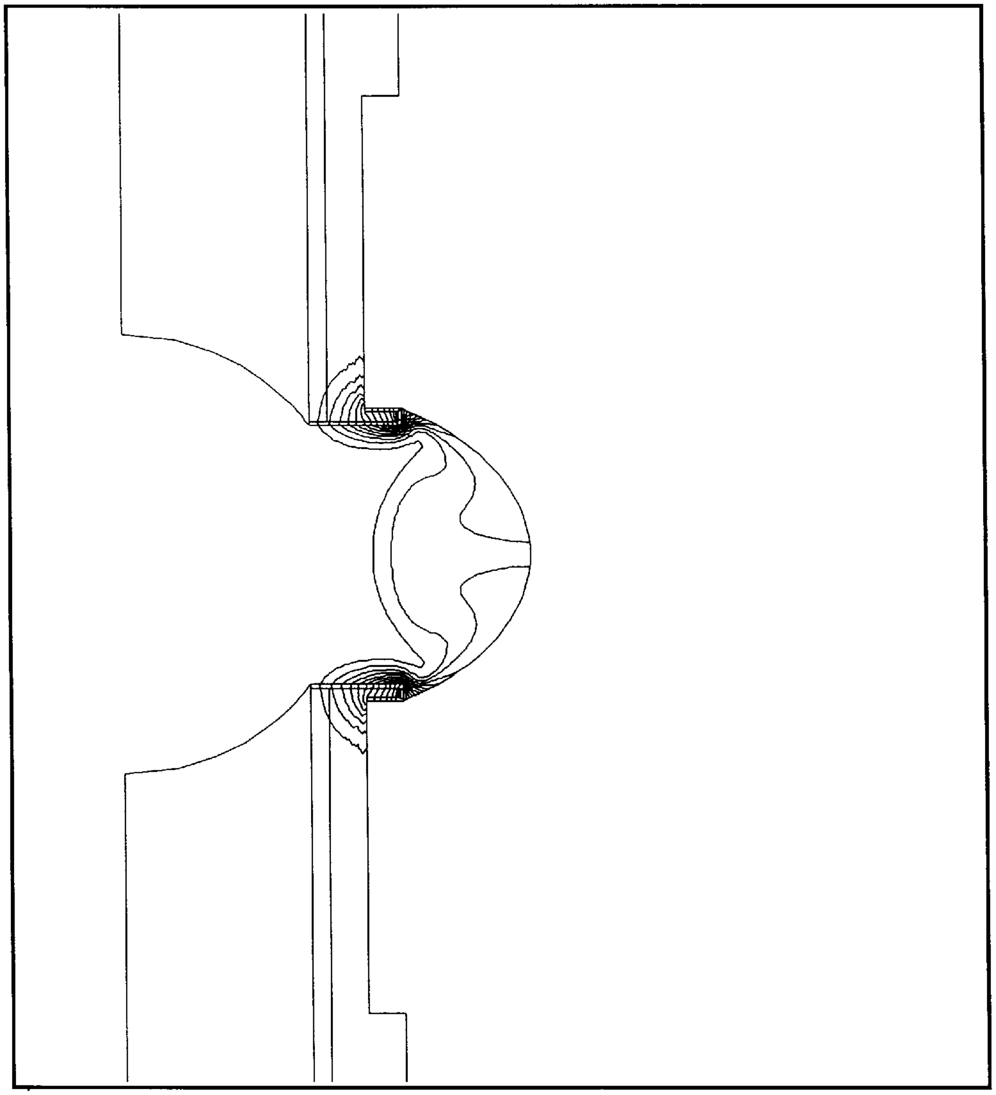
Figure 2D:
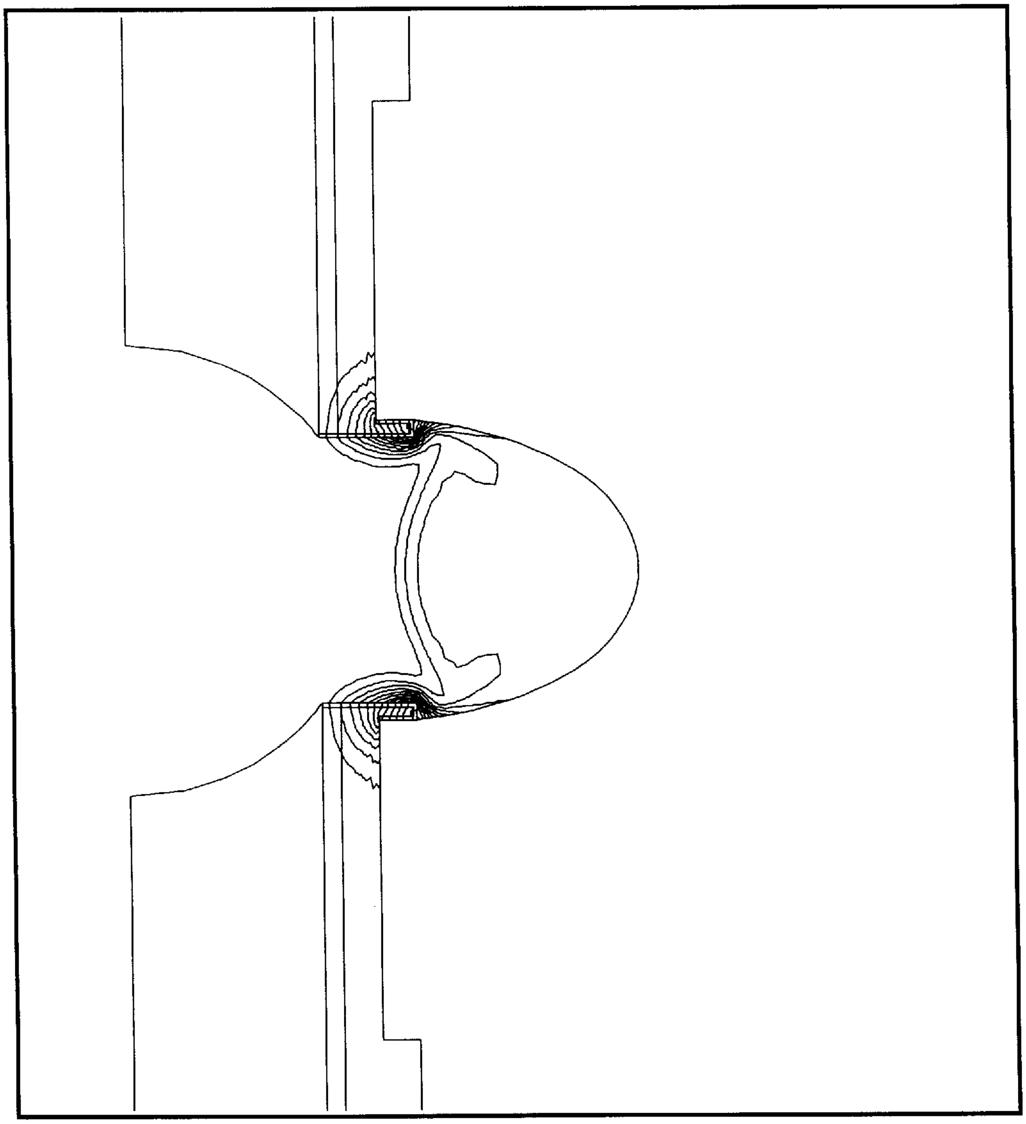
Figure 2E:
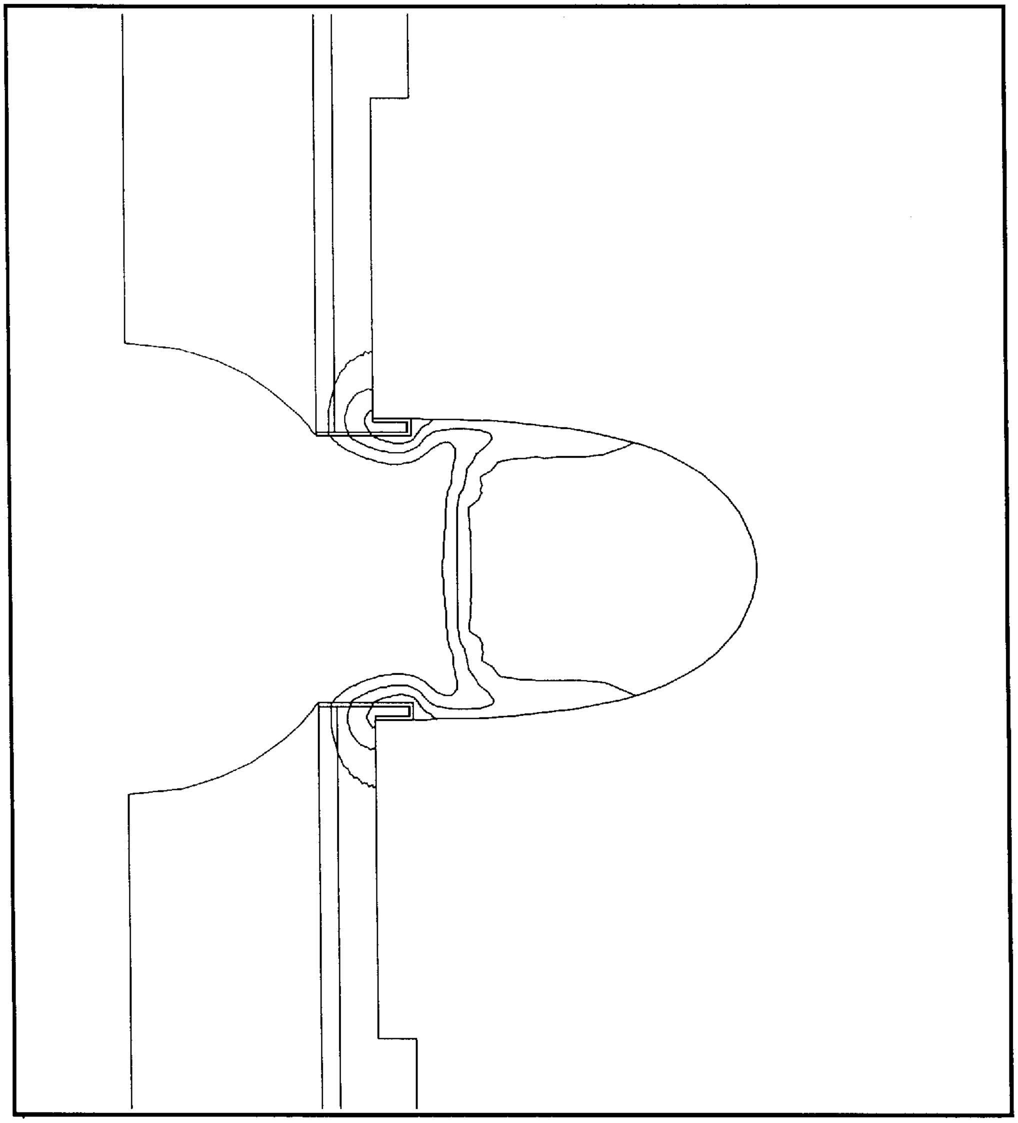
Figure 2F:
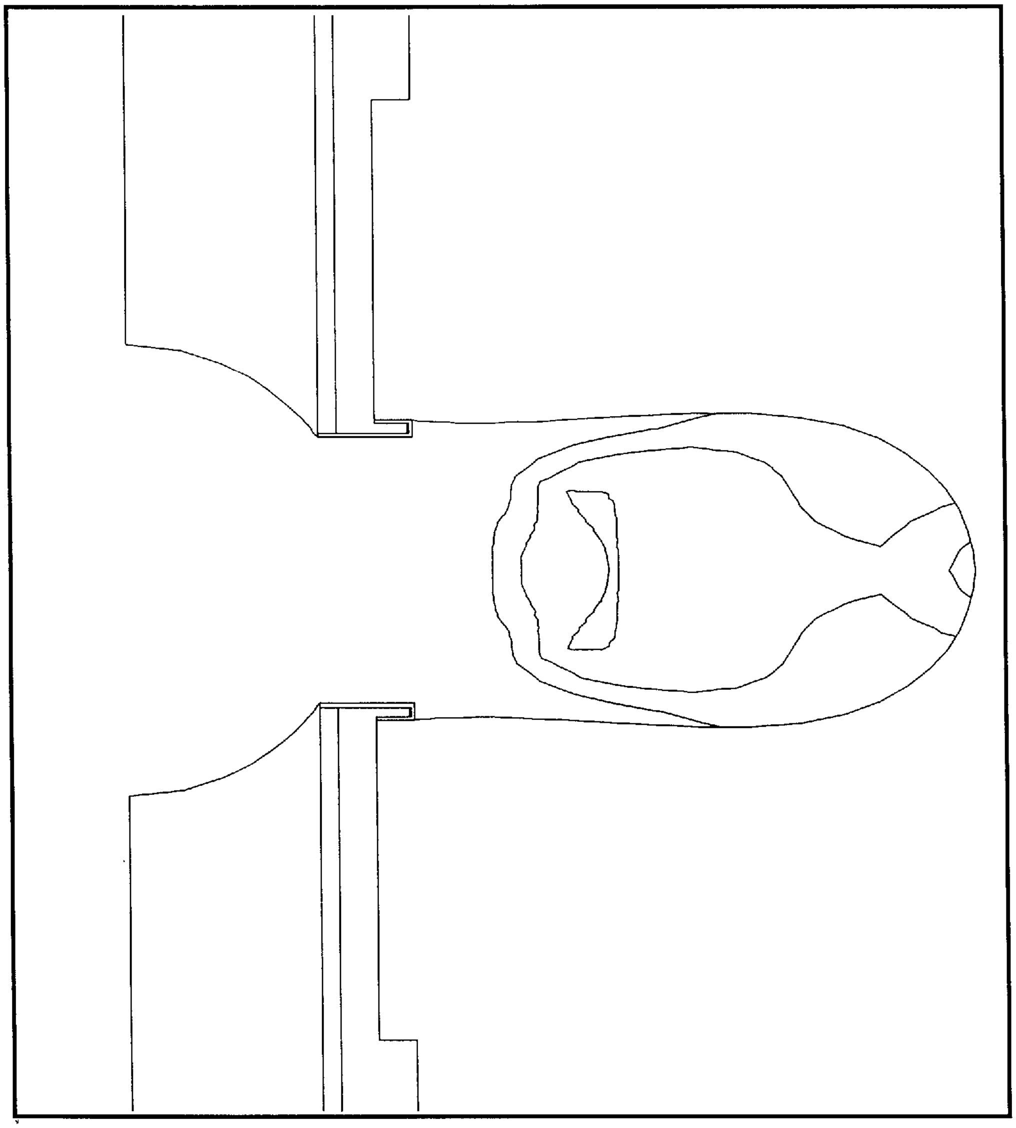
Figure 3A:
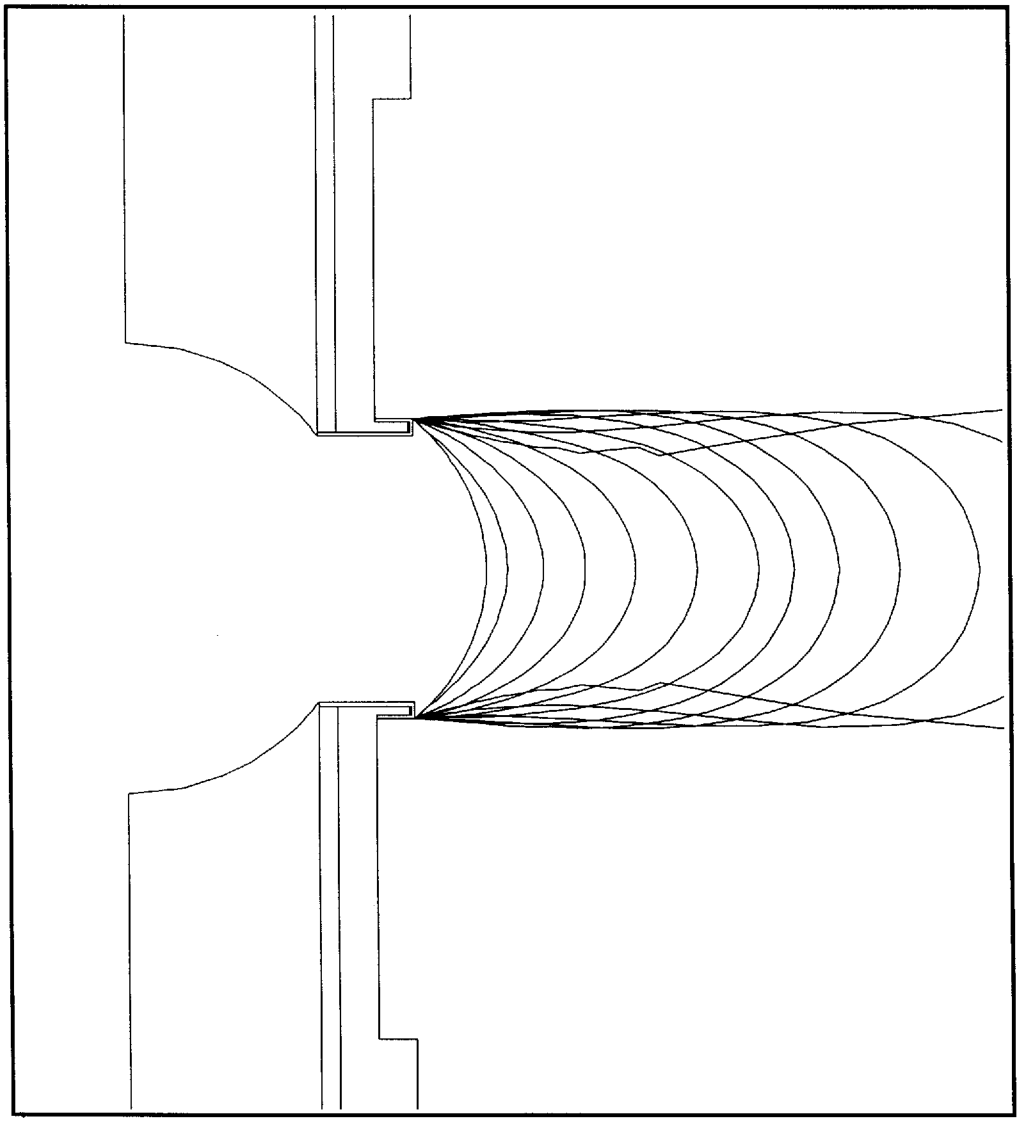
FIG. 3(*a*) shows a finite element fluid dynamic simulation of a nozzle in operation according to an embodiment of the invention.
Figure 3B:
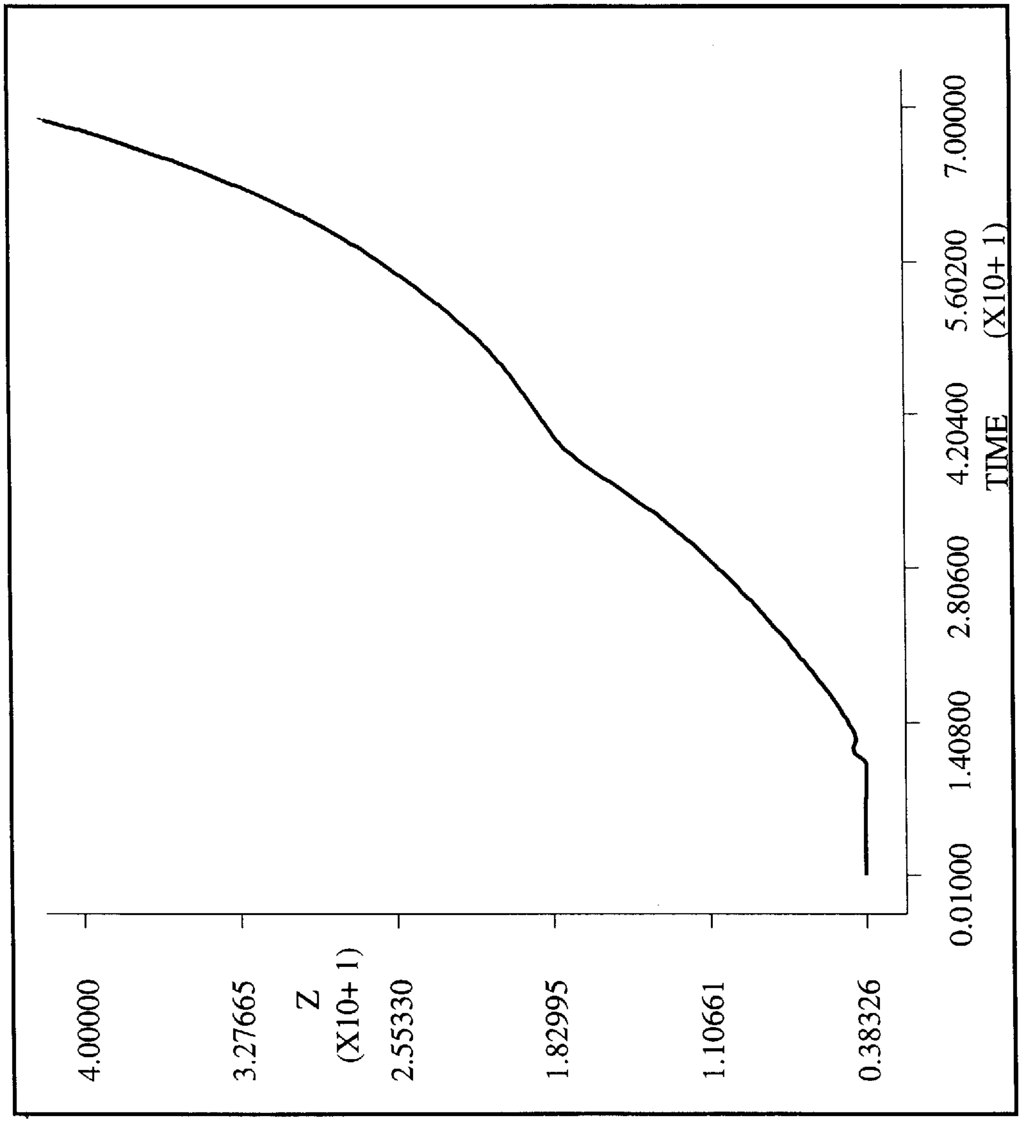
Figure 3C:
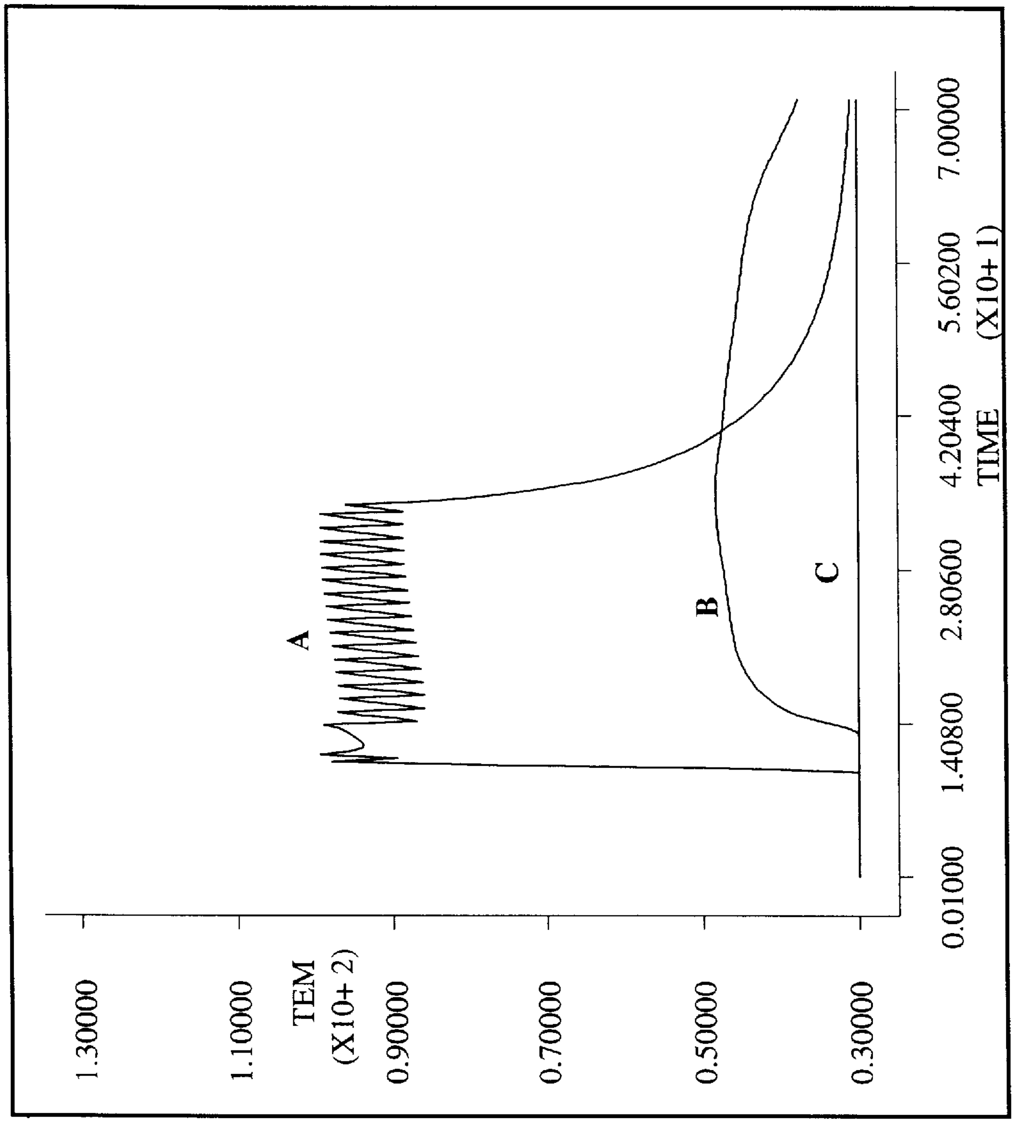
Figure 3D:
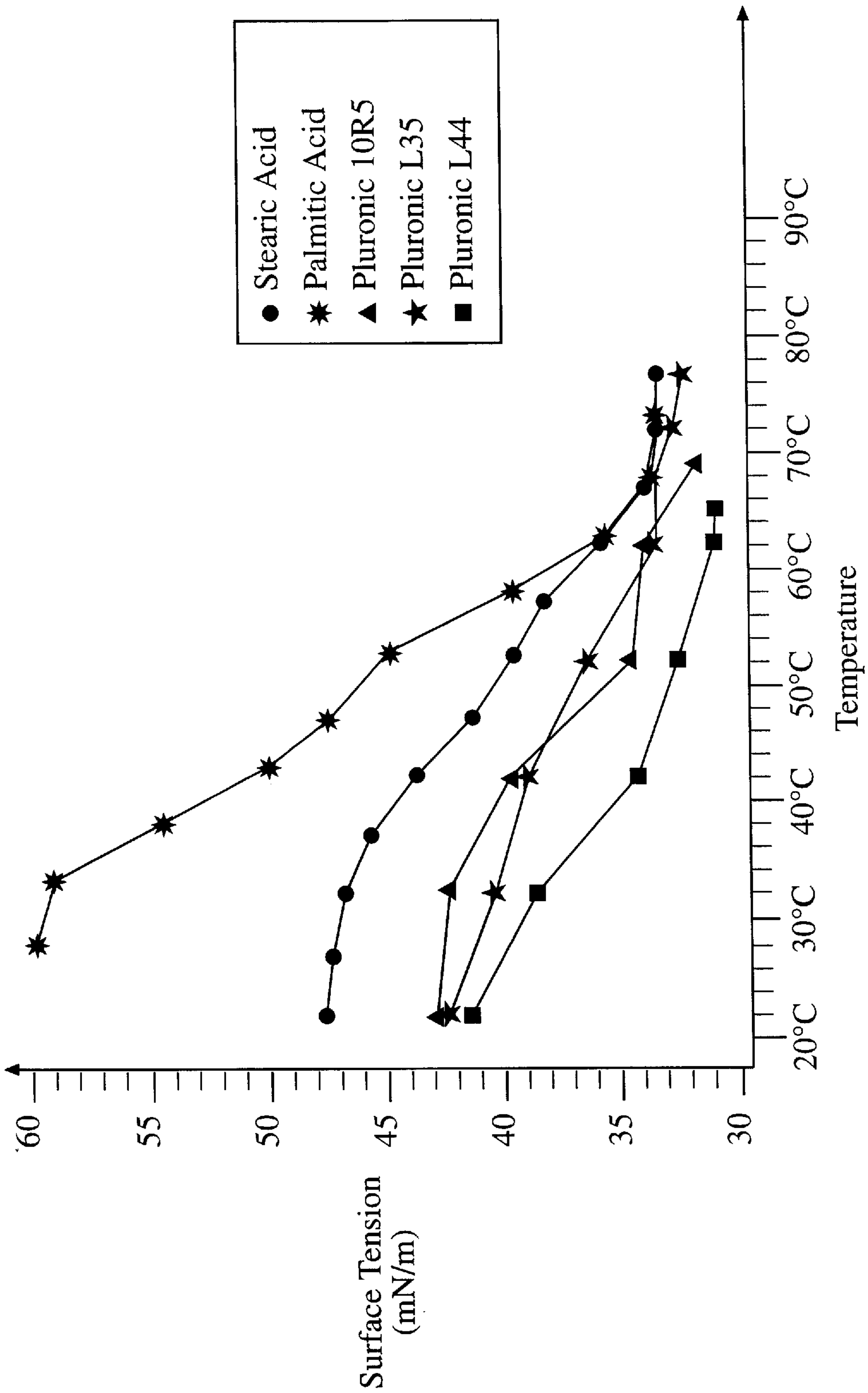
Figure 3E:
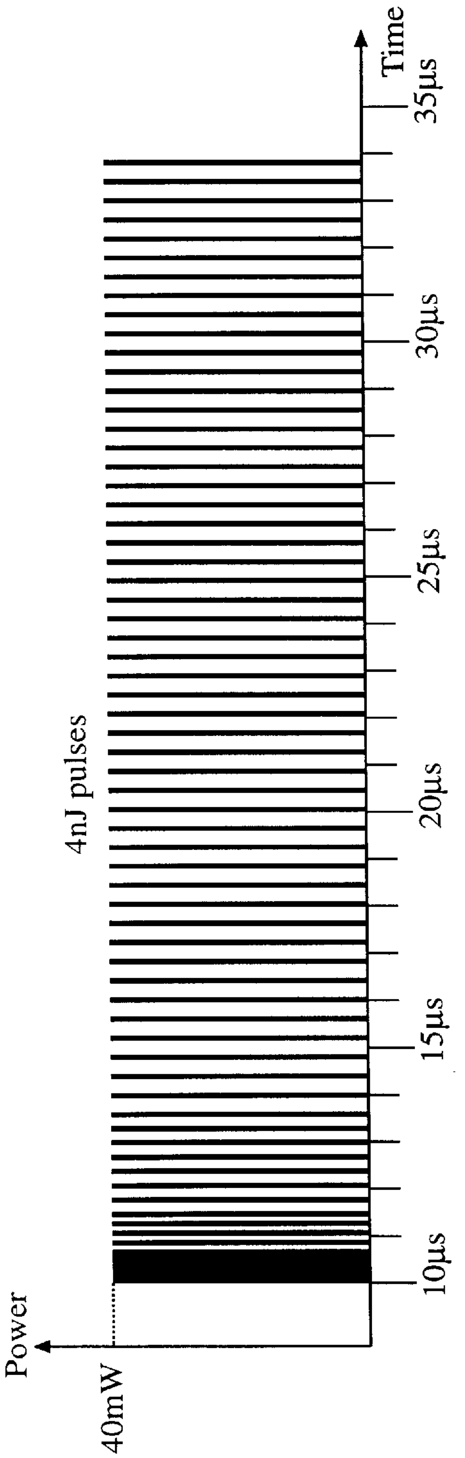

A simplified schematic diagram of one preferred printing system according to the invention appears in FIG. 1 (*a*).

An image source 52 may be raster image data from a scanner or computer, or outline image data in the form of a page description language (PDL), or other forms of digital image representation. This image data is converted to a pixel-mapped page image by the image processing system 53. This may be a raster image processor (RIP) in the case of PDL image data, or may be pixel image manipulation in the case of raster image data. Continuous tone data produced by the image processing unit 53 is halftoned. Halftoning is performed by the Digital Halftoning unit 54. Halftoned bitmap image data is stored in the image memory 72. Depending upon the printer and system configuration, the image memory 72 may be a full page memory, or a band memory. Heater control circuits 71 read data from the image memory 72 and apply time-varying electrical pulses to the nozzle heaters (103 in FIG. 1(*b*)) that are part of the print head 50. These pulses are applied at an appropriate time, and to the appropriate nozzle, so that selected drops will form spots on the recording medium 51 in the appropriate position designated by the data in the image memory 72.

The recording medium 51 is moved relative to the head 50 by a paper transport system 65, which is electronically controlled by a paper transport control system 66, which in turn is controlled by a microcontroller 315. The paper transport system shown in FIG. 1(*a*) is schematic only, and many different mechanical configurations are possible. In the case of pagewidth print heads, it is most convenient to move the recording medium 51 past a stationary head 50. However, in the case of scanning print systems, it is usually most convenient to move the head 50 along one axis (the sub-scanning direction) and the recording medium 51 along the orthogonal axis (the main scanning direction), in a relative raster motion. The microcontroller 315 may also control the ink pressure regulator 63 and the heater control circuits 71.

For printing using surface tension reduction, ink is contained in an ink reservoir 64 under pressure. In the quiescent state (with no ink drop ejected), the ink pressure is insufficient to overcome the ink surface tension and eject a drop. A constant ink pressure can be achieved by applying pressure to the ink reservoir 64 under the control of an ink pressure regulator 63. Alternatively, for larger printing systems, the ink pressure can be very accurately generated and controlled by situating the top surface of the ink in the reservoir 64 an appropriate distance above the head 50. This ink level can be regulated by a simple float valve (not shown).

For printing using viscosity reduction, ink is contained in an ink reservoir 64 under pressure, and the ink pressure is caused to oscillate. The means of producing this oscillation may be a piezoelectric actuator mounted in the ink channels (not shown).

When properly arranged with the drop separation means, selected drops proceed to form spots on the recording medium 51, while unselected drops remain part of the body of ink.

The ink is distributed to the back surface of the head 50 by an ink channel device 75. The ink preferably flows through slots and/or holes etched through the silicon substrate of the head 50 to the front surface, where the nozzles and actuators are situated. In the case of thermal selection, the nozzle actuators are electrothermal heaters.

In some types of printers according to the invention, an external field 74 is required to ensure that the selected drop separates from the body of the ink and moves towards the recording medium 51. A convenient external field 74 is a constant electric field, as the ink is easily made to be electrically conductive. In this case, the paper guide or platen 67 can be made of electrically conductive material and used as one electrode generating the electric field. The other electrode can be the head 50 itself. Another embodiment uses proximity of the print medium as a means of discriminating between selected drops and unselected drops.

For small drop sizes gravitational force on the ink drop is very small; approximately $10^{-4}$ of the surface tension forces, so gravity can be ignored in most cases. This allows the print head 50 and recording medium 51 to be oriented in any direction in relation to the local gravitational field. This is an important requirement for portable printers.

FIG. 1 (*b*) is a detail enlargement of a cross section of a single microscopic nozzle tip embodiment of the invention, fabricated using a modified CMOS process. The nozzle is etched in a substrate 101, which may be silicon, glass, metal, or any other suitable material. If substrates which are not semiconductor materials are used, a semiconducting material (such as amorphous silicon) may be deposited on the substrate, and integrated drive transistors and data distribution circuitry may be formed in the surface semiconducting layer. Single crystal silicon (SCS) substrates have several advantages, including:

1) High performance drive transistors and other circuitry can be fabricated in SCS;
2) Print heads can be fabricated in existing facilities (fabs) using standard VLSI processing equipment;
3) SCS has high mechanical strength and rigidity; and
4) SCS has a high thermal conductivity.

In this example, the nozzle is of cylindrical form, with the heater 103 forming an annulus. The nozzle tip 104 is formed from silicon dioxide layers 102 deposited during the fabrication of the CMOS drive circuitry. The nozzle tip is passivated with silicon nitride. The protruding nozzle tip controls the contact point of the pressurized ink 100 on the print head surface. The print head surface is also hydrophobized to prevent accidental spread of ink across the front of the print head.

Many other configurations of nozzles are possible, and nozzle embodiments of the invention may vary in shape, dimensions, and materials used. Monolithic nozzles etched from the substrate upon which the heater and drive electronics are formed have the advantage of not requiring an orifice plate. The elimination of the orifice plate has significant cost savings in manufacture and assembly. Recent methods for eliminating orifice plates include the use of 'vortex' actuators such as those described in Domoto et al U.S. Pat. No. 4,580,158, 1986, assigned to Xerox, and Miller et al U.S. Pat. No. 5,371,527, 1994 assigned to Hewlett-Packard. These, however are complex to actuate, and difficult to fabricate. The preferred method for elimination of orifice plates for print heads of the invention is incorporation of the orifice into the actuator substrate.

This type of nozzle may be used for print heads using various techniques for drop separation.

Operation with Electrostatic Drop Separation

As a first example, operation using thermal reduction of surface tension and electrostatic drop separation is shown in FIG. 2.

FIG. 2 shows the results of energy transport and fluid dynamic simulations performed using FIDAP, a commercial fluid dynamic simulation software package available from Fluid Dynamics Inc., of Illinois, USA. This simulation is of a thermal drop selection nozzle embodiment with a diameter of 8 μm, at an ambient temperature of 30° C. The total energy applied to the heater is 276 nJ, applied as 69 pulses of 4 nJ each. The ink pressure is 10 kPa above ambient air pressure, and the ink viscosity at 30° C. is 1.84 cPs. The ink is water based, and includes a sol of 0.1% palmitic acid to achieve an enhanced decrease in surface tension with increasing temperature. A cross section of the nozzle tip from the central axis of the nozzle to a radial distance of 40 μm is shown. Heat flow in the various materials of the nozzle, including silicon, silicon nitride, amorphous silicon dioxide, crystalline silicon dioxide, and water based ink are simulated using the respective densities, heat capacities, and thermal conductivities of the materials. The time step of the simulation is 0.1 μs.

FIG. 2(*a*) shows a quiescent state, just before the heater is actuated. An equilibrium is created whereby no ink escapes the nozzle in the quiescent state by ensuring that the ink pressure plus external electrostatic field is insufficient to overcome the surface tension of the ink at the ambient temperature. In the quiescent state, the meniscus of the ink does not protrude significantly from the print head surface, so the electrostatic field is not significantly concentrated at the meniscus.

FIG. 2(*b*) shows thermal contours at 5° C. intervals 5 μs after the start of the heater energizing pulse. When the heater is energized, the ink in contact with the nozzle tip is rapidly heated. The reduction in surface tension causes the heated portion of the meniscus to rapidly expand relative to the cool ink meniscus. This drives a convective flow which rapidly transports this heat over part of the free surface of the ink at the nozzle tip. It is necessary for the heat to be distributed over the ink surface, and not just where the ink is in contact with the heater. This is because viscous drag against the solid heater prevents the ink directly in contact with the heater from moving.

FIG. 2(*c*) shows thermal contours at 5° C. intervals 10 μs after the start of the heater energizing pulse. The increase in temperature causes a decrease in surface tension, disturbing the equilibrium of forces. As the entire meniscus has been heated, the ink begins to flow.

FIG. 2(*d*) shows thermal contours at 5° C. intervals 20 μs after the start of the heater energizing pulse. The ink pressure has caused the ink to flow to a new meniscus position, which protrudes from the print head. The electrostatic field becomes concentrated by the protruding conductive ink drop.

FIG. 2(*e*) shows thermal contours at 5° C. intervals 30 μs after the start of the heater energizing pulse, which is also 6 μs after the end of the heater pulse, as the heater pulse duration is 24 μs. The nozzle tip has rapidly cooled due to conduction through the oxide layers, and conduction into the flowing ink. The nozzle tip is effectively 'water cooled' by the ink. Electrostatic attraction causes the ink drop to begin to accelerate towards the recording medium. Were the heater pulse significantly shorter (less than 16 μs in this case) the ink would not accelerate towards the print medium, but would instead return to the nozzle.

FIG. 2(*f*) shows thermal contours at 5° C. intervals 26 μs after the end of the heater pulse. The temperature at the nozzle tip is now less than 5° C. above ambient temperature. This causes an increase in surface tension around the nozzle tip. When the rate at which the ink is drawn from the nozzle exceeds the viscously limited rate of ink flow through the nozzle, the ink in the region of the nozzle tip 'necks', and the selected drop separates from the body of ink. The selected drop then travels to the recording medium under the influence of the external electrostatic field. The meniscus of the ink at the nozzle tip then returns to its quiescent position, ready for the next heat pulse to select the next ink drop. One ink drop is selected, separated and forms a spot on the recording medium for each heat pulse. As the heat pulses are electrically controlled, drop on demand ink jet operation can be achieved.

FIG. 3(*a*) shows successive meniscus positions during the drop selection cycle at 5 μs intervals, starting at the beginning of the heater energizing pulse.

FIG. 3(*b*) is a graph of meniscus position versus time, showing the movement of the point at the centre of the meniscus. The heater pulse starts 10 μs into the simulation.

FIG. 3(*c*) shows the resultant curve of temperature with respect to time at various points in the nozzle. The vertical axis of the graph is temperature, in units of 100° C. The horizontal axis of the graph is time, in units of 10 μs. The temperature curve shown in FIG. 3(*b*) was calculated by FIDAP, using 0.1 μtime steps. The local ambient temperature is 30 degrees C. Temperature histories at three points are shown:

A—Nozzle tip: This shows the temperature history at the circle of contact between the passivation layer, the ink, and air.

B—Meniscus midpoint: This is at a circle on the ink meniscus midway between the nozzle tip and the centre of the meniscus.

C—Chip surface: This is at a point on the print head surface 20 μm from the centre of the nozzle. The temperature only rises a few degrees. This indicates that active circuitry can be located very close to the nozzles without experiencing performance or lifetime degradation due to elevated temperatures.

FIG. 3(*e*) shows the power applied to the heater. Optimum operation requires a sharp rise in temperature at the start of the heater pulse, a maintenance of the temperature a little below the boiling point of the ink for the duration of the pulse, and a rapid fall in temperature at the end of the pulse. To achieve this, the average energy applied to the heater is varied over the duration of the pulse. In this case, the variation is achieved by pulse frequency modulation of 0.1 μs sub-pulses, each with an energy of 4 nJ. The peak power applied to the heater is 40 mW, and the average power over the duration of the heater pulse is 11.5 mW. The sub-pulse frequency in this case is 5 Mhz. This can readily be varied without significantly affecting the operation of the print head. A higher sub-pulse frequency allows finer control over the power applied to the heater. A sub-pulse frequency of 13.5 Mhz is suitable, as this frequency is also suitable for minimizing the effect of radio frequency interference (RFI).

Inks with a negative temperature coefficient of surface tension

The requirement for the surface tension of the ink to decrease with increasing temperature is not a major restriction, as most pure liquids and many mixtures have this property. Exact equations relating surface tension to temperature for arbitrary liquids are not available. However, the following empirical equation derived by Ramsay and Shields is satisfactory for many liquids:

$$\gamma_T = k\frac{(T_c - T - 6)}{\sqrt[3]{\left(\frac{Mx}{\rho}\right)^2}}$$

Where $\gamma_T$ is the surface tension at temperature T, k is a constant, $T_c$ is the critical temperature of the liquid, M is the molar mass of the liquid, x is the degree of association of the liquid, and ρ is the density of the liquid. This equation indicates that the surface tension of most liquids falls to zero as the temperature reaches the critical temperature of the liquid. For most liquids, the critical temperature is substantially above the boiling point at atmospheric pressure, so to achieve an ink with a large change in surface tension with a small change in temperature around a practical ejection temperature, the admixture of surfactants is recommended.

The choice of surfactant is important. For example, water based ink for thermal ink jet printers often contains isopropyl alcohol (2-propanol) to reduce the surface tension and promote rapid drying. Isopropyl alcohol has a boiling point of 82.4° C., lower than that of water. As the temperature rises, the alcohol evaporates faster than the water, decreasing the alcohol concentration and causing an increase in surface tension. A surfactant such as 1-Hexanol (b.p. 158° C.) can be used to reverse this effect, and achieve a surface tension which decreases slightly with temperature. However, a relatively large decrease in surface tension with temperature is desirable to maximize operating latitude. A surface tension decrease of 20 mN/m over a 30° C. temperature range is preferred to achieve large operating margins, while as little as 10 mN/m can be used to achieve operation of the print head according to the present invention.

Inks With Large-$\Delta\gamma_T$

Several methods may be used to achieve a large negative change in surface tension with increasing temperature. Two such methods are:

1) The ink may contain a low concentration sol of a surfactant which is solid at ambient temperatures, but melts at a threshold temperature. Particle sizes less than 1,000 Å are desirable. Suitable surfactant melting points for a water based ink are between 50° C. and 90° C., and preferably between 60° C. and 80° C.

2) The ink may contain an oil/water microemulsion with a phase inversion temperature (PIT) which is above the maximum ambient temperature, but below the boiling point of the ink. For stability, the PIT of the microemulsion is preferably 20° C. or more above the maximum non-operating temperature encountered by the ink. A PIT of approximately 80° C. is suitable.

Inks with Surfactant Sols

Inks can be prepared as a sol of small particles of a surfactant which melts in the desired operating temperature range. Examples of such surfactants include carboxylic acids with between 14 and 30 carbon atoms, such as:

| Name | Formula | m.p. | Synonym |
|---|---|---|---|
| Tetradecanoic acid | $CH_3(CH_2)_{12}COOH$ | 58° C. | Myristic acid |
| Hexadecanoic acid | $CH_3(CH_2)_{14}COOH$ | 63° C. | Palmitic acid |
| Octadecanoic acid | $CH_3(CH_2)_{15}COOH$ | 71° C. | Stearic acid |
| Eicosanoic acid | $CH_3(CH_2)_{16}COOH$ | 77° C. | Arachidic acid |
| Docosanoic acid | $CH_3(CH_2)_{20}COOH$ | 80° C. | Behenic acid |

As the melting point of sols with a small particle size is usually slightly less than of the bulk material, it is preferable to choose a carboxylic acid with a melting point slightly above the desired drop selection temperature. A good example is Arachidic acid.

These carboxylic acids are available in high purity and at low cost. The amount of surfactant required is very small, so the cost of adding them to the ink is insignificant. A mixture of carboxylic acids with slightly varying chain lengths can be used to spread the melting points over a range of temperatures. Such mixtures will typically cost less than the pure acid.

It is not necessary to restrict the choice of surfactant to simple unbranched carboxylic acids. Surfactants with branched chains or phenyl groups, or other hydrophobic moieties can be used. It is also not necessary to use a carboxylic acid. Many highly polar moieties are suitable for the hydrophilic end of the surfactant. It is desirable that the polar end be ionizable in water, so that the surface of the surfactant particles can be charged to aid dispersion and prevent flocculation. In the case of carboxylic acids, this can be achieved by adding an alkali such as sodium hydroxide or potassium hydroxide.

Preparation of Inks with Surfactant Sols

The surfactant sol can be prepared separately at high concentration, and added to the ink in the required concentration.

An example process for creating the surfactant sol is as follows:

1) Add the carboxylic acid to purified water in an oxygen free atmosphere.
2) Heat the mixture to above the melting point of the carboxylic acid. The water can be brought to a boil.
3) Ultrasonicate the mixture, until the typical size of the carboxylic acid droplets is between 100 Å and 1,000 Å.
4) Allow the mixture to cool.
5) Decant the larger particles from the top of the mixture.
6) Add an alkali such as NaOH to ionize the carboxylic acid molecules on the surface of the particles. A pH of approximately 8 is suitable. This step is not absolutely necessary, but helps stabilize the sol.
7) Centrifuge the sol. As the density of the carboxylic acid is lower than water, smaller particles will accumulate at the outside of the centrifuge, and larger particles in the centre.
8) Filter the sol using a microporous filter to eliminate any particles above 5000 Å.
9) Add the surfactant sol to the ink preparation. The sol is required only in very dilute concentration.

The ink preparation will also contain either dye(s) or pigment(s), bactericidal agents, agents to enhance the electrical conductivity of the ink if electrostatic drop separation is used, humectants, and other agents as required.

Anti-foaming agents will generally not be required, as there is no bubble formation during the drop ejection process.

Cationic surfactant sols

Inks made with anionic surfactant sols are generally unsuitable for use with cationic dyes or pigments. This is because the cationic dye or pigment may precipitate or flocculate with the anionic surfactant. To allow the use of cationic dyes and pigments, a cationic surfactant sol is required. The family of alkylamines is suitable for this purpose.

Various suitable alkylamines are shown in the following table:

| Name | Formula | Synonym |
|---|---|---|
| Hexadecylamine | $CH_3(CH_2)_{14}CH_2NH_2$ | Palmityl amine |
| Octadecylamine | $CH_3(CH_2)_{16}CH_2NH_2$ | Stearyl amine |
| Eicosylamine | $CH_3(CH_2)_{18}CH_2NH_2$ | Arachidyl amine |
| Docosylamine | $CH_3(CH_2)_{20}CH_2NH_2$ | Behenyl amine |

The method of preparation of cationic surfactant sols is essentially similar to that of anionic surfactant sols, except that an acid instead of an alkali is used to adjust the pH balance and increase the charge on the surfactant particles. A pH of 6 using HCl is suitable.

Microemulsion Based Inks

An alternative means of achieving a large reduction in surface tension as some temperature threshold is to base the ink on a microemulsion. A microemulsion is chosen with a phase inversion temperature (PIT) around the desired ejection threshold temperature. Below the PIT, the microemulsion is oil in water (O/W), and above the PIT the microemulsion is water in oil (W/O). At low temperatures, the surfactant forming the microemulsion prefers a high curvature surface around oil, and at temperatures significantly above the PIT, the surfactant prefers a high curvature surface around water. At temperatures close to the PIT, the microemulsion forms a continuous 'sponge' of topologically connected water and oil.

There are two mechanisms whereby this reduces the surface tension. Around the PIT, the surfactant prefers surfaces with very low curvature. As a result, surfactant molecules migrate to the ink/air interface, which has a curvature which is much less than the curvature of the oil emulsion. This lowers the surface tension of the water. Above the phase inversion temperature, the microemulsion changes from O/W to W/O, and therefore the ink/air interface changes from water/air to oil/air. The oil/air interface has a lower surface tension.

There is a wide range of possibilities for the preparation of microemulsion based inks.

For fast drop ejection, it is preferable to chose a low viscosity oil.

In many instances, water is a suitable polar solvent. However, in some cases different polar solvents may be required. In these cases, polar solvents with a high surface tension should be chosen, so that a large decrease in surface tension is achievable.

The surfactant can be chosen to result in a phase inversion temperature in the desired range. For example, surfactants of the group poly(oxyethylene)alkylphenyl ether (ethoxylated alkyl phenols, general formula: $C_nH_{2n+1}C_4H_6(CH_2CH_2O)_mOH$) can be used. The hydrophilicity of the surfactant can be increased by increasing m, and the hydrophobicity can be increased by increasing n. Values of m of approximately 10, and n of approximately 8 are suitable.

Low cost commercial preparations are the result of a polymerization of various molar ratios of ethylene oxide and alkyl phenols, and the exact number of oxyethylene groups varies around the chosen mean. These commercial preparations are adequate, and highly pure surfactants with a specific number of oxyethylene groups are not required.

The formula for this surfactant is $C_8H_{17}C_4H_6(CH_2CH_2O)_nOH$ (average n=10).

Synonyms include Octoxynol-10, PEG-10 octyl phenyl ether and POE (10) octyl phenyl ether The HLB is 13.6, the melting point is 7° C., and the cloud point is 65° C.

Commercial preparations of this surfactant are available under various brand names. Suppliers and brand names are listed in the following table:

| Trade name | Supplier |
|---|---|
| Akyporox OP100 | Chem-Y GmbH |
| Alkasurf OP-10 | Rhone-Poulenc Surfactants and Specialties |
| Dehydrophen POP 10 | Pulcra SA |
| Hyonic OP-10 | Henkel Corp. |
| Iconol OP-10 | BASF Corp. |
| Igepal O | Rhone-Poulenc France |
| Macol OP-10 | PPG Industries |
| Malorphen 810 | Huls AG |
| Nikkol OP-10 | Nikko Chem. Co. Ltd. |
| Renex 750 | ICI Americas Inc. |
| Rexol 45/10 | Hart Chemical Ltd. |
| Synperonic OP10 | ICI PLC |
| Teric X10 | ICI Australia |

These are available in large volumes at low cost (less than one dollar per pound in quantity), and so contribute less than 10 cents per liter to prepared microemulsion ink with a 5% surfactant concentration.

Other suitable ethoxylated alkyl phenols include those listed in the following table:

| Trivial name | Formula | HLB | Cloud point |
|---|---|---|---|
| Nonoxynol-9 | $C_9H_{19}C_4H_6(CH_2CH_2O)_{-9}OH$ | 13 | 54° C. |
| Nonoxynol-10 | $C_9H_{19}C_4H_6(CH_2CH_2O)_{-10}OH$ | 13.2 | 62° C. |
| Nonoxynol-11 | $C_9H_{19}C_4H_6(CH_2CH_2O)_{-11}OH$ | 13.8 | 72° C. |
| Nonoxynol-12 | $C_9H_{19}C_4H_6(CH_2CH_2O)_{-12}OH$ | 14.5 | 81° C. |
| Octoxynol-9 | $C_8H_{17}C_4H_6(CH_2CH_2O)_{-9}OH$ | 12.1 | 61° C. |
| Octoxynol-10 | $C_8H_{17}C_4H_6(CH_2CH_2O)_{-10}OH$ | 13.6 | 65° C. |
| Octoxynol-12 | $C_8H_{17}C_4H_6(CH_2CH_2O)_{-12}OH$ | 14.6 | 88° C. |
| Dodoxynol-10 | $C_{12}H_{25}C_4H_6(CH_2CH_2O)_{-10}OH$ | 12.6 | 42° C. |
| Dodoxynol-11 | $C_{12}H_{25}C_4H_6(CH_2CH_2O)_{-11}OH$ | 13.5 | 56° C. |
| Dodoxynol-14 | $C_{12}H_{25}C_4H_6(CH_2CH_2O)_{-14}OH$ | 14.5 | 87° C. |

Microemulsion based inks have advantages other than surface tension control:

1) Microemulsions are thermodynamically stable, and will not separate. Therefore, the storage time can be very long. This is especially significant for office and portable printers, which may be used sporadically.
2) The microemulsion will form spontaneously with a particular drop size, and does not require extensive stirring, centrifuging, or filtering to ensure a particular range of emulsified oil drop sizes.
3) The amount of oil contained in the ink can be quite high, so dyes which are soluble in oil or soluble in water, or both, can be used. It is also possible to use a mixture of dyes, one soluble in water, and the other soluble in oil, to obtain specific colors.
4) Oil miscible pigments are prevented from flocculating, as they are trapped in the oil microdroplets.
5) The use of a microemulsion can reduce the mixing of different dye colors on the surface of the print medium.
6) The viscosity of microemulsions is very low.
7) The requirement for humectants can be reduced or eliminated.

Dyes and pigments in microemulsion based inks

Oil in water mixtures can have high oil contents—as high as 40%—and still form O/W microemulsions. This allows a high dye or pigment loading.

Mixtures of dyes and pigments can be used. An example of a microemulsion based ink mixture with both dye and pigment is as follows:

1) 70% water
1) 5% water soluble dye
3) 5% surfactant
4) 10% oil
5) 10% oil miscible pigment The following table shows the nine basic combinations of colorants in the oil and water phases of the microemulsion that may be used.

| Combination | Colorant in water phase | Colorant in oil phase |
|---|---|---|
| 1 | none | oil miscible pigment |
| 2 | none | oil soluble dye |
| 3 | water soluble dye | none |
| 4 | water soluble dye | oil miscible pigment |
| 5 | water soluble dye | oil solution dye |
| 6 | pigment dispersed in water | none |
| 7 | pigment dispersed in water | oil miscible pigment |
| 8 | pigment dispersed in water | oil soluble dye |
| 9 | none | none |

The ninth combination, with no colorants, is useful for printing transparent coatings, UV ink, and selective gloss highlights.

As many dyes are amphiphilic, large quantities of dyes can also be solubilized in the oil-water boundary layer as this layer has a very large surface area.

It is also possible to have multiple dyes or pigments in each phase, and to have a mixture of dyes and pigments in each phase.

When using multiple dyes or pigments the absorption spectrum of the resultant ink will be the weighted average of the absorption spectra of the different colorants used. This presents two problems:

1) The absorption spectrum will tend to become broader, as the absorption peaks of both colorants are averaged. This has a tendency to 'muddy' the colors. To obtain brilliant color, careful choice of dyes and pigments based on their absorption spectra, not just their human-perceptible color, needs to be made.
2) The color of the ink may be different on different substrates. If a dye and a pigment are used in combination, the color of the dye will tend to have a smaller contribution to the printed ink color on more absorptive papers, as the dye will be absorbed into the paper, while the pigment will tend to 'sit on top' of the paper. This may be used as an advantage in some circumstances.

Surfactants with a Krafft point in the drop selection temperature range

For ionic surfactants there is a temperature (the Krafft point) below which the solubility is quite low, and the solution contains essentially no micelles. Above the Krafft temperature micelle formation becomes possible and there is a rapid increase in solubility of the surfactant. If the critical micelle concentration (CMC) exceeds the solubility of a surfactant at a particular temperature, then the minimum surface tension will be achieved at the point of maximum solubility, rather than at the CMC. Surfactants are usually much less effective below the Krafft point.

This factor can be used to achieve an increased reduction in surface tension with increasing temperature. At ambient temperatures, only a portion of the surfactant is in solution. When the nozzle heater is turned on, the temperature rises, and more of the surfactant goes into solution, decreasing the surface tension.

A surfactant should be chosen with a Krafft point which is near the top of the range of temperatures to which the ink is raised. This gives a maximum margin between the concentration of surfactant in solution at ambient temperatures, and the concentration of surfactant in solution at the drop selection temperature.

The concentration of surfactant should be approximately equal to the CMC at the Krafft point. In this manner, the surface tension is reduced to the maximum amount at elevated temperatures, and is reduced to a minimum amount at ambient temperatures.

The following table shows some commercially available surfactants with Krafft points in the desired range.

| Formula | Krafft point |
|---|---|
| $C_{16}H_{33}SO_3^-Na^+$ | 57° C. |
| $C_{18}H_{37}SO_3^-Na^+$ | 70° C. |
| $C_{16}H_{33}SO_4^-Na^+$ | 45° C. |
| $Na^{+-}O_4S(CH_2)_{16}SO_4^-Na^+$ | 44.9° C. |
| $K^{+-}O_4S(CH_2)_{16}SO_4^-K^+$ | 55° C. |
| $C_{16}H_{33}CH(CH_3)C_4H_6SO_3^-Na^+$ | 60.8° C. |

Surfactants with a cloud point in the drop selection temperature range

Non-ionic surfactants using polyoxyethylene (POE) chains can be used to create an ink where the surface tension falls with increasing temperature. At low temperatures, the POE chain is hydrophilic, and maintains the surfactant in solution. As the temperature increases, the structured water around the POE section of the molecule is disrupted, and the POE section becomes hydrophobic. The surfactant is increasingly rejected by the water at higher temperatures, resulting in increasing concentration of surfactant at the air/ink interface, thereby lowering surface tension. The temperature at which the POE section of a nonionic surfactant becomes hydrophilic is related to the cloud point of that surfactant. POE chains by themselves are not particularly suitable, as the cloud point is generally above 100° C.

Polyoxypropylene (POP) can be combined with POE in POE/POP block copolymers to lower the cloud point of POE chains without introducing a strong hydrophobicity at low temperatures.

Two main configurations of symmetrical POE/POP block copolymers are available. These are:

1) Surfactants with POE segments at the ends of the molecules, and a POP segment in the centre, such as the poloxamer class of surfactants (generically CAS 9003-11-6)
2) Surfactants with POP segments at the ends of the molecules, and a POE segment in the centre, such as the meroxapol class of surfactants (generically also CAS 9003-11-6).

Some commercially available varieties of poloxamer and meroxapol with a high surface tension at room temperature, combined with a cloud point above 40° C. and below 100° C. are shown in the following table:

| Trivial name | BASF Trade name | Formula | Surface Tension (mN/m) | Cloud point |
|---|---|---|---|---|
| Meroxapol 105 | Pluronic 10R5 | $HO(CHCH_3CH_2O)_{-7}$-$(CH_2CH_2O)_{-22}$-$(CHCH_3CH_2O)_{-7}OH$ | 50.9 | 69° C. |
| Meroxapol 108 | Pluronic 10R8 | $HO(CHCH_3CH_2O)_{-7}$-$(CH_2CH_2O)_{-91}$-$(CHCH_3CH_2O)_{-7}OH$ | 54.1 | 99° C. |
| Meroxapol 178 | Pluronic 17R8 | $HO(CHCH_3CH_2O)_{-12}$-$(CH_2CH_2O)_{-136}$-$(CHCH_3CH_2O)_{-12}OH$ | 47.3 | 81° C. |
| Meroxapol 258 | Pluronic 25R8 | $HO(CHCH_3CH_2O)_{-18}$-$(CH_2CH_2O)_{-163}$-$(CHCH_3CH_2O)_{-18}OH$ | 46.1 | 80° C. |
| Poloxamer 105 | Pluronic L35 | $HO(CH_2CH_2O)_{-11}$-$(CHCH_3CH_2O)_{-16}$-$(CH_2CH_2O)_{-11}OH$ | 48.8 | 77° C. |
| Poloxamer 124 | Pluronic L44 | $HO(CH_2CH_2O)_{-11}$-$(CHCH_3CH_2O)_{-21}$-$(CH_2CH_2O)_{-11}OH$ | 45.3 | 65° C. |

Other varieties of poloxamer and meroxapol can readily be synthesized using well known techniques. Desirable characteristics are a room temperature surface tension which is as high as possible, and a cloud point between 40° C. and 100° C., and preferably between 60° C. and 80° C.

Meroxapol $[HO(CHCH_3CH_2O)_x(CH_2CH_2O)_y(CHCH_3CH_2O)_zOH]$ varieties where the average x and z are approximately 4, and the average y is approximately 15 may be suitable.

If salts are used to increase the electrical conductivity of the ink, then the effect of this salt on the cloud point of the surfactant should be considered.

The cloud point of POE surfactants is increased by ions that disrupt water structure (such as $I^-$), as this makes more water molecules available to form hydrogen bonds with the POE oxygen lone pairs. The cloud point of POE surfactants is decreased by ions that form water structure (such as $Cl^-$, $OH^-$), as fewer water molecules are available to form hydrogen bonds. Bromide ions have relatively little effect. The ink composition can be 'tuned' for a desired temperature range by altering the lengths of POE and POP chains in a block copolymer surfactant, and by changing the choice of salts (e.g $Cl^-$ to $Br^-$ to $I^-$) that are added to increase electrical conductivity. NaCl is likely to be the best choice of salts to increase ink conductivity, due to low cost and non-toxicity. NaCl slightly lowers the cloud point of nonionic surfactants.

Hot Melt Inks

The ink need not be in a liquid state at room temperature. Solid 'hot melt' inks can be used by heating the printing head and ink reservoir above the melting point of the ink. The hot melt ink must be formulated so that the surface tension of the molten ink decreases with temperature. A decrease of approximately 2 mN/m will be typical of many such preparations using waxes and other substances. However, a reduction in surface tension of approximately 20 mN/m is desirable in order to achieve good operating margins when relying on a reduction in surface tension rather than a reduction in viscosity.

The temperature difference between quiescent temperature and drop selection temperature may be greater for a hot melt ink than for a water based ink, as water based inks are constrained by the boiling point of the water.

The ink must be liquid at the quiescent temperature. The quiescent temperature should be higher than the highest ambient temperature likely to be encountered by the printed page. The quiescent temperature should also be as low as practical, to reduce the power needed to heat the print head, and to provide a maximum margin between the quiescent and the drop ejection temperatures. A quiescent temperature between 60° C. and 90° C. is generally suitable, though other temperatures may be used. A drop ejection temperature of between 160° C. and 200° C. is generally suitable.

There are several methods of achieving an enhanced reduction in surface tension with increasing temperature.

1) A dispersion of microfine particles of a surfactant with a melting point substantially above the quiescent temperature, but substantially below the drop ejection temperature, can be added to the hot melt ink while in the liquid phase.
2) A polar/non-polar microemulsion with a PIT which is preferably at least 20° C. above the melting points of both the polar and non-polar compounds.

To achieve a large reduction in surface tension with temperature, it is desirable that the hot melt ink carrier have a relatively large surface tension (above 30 mN/m) when at the quiescent temperature. This generally excludes alkanes such as waxes. Suitable materials will generally have a strong intermolecular attraction, which may be achieved by multiple hydrogen bonds, for example, polyols, such as Hexanetetrol, which has a melting point of 88° C.

Surface tension reduction of various solutions

FIG. 3(*d*) shows the measured effect of temperature on the surface tension of various aqueous preparations containing the following additives:

1) 0.1% sol of Stearic Acid
2) 0.1% sol of Palmitic acid
3) 0.1% solution of Pluronic 10R5 (trade mark of BASF)
4) 0.1% solution of Pluronic L35 (trade mark of BASF)
5) 0.1% solution of Pluronic L44 (trade mark of BASF)

Inks suitable for printing systems of the present invention are described in the following Australian patent specifications, the disclosure of which are hereby incorporated by reference:

'Ink composition based on a microemulsion' (Filing no.: PN5223, filed on 6 Sep. 1995);

'Ink composition containing surfactant sol' (Filing no.: PN5224, filed on 6 Sep. 1995);

'Ink composition for DOD printers with Krafft point near the drop selection temperature sol' (Filing no.: PN6240, filed on 30 Oct. 1995); and 'Dye and pigment in a microemulsion based ink' (Filing no.: PN6241, filed on 30 Oct. 1995).

Operation Using Reduction of Viscosity

As a second example, operation of an embodiment using thermal reduction of viscosity and proximity drop separation, in combination with hot melt ink, is as follows. Prior to operation of the printer, solid ink is melted in the reservoir 64. The reservoir, ink passage to the print head, ink channels 75, and print head 50 are maintained at a temperature at which the ink 100 is liquid, but exhibits a relatively high viscosity (for example, approximately 100 cP). The Ink 100 is retained in the nozzle by the surface tension of the ink. The ink 100 is formulated so that the viscosity of the ink reduces with increasing temperature. The ink pressure oscillates at a frequency which is an integral multiple of the drop ejection frequency from the nozzle. The ink pressure oscillation causes oscillations of the ink meniscus at the nozzle tips, but this oscillation is small due to the high ink viscosity. At the normal operating temperature, these oscillations are of insufficient amplitude to result in drop separation. When the heater 103 is energized, the ink forming the selected drop is heated, causing a reduction in viscosity to a value which is preferably less than 5 cP. The reduced viscosity results in the ink meniscus moving further during the high pressure part of the ink pressure cycle. The recording medium 51 is arranged sufficiently close to the print head 50 so that the selected drops contact the recording medium 51, but sufficiently far away that the unselected drops do not contact the recording medium 51. Upon contact with the recording medium 51, part of the selected drop freezes, and attaches to the recording medium. As the ink pressure falls, ink begins to move back into the nozzle. The body of ink separates from the ink which is frozen onto the recording medium. The meniscus of the ink 100 at the nozzle tip then returns to low amplitude oscillation. The viscosity of the ink increases to its quiescent level as remaining heat is dissipated to the bulk ink and print head. One ink drop is selected, separated and forms a spot on the recording medium 51 for each heat pulse. As the heat pulses are electrically controlled, drop on demand ink jet operation can be achieved.

Manufacturing of Print Heads

Manufacturing processes for monolithic print heads in accordance with the present invention are described in the following Australian patent specifications filed on 12 Apr. 1995, the disclosure of which are hereby incorporated by reference:

'A monolithic LIFT printing head' (Filing no.: PN2301);

'A manufacturing process for monolithic LIFT printing heads' (Filing no.: PN2302);

'A self-aligned heater design for LIFT print heads' (Filing no.: PN2303);

'Integrated four color LIFT print heads' (Filing no.: PN2304);

'Power requirement reduction in monolithic LIFT printing heads' (Filing no.: PN2305);

'A manufacturing process for monolithic LIFT print heads using anisotropic wet etching' (Filing no.: PN2306);

'Nozzle placement in monolithic drop-on-demand print heads' (Filing no.: PN2307);

'Heater structure for monolithic LIFT print heads' (Filing no.: PN2346);

'Power supply connection for monolithic LIFT print heads' (Filing no.: PN2347);

'External connections for Proximity LIFT print heads' (Filing no.: PN2348); and

'A self-aligned manufacturing process for monolithic LIFT print heads' (Filing no.: PN2349); and 'CMOS process compatible fabrication of LIFT print heads' (Filing no.: PN5222, 6 Sep. 1995).

'A manufacturing process for LIFT print heads with nozzle rim heaters' (Filing no.: PN6238, 30 Oct. 1995);

'A modular LIFT print head' (Filing no.: PN6237, 30 Oct. 1995);

'Method of increasing packing density of printing nozzles' (Filing no.: PN6236, 30 Oct. 1995); and 'Nozzle dispersion for reduced electrostatic interaction between simultaneously printed droplets' (Filing no.: PN6239, 30 Oct. 1995).

Control of Print Heads

Means of providing page image data and controlling heater temperature in print heads of the present invention is described in the following Australian patent specifications filed on 12 Apr. 1995, the disclosure of which are hereby incorporated by reference:

'Integrated drive circuitry in LIFT print heads' (Filing no.: PN2295);

'A nozzle clearing procedure for Liquid Ink Fault Tolerant (LIFT) printing' (Filing no.: PN2294);

'Heater power compensation for temperature in LIFT printing systems' (Filing no.: PN2314);

'Heater power compensation for thermal lag in LIFT printing systems' (Filing no.: PN2315);

'Heater power compensation for print density in LIFT printing systems' (Filing no.: PN2316);

'Accurate control of temperature pulses in printing heads' (Filing no.: PN2317);

'Data distribution in monolithic LIFT print heads' (Filing no.: PN2318);

'Page image and fault tolerance routing device for LIFT printing systems' (Filing no.: PN2319); and 'A removable pressurized liquid ink cartridge for LIFT printers' (Filing no.: PN2320).

Image Processing for Print Heads

An objective of printing systems according to the invention is to attain a print quality which is equal to that which people are accustomed to in quality color publications printed using offset printing. This can be achieved using a print resolution of approximately 1,600 dpi. However, 1,600 dpi printing is difficult and expensive to achieve. Similar results can be achieved using 800 dpi printing, with 2 bits per pixel for cyan and magenta, and one bit per pixel for yellow and black. This color model is herein called CC'MM'YK. Where high quality monochrome image printing is also required, two bits per pixel can also be used for black. This color model is herein called CC'MM'YKK'. Color models, halftoning, data compression, and real-time expansion systems suitable for use in systems of this invention and other printing systems are described in the following Australian patent specifications filed on 12 Apr. 1995, the disclosure of which are hereby incorporated by reference:

'Four level ink set for bi-level color printing' (Filing no.: PN2339);

'Compression system for page images' (Filing no.: PN2340);

'Real-time expansion apparatus for compressed page images' (Filing no.: PN2341); and 'High capacity compressed document image storage for digital color printers' (Filing no.: PN2342);

'Improving JPEG compression in the presence of text' (Filing no.: PN2343);

'An expansion and halftoning device for compressed page images' (Filing no.: PN2344); and 'Improvements in image halftoning' (Filing no.: PN2345).

Applications Using Print Heads According to this Invention

Printing apparatus and methods of this invention are suitable for a wide range of applications, including (but not limited to) the following: color and monochrome office printing, short run digital printing, high speed digital printing, process color printing, spot color printing, offset press supplemental printing, low cost printers using scanning print heads, high speed printers using pagewidth print heads, portable color and monochrome printers, color and monochrome copiers, color and monochrome facsimile machines, combined printer, facsimile and copying machines, label printing, large format plotters, photographic duplication, printers for digital photographic processing, portable printers incorporated into digital 'instant' cameras, video printing, printing of PhotoCD images, portable printers for 'Personal Digital Assistants', wallpaper printing, indoor sign printing, billboard printing, and fabric printing.

Printing systems based on this invention are described in the following Australian patent specifications filed on 12 Apr. 1995, the disclosure of which are hereby incorporated by reference:

'A high speed color office printer with a high capacity digital page image store' (Filing no.: PN2329);

'A short run digital color printer with a high capacity digital page image store' (Filing no.: PN2330);

'A digital color printing press using LIFT printing technology' (Filing no.: PN2331);

'A modular digital printing press' (Filing no.: PN2332);

'A high speed digital fabric printer' (Filing no.: PN2333);

'A color photograph copying system' (Filing no.: PN2334);

'A high speed color photocopier using a LIFT printing system' (Filing no.: PN2335);

'A portable color photocopier using LIFT printing technology' (Filing no.: PN2336);

'A photograph processing system using LIFT printing technology' (Filing no.: PN2337);

'A plain paper facsimile machine using a LIFT printing system' (Filing no.: PN2338);

'A PhotoCD system with integrated printer' (Filing no.: PN2293);

'A color plotter using LIFT printing technology' (Filing no.: PN2291);

'A notebook computer with integrated LIFT color printing system' (Filing no.: PN2292);

'A portable printer using a LIFT printing system' (Filing no.: PN2300);

'Fax machine with on-line database interrogation and customized magazine printing' (Filing no.: PN2299);

'Miniature portable color printer' (Filing no.: PN2298);

'A color video printer using a LIFT printing system' (Filing no.: PN2296); and

'An integrated printer, copier, scanner, and facsimile using a LIFT printing system' (Filing no.: PN2297)

Compensation of Print Heads for Environmental Conditions

It is desirable that drop on demand printing systems have consistent and predictable ink drop size and position. Unwanted variation in ink drop size and position causes variations in the optical density of the resultant print, reducing the perceived print quality. These variations should be kept to a small proportion of the nominal ink drop volume and pixel spacing respectively. Many environmental variables can be compensated to reduce their effect to insignificant levels. Active compensation of some factors can be achieved by varying the power applied to the nozzle heaters.

An optimum temperature profile for one print head embodiment involves an instantaneous raising of the active region of the nozzle tip to the ejection temperature, maintenance of this region at the ejection temperature for the duration of the pulse, and instantaneous cooling of the region to the ambient temperature.

This optimum is not achievable due to the stored heat capacities and thermal conductivities of the various materials used in the fabrication of the nozzles in accordance with the invention. However, improved performance can be achieved by shaping the power pulse using curves which can be derived by iterative refinement of finite element simulation of the print head. The power applied to the heater can be varied in time by various techniques, including, but not limited to:

1) Varying the voltage applied to the heater
2) Modulating the width of a series of short pulses (PWM)
3) Modulating the frequency of a series of short pulses (PFM)

To obtain accurate results, a transient fluid dynamic simulation with free surface modeling is required, as convection in the ink, and ink flow, significantly affect on the temperature achieved with a specific power curve.

By the incorporation of appropriate digital circuitry on the print head substrate, it is practical to individually control the power applied to each nozzle. One way to achieve this is by 'broadcasting' a variety of different digital pulse trains across the print head chip, and selecting the appropriate pulse train for each nozzle using multiplexing circuits.

An example of the environmental factors which may be compensated for is listed in the table "Compensation for environmental factors". This table identifies which environmental factors are best compensated globally (for the entire print head), per chip (for each chip in a composite multi-chip print head), and per nozzle.

Compensation for environmental factors

| Factor compensated | Scope | Sensing or user control method | Compensation mechanism |
|---|---|---|---|
| Ambient Temperature | Global | Temperature sensor mounted on print head | Power supply voltage or global PFM patterns |
| Power supply | Global | Predictive active | Power supply voltage |

-continued

| Compensation for environmental factors | | | |
|---|---|---|---|
| Factor compensated | Scope | Sensing or user control method | Compensation mechanism |
| voltage fluctuation with number of active nozzles | | nozzle count based on print data | or global PFM patterns |
| Local heat build-up with successive nozzle actuation | Per nozzle | Predictive active nozzle count based on print data | Selection of appropriate PFM pattern for each printed drop |
| Drop size control for multiple bits per pixel | Per nozzle | Image data | Selection of appropriate PFM pattern for each printed drop |
| Nozzle geometry variations between wafers | Per chip | Factory measurement, datafile supplied with print head | Global PFM patterns per print head chip |
| Heater resistivity variations between wafers | Per chip | Factory measurement, datafile supplied with print head | Global PFM patterns per print head chip |
| User image intensity adjustment | Global | User selection | Power supply voltage, electrostatic acceleration voltage, or ink pressure |
| Ink surface tension reduction method and threshold temperature | Global | Ink cartridge sensor or user selection | Global PFM patterns |
| Ink viscosity | Global | Ink cartridge sensor or user selection | Global PFM patterns and/or clock rate |
| Ink dye or pigment concentration | Global | Ink cartridge sensor or user selection | Global PFM patterns |
| Ink response time | Global | Ink cartridge sensor or user selection | Global PFM patterns |

Most applications will not require compensation for all of these variables. Some variables have a minor effect, and compensation is only necessary where very high image quality is required.

Print head drive circuits

Figure 4:
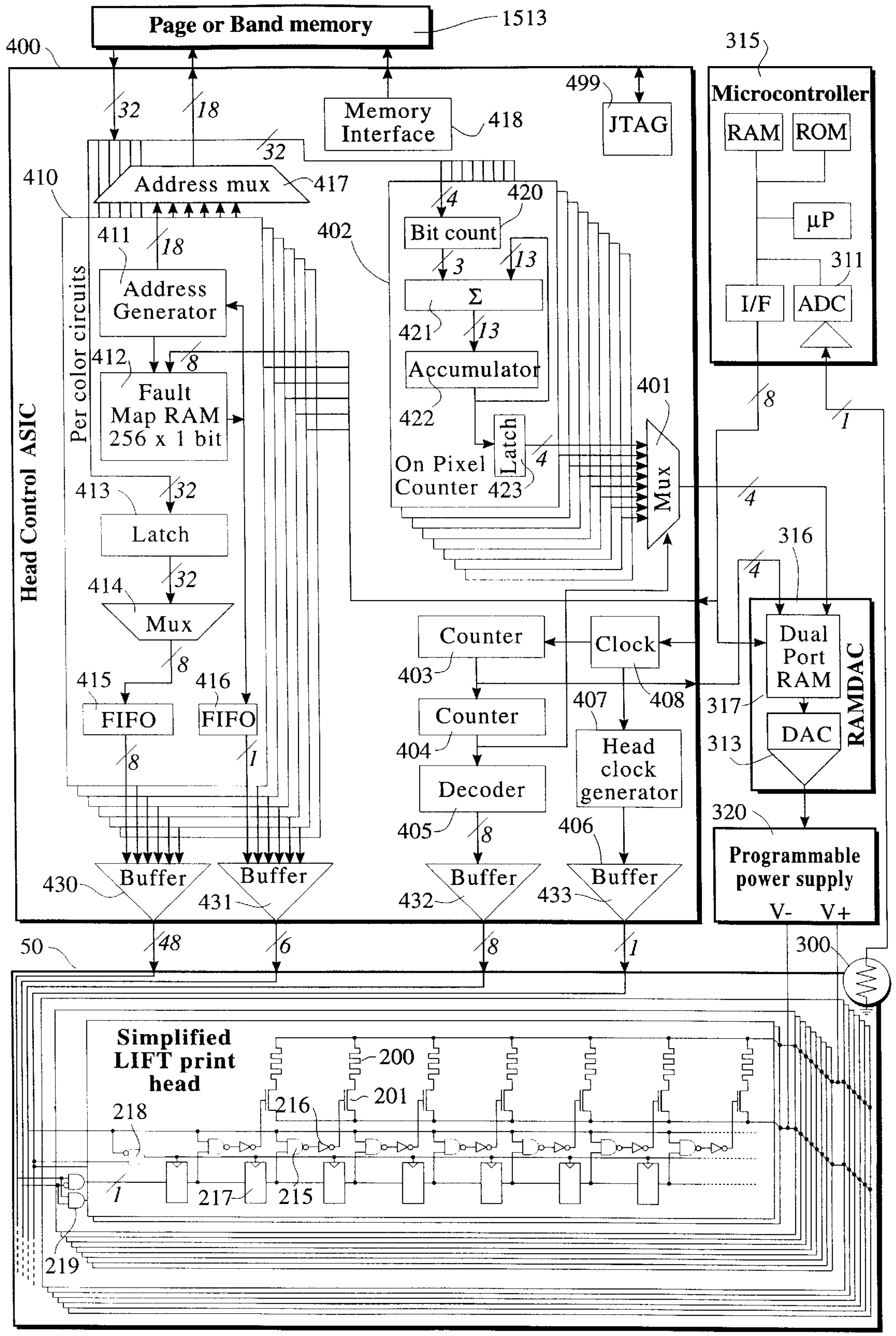
FIG. 4 shows a block schematic diagram of print head drive circuitry for practice of the invention.

FIG. 4 is a block schematic diagram showing electronic operation of an example head driver circuit in accordance with this invention. This control circuit uses analog modulation of the power supply voltage applied to the print head to achieve heater power modulation, and does not have individual control of the power applied to each nozzle. FIG. 4 shows a block diagram for a system using an 800 dpi pagewidth print head which prints process color using the CC'MM'YK color model. The print head 50 has a total of 79,488 nozzles, with 39,744 main nozzles and 39,744 redundant nozzles. The main and redundant nozzles are divided into six colors, and each color is divided into 8 drive phases. Each drive phase has a shift register which converts the serial data from a head control ASIC 400 into parallel data for enabling heater drive circuits. There is a total of 96 shift registers, each providing data for 828 nozzles. Each shift register is composed of 828 shift register stages 217, the outputs of which are logically anded with phase enable signal by a nand gate 215. The output of the nand gate 215 drives an inverting buffer 216, which in turn controls the drive transistor 201. The drive transistor 201 actuates the electrothermal heater 200, which may be a heater 103 as shown in FIG. 1(*b*). To maintain the shifted data valid during the enable pulse, the clock to the shift register is stopped the enable pulse is active by a clock stopper 218, which is shown as a single gate for clarity, but is preferably any of a range of well known glitch free clock control circuits. Stopping the clock of the shift register removes the requirement for a parallel data latch in the print head, but adds some complexity to the control circuits in the Head Control ASIC 400. Data is routed to either the main nozzles or the redundant nozzles by the data router 219 depending on the state of the appropriate signal of the fault status bus.

The print head shown in FIG. 4 is simplified, and does not show various means of improving manufacturing yield, such as block fault tolerance. Drive circuits for different configurations of print head can readily be derived from the apparatus disclosed herein.

Digital information representing patterns of dots to be printed on the recording medium is stored in the Page or Band memory 1513, which may be the same as the Image memory 72 in FIG. 1(*a*). Data in 32 bit words representing dots of one color is read from the Page or Band memory 1513 using addresses selected by the address mux 417 and control signals generated by the Memory Interface 418. These addresses are generated by Address generators 411, which forms part of the 'Per color circuits' 410, for which there is one for each of the six color components. The addresses are generated based on the positions of the nozzles in relation to the print medium. As the relative position of the nozzles may be different for different print heads, the Address generators 411 are preferably made programmable. The Address generators 411 normally generate the address corresponding to the position of the main nozzles. However, when faulty nozzles are present, locations of blocks of nozzles containing faults can be marked in the Fault Map RAM 412. The Fault Map RAM 412 is read as the page is printed. If the memory indicates a fault in the block of nozzles, the address is altered so that the Address generators 411 generate the address corresponding to the position of the redundant nozzles. Data read from the Page or Band memory 1513 is latched by the latch 413 and converted to four sequential bytes by the multiplexer 414. Timing of these bytes is adjusted to match that of data representing other colors by the FIFO 415. This data is then buffered by the buffer 430 to form the 48 bit main data bus to the print head 50. The data is buffered as the print head may be located a relatively long distance from the head control ASIC. Data from the Fault Map RAM 412 also forms the input to the FIFO 416. The timing of this data is matched to the data output of the FIFO 415, and buffered by the buffer 431 to form the fault status bus.

The programmable power supply 320 provides power for the head 50. The voltage of the power supply 320 is controlled by the DAC 313, which is part of a RAM and DAC combination (RAMDAC) 316. The RAMDAC 316 contains a dual port RAM 317. The contents of the dual port RAM 317 are programmed by the Microcontroller 315. Temperature is compensated by changing the contents of the dual port RAM 317. These values are calculated by the microcontroller 315 based on temperature sensed by a thermal sensor 300. The thermal sensor 300 signal connects to the Analog to Digital Converter (ADC) 311. The ADC 311 is preferably incorporated in the Microcontroller 315.

The Head Control ASIC 400 contains control circuits for thermal lag compensation and print density. Thermal lag compensation requires that the power supply voltage to the head 50 is a rapidly time-varying voltage which is synchronized with the enable pulse for the heater. This is achieved by programming the programmable power supply 320 to produce this voltage. An analog time varying programming voltage is produced by the DAC 313 based upon data read from the dual port RAM 317. The data is read according to an address produced by the counter 403. The counter 403 produces one complete cycle of addresses during the period of one enable pulse. This synchronization is ensured, as the counter 403 is clocked by the system clock 408, and the top count of the counter 403 is used to clock the enable counter 404. The count from the enable counter 404 is then decoded by the decoder 405 and buffered by the buffer 432 to produce the enable pulses for the head 50. The counter 403 may include a prescaler if the number of states in the count is less than the number of clock periods in one enable pulse. Sixteen voltage states are adequate to accurately compensate for the heater thermal lag. These sixteen states can be specified by using a four bit connection between the counter 403 and the dual port RAM 317. However, these sixteen states may not be linearly spaced in time. To allow non-linear timing of these states the counter 403 may also include a ROM or other device which causes the counter 403 to count in a non-linear fashion. Alternatively, fewer than sixteen states may be used.

For print density compensation, the printing density is detected by counting the number of pixels to which a drop is to be printed ('on' pixels) in each enable period. The 'on' pixels are counted by the On pixel counters 402. There is one On pixel counter 402 for each of the eight enable phases. The number of enable phases in a print head in accordance with the invention depend upon the specific design. Four, eight, and sixteen are convenient numbers, though there is no requirement that the number of enable phases is a power of two. The On Pixel Counters 402 can be composed of combinatorial logic pixel counters 420 which determine how many bits in a nibble of data are on. This number is then accumulated by the adder 421 and accumulator 422. A latch 423 holds the accumulated value valid for the duration of the enable pulse. The multiplexer 401 selects the output of the latch 423 which corresponds to the current enable phase, as determined by the enable counter 404. The output of the multiplexer 401 forms part of the address of the dual port RAM 317. An exact count of the number of 'on' pixels is not necessary, and the most significant four bits of this count are adequate.

Combining the four bits of thermal lag compensation address and the four bits of print density compensation address means that the dual port RAM 317 has an 8 bit address. This means that the dual port RAM 317 contains 256 numbers, which are in a two dimensional array. These two dimensions are time (for thermal lag compensation) and print density. A third dimension—temperature—can be included. As the ambient temperature of the head varies only slowly, the microcontroller 315 has sufficient time to calculate a matrix of 256 numbers compensating for thermal lag and print density at the current temperature. Periodically (for example, a few times a second), the microcontroller senses the current head temperature and calculates this matrix.

The clock to the print head 50 is generated from the system clock 408 by the Head clock generator 407, and buffered by the buffer 406. To facilitate testing of the Head control ASIC, JTAG test circuits 499 may be included.

The clock to the LIFT print head 50 is generated from the system clock 408 by the Head clock generator 407, and buffered by the buffer 406. To facilitate testing of the Head control ASIC, JTAG test circuits 499 may be included.

Comparison with thermal ink jet technology

The table "Comparison between Thermal ink jet and Present Invention" compares the aspects of printing in accordance with the present invention with thermal ink jet printing technology.

A direct comparison is made between the present invention and thermal ink jet technology because both are drop on demand systems which operate using thermal actuators and liquid ink. Although they may appear similar, the two technologies operate on different principles.

Thermal ink jet printers use the following fundamental operating principle. A thermal impulse caused by electrical resistance heating results in the explosive formation of a bubble in liquid ink. Rapid and consistent bubble formation can be achieved by superheating the ink, so that sufficient heat is transferred to the ink before bubble nucleation is complete. For water based ink, ink temperatures of approximately 280° C. to 400° C. are required. The bubble formation causes a pressure wave which forces a drop of ink from the aperture with high velocity. The bubble then collapses, drawing ink from the ink reservoir to re-fill the nozzle. Thermal ink jet printing has been highly successful commercially due to the high nozzle packing density and the use of well established integrated circuit manufacturing techniques. However, thermal ink jet printing technology faces significant technical problems including multi-part precision fabrication, device yield, image resolution, 'pepper' noise, printing speed, drive transistor power, waste power dissipation, satellite drop formation, thermal stress, differential thermal expansion, kogation, cavitation, rectified diffusion, and difficulties in ink formulation.

Printing in accordance with the present invention has many of the advantages of thermal ink jet printing, and completely or substantially eliminates many of the inherent problems of thermal ink jet technology.

Comparison between Thermal ink jet and Present Invention

| | Thermal Ink-Jet | Present Invention |
|---|---|---|
| Drop selection mechanism | Drop ejected by pressure wave caused by thermally induced bubble | Choice of surface tension or viscosity reduction mechanisms |
| Drop separation mechanism | Same as drop selection mechanism | Choice of proximity, electrostatic, magnetic, and other methods |
| Basic ink carrier | Water | Water, microemulsion, alcohol, glycol, or hot melt |
| Head construction | Precision assembly of nozzle plate, ink channel, and substrate | Monolithic |
| Per copy printing cost | Very high due to limited print head life and expensive inks | Can be low due to permanent print heads and wide range of possible inks |
| Satellite drop formation | Significant problem which degrades image quality | No satellite drop formation |
| Operating ink temperature | 280° C. to 400° C. (high temperature limits dye use and ink formulation) | Approx. 70° C. (depends upon ink formulation) |
| Peak heater temperature | 400° C. to 1,000° C. (high temperature reduces device life) | Approx. 130° C. |
| Cavitation (heater erosion by bubble collapse) | Serious problem limiting head life | None (no bubbles are formed) |
| Kogation (coating of heater by ink ash) | Serious problem limiting head life and ink formulation | None (water based ink temperature does not exceed 100° C.) |
| Rectified diffusion (formation of ink bubbles due to pressure cycles) | Serious problem limiting ink formulation | Does not occur as the ink pressure does not go negative |
| Resonance | Serious problem limiting nozzle design and repetition rate | Very small effect as pressure waves are small |

| | Thermal Ink-Jet | Present Invention |
|---|---|---|
| Practical resolution | Approx. 800 dpi max. | Approx. 1,600 dpi max. |
| Self-cooling operation | No (high energy required) | Yes: printed ink carries away drop selection energy |
| Drop ejection velocity | High (approx. 10 m/sec) | Low (approx. 1 m/sec) |
| Crosstalk | Serious problem requiring careful acoustic design, which limits nozzle refill rate. | Low velocities and pressures associated with drop ejection make crosstalk very small. |
| Operating thermal stress | Serious problem limiting print-head life. | Low: maximum temperature increase approx. 90° C. at centre of heater. |
| Manufacturing thermal stress | Serious problem limiting print-head size. | Same as standard CMOS manufacturing process. |
| Drop selection energy | Approx. 20 μJ | Approx. 270 nJ |
| Heater pulse period | Approx. 2–3 μs | Approx. 15–30 μs |
| Average heater pulse power | Approx. 8 Watts per heater. | Approx. 12 mW per heater. This is more than 500 times less than Thermal Ink-Jet. |
| Heater pulse voltage | Typically approx. 40 V. | Approx. 5 to 10 V. |
| Heater peak pulse current | Typically approx. 200 mA per heater. This requires bipolar or very large MOS drive transistors. | Approx. 4 mA per heater. This allows the use of small MOS drive transistors. |
| Fault tolerance | Not implemented. Not practical for edge shooter type. | Simple implementation results in better yield and reliability |
| Constraints on ink composition | Many constraints including kogation, nucleation, etc. | Temperature coefficient of surface tension or viscosity must be negative. |

-continued

| | Thermal Ink-Jet | Present Invention |
|---|---|---|
| Ink pressure | Atmospheric pressure or less | Approx. 1.1 atm |
| Integrated drive circuitry | Bipolar circuitry usually required due to high drive current | CMOS, nMOS, or bipolar |
| Differential thermal expansion | Significant problem for large print heads | Monolithic construction reduces problem |
| Pagewidth print heads | Major problems with yield, cost, precision construction, head life, and power dissipation | High yield, low cost and long life due to fault tolerance. Self cooling due to low power dissipation. |

Yield and Fault Tolerance

In most cases, monolithic integrated circuits cannot be repaired if they are not completely functional when manufactured. The percentage of operational devices which are produced from a wafer run is known as the yield. Yield has a direct influence on manufacturing cost. A device with a yield of 5% is effectively ten times more expensive to manufacture than an identical device with a yield of 50%. There are three major yield measurements:

1) Fab yield
2) Wafer sort yield
3) Final test yield

For large die, it is typically the wafer sort yield which is the most serious limitation on total yield. Full pagewidth color heads in accordance with this invention are very large in comparison with typical VLSI circuits. Good wafer sort yield is critical to the cost-effective manufacture of such heads.

Figure 5:
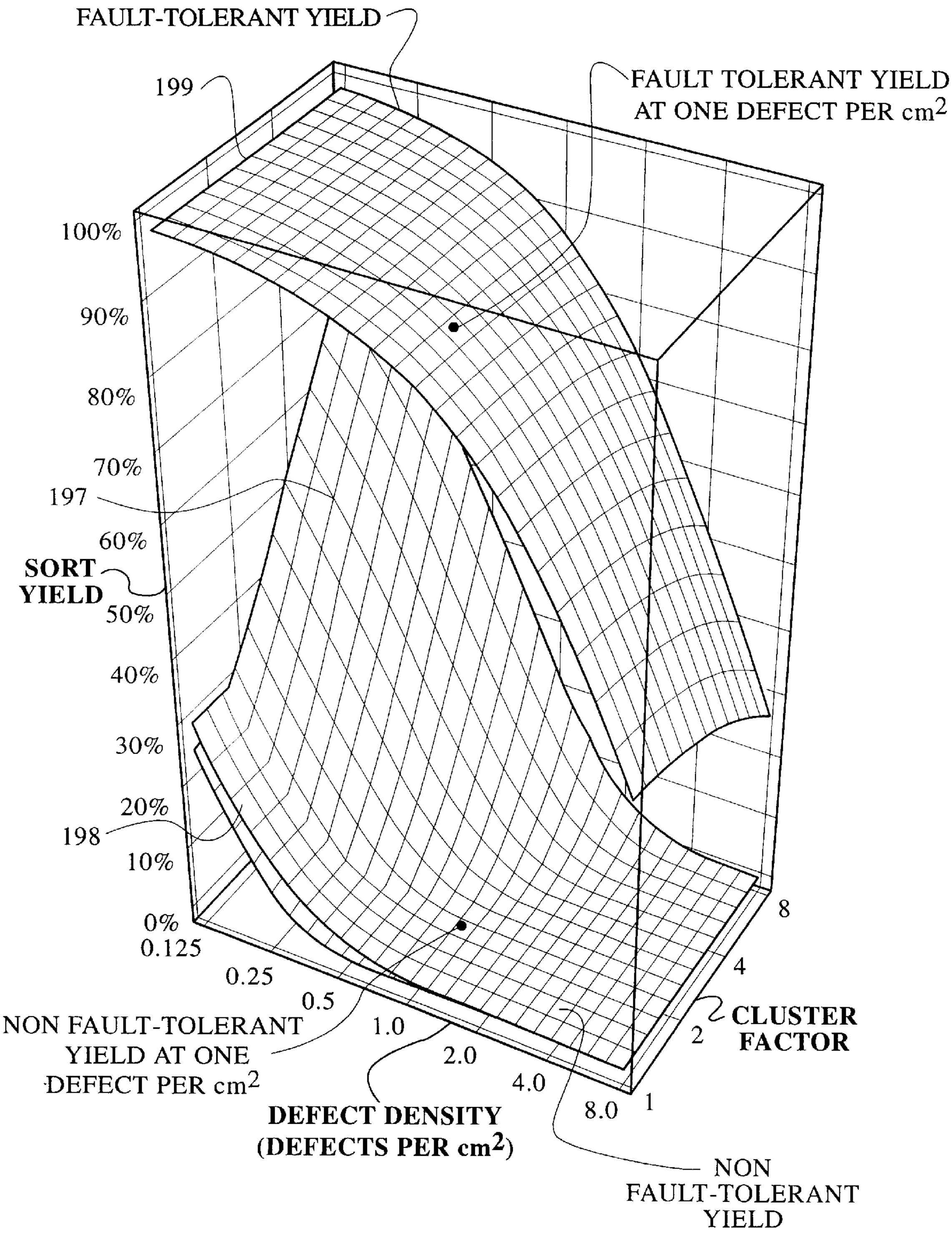
FIG. 5 shows projected manufacturing yields for an A4 page width color print head embodying features of the invention, with and without fault tolerance.
Figure 6:
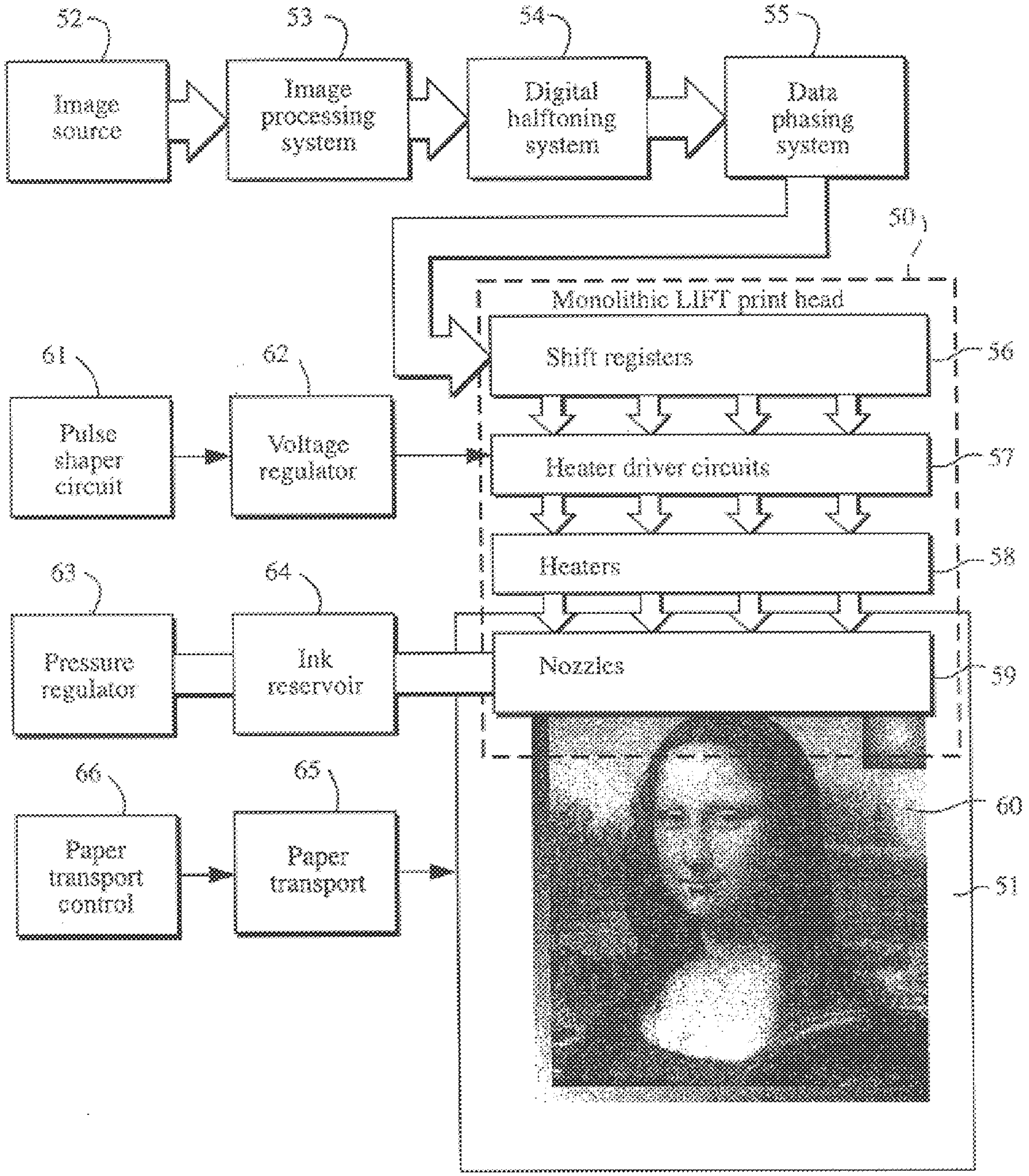
FIG. 6 shows a generalized block diagram of a printing system using a LIFT head

FIG. 5 is a graph of wafer sort yield versus defect density for a monolithic full width color A4 head embodiment of the invention. The head is 215 mm long by 5 mm wide. The non fault tolerant yield 198 is calculated according to Murphy's method, which is a widely used yield prediction method. With a defect density of one defect per square cm, Murphy's method predicts a yield less than 1%. This means that more than 99% of heads fabricated would have to be discarded. This low yield is highly undesirable, as the print head manufacturing cost becomes unacceptably high.

Murphy's method approximates the effect of an uneven distribution of defects. FIG. 5 also includes a graph of non fault tolerant yield 197 which explicitly models the clustering of defects by introducing a defect clustering factor. The defect clustering factor is not a controllable parameter in manufacturing, but is a characteristic of the manufacturing process. The defect clustering factor for manufacturing processes can be expected to be approximately 2, in which case yield projections closely match Murphy's method.

A solution to the problem of low yield is to incorporate fault tolerance by including redundant functional units on the chip which are used to replace faulty functional units.

In memory chips and most Wafer Scale Integration (WSI) devices, the physical location of redundant sub-units on the chip is not important. However, in printing heads the redundant sub-unit may contain one or more printing actuators. These must have a fixed spatial relationship to the page being printed. To be able to print a dot in the same position as a faulty actuator, redundant actuators must not be displaced in the non-scan direction. However, faulty actuators can be replaced with redundant actuators which are displaced in the scan direction. To ensure that the redundant actuator prints the dot in the same position as the faulty actuator, the data timing to the redundant actuator can be altered to compensate for the displacement in the scan direction.

To allow replacement of all nozzles, there must be a complete set of spare nozzles, which results in 100% redundancy. The requirement for 100% redundancy would normally more than double the chip area, dramatically reducing the primary yield before substituting redundant units, and thus eliminating most of the advantages of fault tolerance.

However, with print head embodiments according to this invention, the minimum physical dimensions of the head chip are determined by the width of the page being printed, the fragility of the head chip, and manufacturing constraints on fabrication of ink channels which supply ink to the back surface of the chip. The minimum practical size for a full width, full color head for printing A4 size paper is approximately 215 mm×5 mm. This size allows the inclusion of 100% redundancy without significantly increasing chip area, when using 1.5 $\mu$m CMOS fabrication technology. Therefore, a high level of fault tolerance can be included without significantly decreasing primary yield.

When fault tolerance is included in a device, standard yield equations cannot be used. Instead, the mechanisms and degree of fault tolerance must be specifically analyzed and included in the yield equation. FIG. 5 shows the fault tolerant sort yield 199 for a full width color A4 head which includes various forms of fault tolerance, the modeling of which has been included in the yield equation. This graph shows projected yield as a function of both defect density and defect clustering. The yield projection shown in FIG. 5 indicates that thoroughly implemented fault tolerance can increase wafer sort yield from under 1% to more than 90% under identical manufacturing conditions. This can reduce the manufacturing cost by a factor of 100.

Fault tolerance is highly recommended to improve yield and reliability of print heads containing thousands of printing nozzles, and thereby make pagewidth printing heads practical. However, fault tolerance is not to be taken as an essential part of the present invention.

Fault tolerance in drop-on-demand printing systems is described in the following Australian patent specifications filed on 12 Apr. 1995, the disclosure of which are hereby incorporated by reference:

'Integrated fault tolerance in printing mechanisms' (Filing no.: PN2324);

'Block fault tolerance in integrated printing heads' (Filing no.: PN2325);

'Nozzle duplication for fault tolerance in integrated printing heads' (Filing no.: PN2326);

'Detection of faulty nozzles in printing heads' (Filing no.: PN2327); and

'Fault tolerance in high volume printing presses' (Filing no.: PN2328).

Printing System Embodiments

A schematic diagram of a digital electronic printing system using a print head of this invention is shown in FIG.

6. This shows a monolithic printing head 50 printing an image 60 composed of a multitude of ink drops onto a recording medium 51. This medium will typically be paper, but can also be overhead transparency film, cloth, or many other substantially flat surfaces which will accept ink drops. The image to be printed is provided by an image source 52, which may be any image type which can be converted into a two dimensional array of pixels. Typical image sources are image scanners, digitally stored images, images encoded in a page description language (PDL) such as Adobe Postscript, Adobe Postscript level 2, or Hewlett-Packard PCL 5, page images generated by a procedure-call based rasterizer, such as Apple QuickDraw, Apple Quickdraw GX, or Microsoft GDI, or text in an electronic form such as ASCII. This image data is then converted by an image processing system 53 into a two dimensional array of pixels suitable for the particular printing system. This may be color or monochrome, and the data will typically have between 1 and 32 bits per pixel, depending upon the image source and the specifications of the printing system. The image processing system may be a raster image processor (RIP) if the source image is a page description, or may be a two dimensional image processing system if the source image is from a scanner.

If continuous tone images are required, then a halftoning system 54 is necessary. Suitable types of halftoning are based on dispersed dot ordered dither or error diffusion. Variations of these, commonly known as stochastic screening or frequency modulation screening are suitable. The halftoning system commonly used for offset printing—clustered dot ordered dither—is not recommended, as effective image resolution is unnecessarily wasted using this technique. The output of the halftoning system is a binary monochrome or color image at the resolution of the printing system according to the present invention.

The binary image is processed by a data phasing circuit 55 (which may be incorporated in a Head Control ASIC 400 as shown in FIG. 4) which provides the pixel data in the correct sequence to the data shift registers 56. Data sequencing is required to compensate for the nozzle arrangement and the movement of the paper. When the data has been loaded into the shift registers 56, it is presented in parallel to the heater driver circuits 57. At the correct time, the driver circuits 57 will electronically connect the corresponding heaters 58 with the voltage pulse generated by the pulse shaper circuit 61 and the voltage regulator 62. The heaters 58 heat the tip of the nozzles 59, affecting the physical characteristics of the ink. Ink drops 60 escape from the nozzles in a pattern which corresponds to the digital impulses which have been applied to the heater driver circuits. The pressure of the ink in the ink reservoir 64 is regulated by the pressure regulator 63. Selected drops of ink drops 60 are separated from the body of ink by the chosen drop separation means, and contact the recording medium 51. During printing, the recording medium 51 is continually moved relative to the print head 50 by the paper transport system 65. If the print head 50 is the full width of the print region of the recording medium 51, it is only necessary to move the recording medium 51 in one direction, and the print head 50 can remain fixed. If a smaller print head 50 is used, it is necessary to implement a raster scan system. This is typically achieved by scanning the print head 50 along the short dimension of the recording medium 51, while moving the recording medium 51 along its long dimension.

Multiple nozzles in a single monolithic print head

It is desirable that a new printing system intended for use in equipment such as office printers or photocopiers is able to print quickly. A printing speed of 60 A4 pages per minute (one page per second) will generally be adequate for many applications. However, achieving an electronically controlled print speed of 60 pages per minute is not simple.

The minimum time taken to print a page is equal to the number of dot positions on the page times the time required to print a dot, divided by the number of dots of each color which can be printed simultaneously.

The image quality that can be obtained is affected by the total number of ink dots which can be used to create an image. For full color magazine quality printing using dispersed dot digital halftoning, approximately 800 dots per inch (31.5 dots per mm) are required. The spacing between dots on the paper is 31.75 $\mu$m.

A standard A4 page is 210 mm times 297 mm. At 31.5 dots per mm, 61,886,632 dots are required for a monochrome full bleed A4 page. High quality process color printing requires four colors—cyan, magenta, yellow, and black. Therefore, the total number of dots required is 247,546,528. While this can be reduced somewhat by not allowing printing in a small margin at the edge of the paper, the total number of dots required is still very large. If the time taken to print a dot is 144 $\mu$s, and only one nozzle per color is provided, then it will take more than two hours to print a single page.

To achieve high speed, high quality printing with my printing system described above, printing heads with many small nozzles are required. The printing of a 800 dpi color A4 page in one second can be achieved if the printing head is the full width of the paper. The printing head can be stationary, and the paper can travel past it in the one second period. A four color 800 dpi printing head 210 mm wide requires 26,460 nozzles.

Such a print head may contain 26,460 active nozzles, and 26,460 redundant (spare) nozzles, giving a total of 52,920 nozzles. There are 6,615 active nozzles for each of the cyan, magenta, yellow, and black process colors.

Print heads with large numbers of nozzles can be manufactured at low cost. This can be achieved by using semiconductor manufacturing processes to simultaneously fabricate many thousands of nozzles in a silicon wafer. To eliminate problems with mechanical alignment and differential thermal expansion that would occur if the print head were to be manufactured in several parts and assembled, the head can be manufactured from a single piece of silicon. Nozzles and ink channels are etched into the silicon. Heater elements are formed by evaporation of resistive materials, and subsequent photolithography using standard semiconductor manufacturing processes.

To reduce the large number of connections that would be required on a print head with thousands of nozzles, data distribution circuits and drive circuits can also be integrated on the print head.

The print head width is related to the number of colors, the arrangement of nozzles, the spacing between the nozzles, and the head area required for drive circuitry and interconnections. For a monochrome head, an appropriate width would be approximately 2 mm. For a process color head, an appropriate width would be approximately 5 mm. For a CC'MM'YK color print head, the appropriate head width is approximately 8 mm. The length of the head depends upon the application. Very low cost applications may use short heads, which must be scanned over a page. High speed applications can use fixed page-width monolithic or multichip print heads. A typical range of lengths for print heads is between 1 cm and 21 cm, though print heads longer than 21 cm are appropriate for high volume paper or fabric printing.

Print head manufacturing process for print head with nozzle rim heaters

The manufacture of monolithic printing heads in accordance with this embodiment, is similar to standard silicon integrated circuit manufacture. However, the normal process flow must be modified in several ways. This is essential to form the nozzles, the barrels for the nozzles, the heaters, and the nozzle tips. There are many different semiconductor processes upon which monolithic head production can be based. For each of these semiconductor processes, there are many different ways the basic process can be modified to form the necessary structures.

The manufacturing process for integrated printing heads can use <100> wafers for standard CMOS processing. The processing is substantially compatible with standard CMOS processing, as the MEMS specific steps can all be completed after the fabrication of the CMOS VLSI devices.

The wafers can be processed up to oxide on second level metal using the standard CMOS process flow. Some specific process steps then follow which can also be completed using standard CMOS processing equipment. The final etching of the nozzles through the chip can be completed at a MEMS facility, using a single lithographic step which requires only 10 $\mu$m lithography.

The process does not require any plasma etching of silicon: all silicon etching is performed with an EDP wet etch after the fabrication of active devices.

The nozzle diameter in this example is 16 $\mu$m, for a drop volume of approximately 8 pl. The process is readily adaptable for a wide range on nozzle diameters, both greater than and less than 16 $\mu$m.

The process uses anisotropic etching on a <100> silicon wafer to etch simultaneously from the ink channels and nozzle barrels. High temperature steps such as diffusion and LPCVD are avoided during the nozzle formation process.

Layout example

Figure 7:
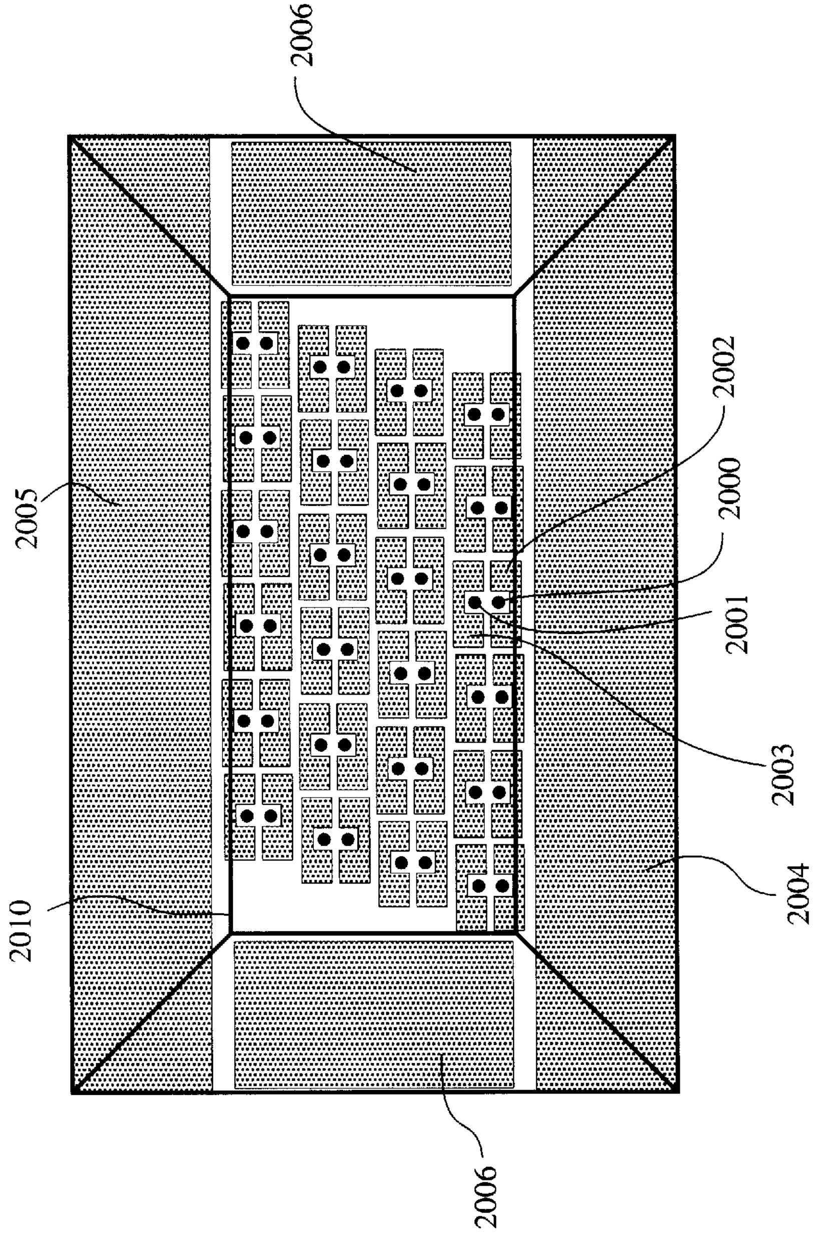
FIG. 7 shows a nozzle layout for a small section of the print head.

FIG. 7 shows an example layout for a small section of an 800 dpi print head. This shows the layout of nozzles and drive circuitry for 48 nozzles which are in a single ink channel pit. The black circles in this diagram represent the positions of the nozzles, and the gray regions represent the positions of the active circuitry.

The 48 nozzles comprise 24 main nozzles 2000, and 24 redundant nozzles 2001. The position of the MOS main drive transistors 2002 and redundant drive transistors 2003 are also shown. The ink channel pit 2010 is the shape of a truncated rectangular pyramid etched from the rear of the wafer. The faces of the pyramidical pit follow the {111} planes of the single crystal silicon wafer. The nozzles are located at the bottom of the pyramidical pits, where the wafer is thinnest. In the thicker regions of the wafer, such as the sloping walls of the ink channel pits, and the regions between pits, no nozzles can be placed. These regions can be used for the data distribution and fault tolerance circuitry. If a two micron or finer CMOS process is used, there is plenty of room to include extensive redundancy and fault tolerance in the shift registers, clock distribution, and other circuits used. FIG. 7 shows a suitable location for main shift registers 2004, redundant shift registers 2005, and fault tolerance circuitry 2006.

Figure 8:
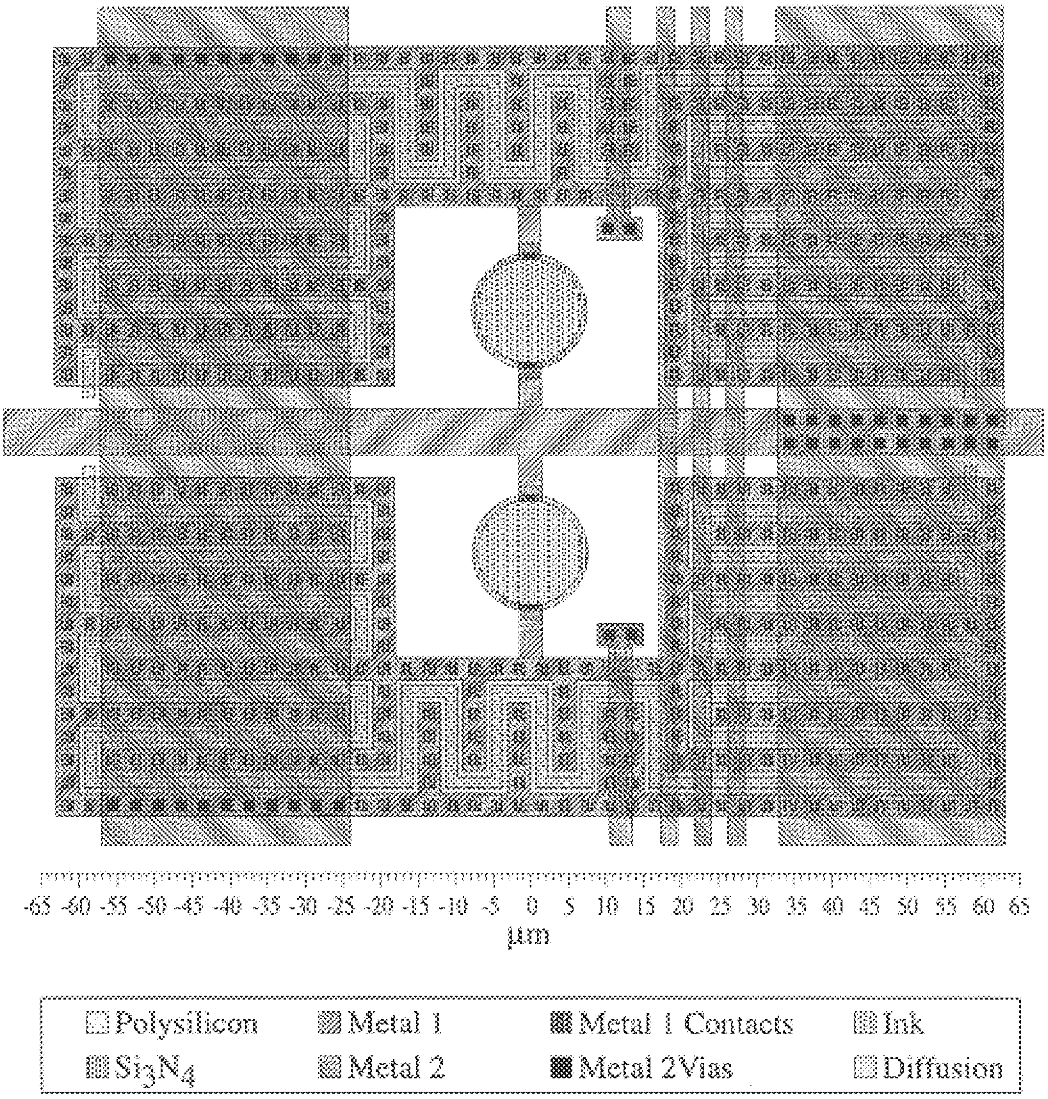
FIG. 8 shows a detail of the layout of two nozzles and two drive transistors.

FIG. 8 is a detail layout of one pair of nozzles (a main nozzle and its redundant counterpart), along with the drive transistors for the nozzle pair. The layout is for a 1.5 micron VLSI process. The layout shows two nozzles, with their corresponding drive transistors. The main and redundant nozzles are spaced one pixel width apart, in the print scanning direction. The main and redundant nozzles can be placed adjacent to each other without electrostatic or fluidic interference, because both nozzles are never fired simultaneously. Drive transistors can be placed very close to the nozzles, as the temperature rise resulting from drop selection is very small at short distances from the heater.

The large $V^+$ and $V^-$ currents are carried by a matrix of wide first and second level metal lines which covers the chip. The $V^+$ and $V^-$ terminals extend along the entire two long edges of the chip.

Alignment to crystallographic planes

The manufacturing process described in accord with the invention uses the crystallographic planes inherent in the single crystal silicon wafer to control etching. The orientation of the masking procedures to the {111} planes must be precisely controlled. The orientation of the primary flats on a silicon wafer are normally only accurate to within ±1° of the appropriate crystal plane. It is essential that this angular tolerance be taken into account in the design of the mask and manufacturing processes. The surface orientation of the wafer is also only accurate to ±1°. However, since the wafer is thinned to approximately 300 $\mu$m before the ink channels are etched, a ±1° error in alignment of the surface contributes a maximum of 5.3 $\mu$m of positional inaccuracy when etching through the ink channels. This can be accommodated in the design of the mask for back face etching.

Manufacturing process summary

The starting wafer can be a standard 6" silicon wafer, except that wafers polished on both sides are required.

Figure 9:
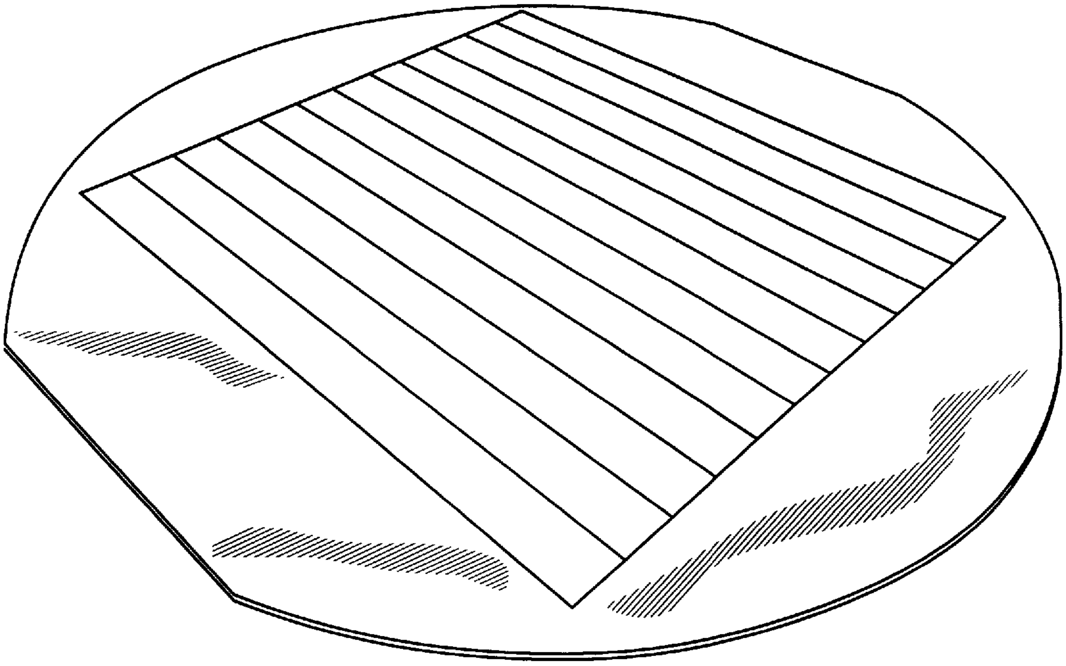
FIG. 9 shows the layout of a number of print heads fabricated on a standard silicon wafer.

FIG. 9 shows a 6" wafer with 12 full color print heads, each with a print width of 105 mm. Two of these print heads can be combined to form an A4/US letter sized pagewidth print head, four can be combined to provide a 17" web commercial printing head, or they can be used individually for photograph format printing, for example in digital 'minilabs', A6 format printers, or digital cameras.

Example wafer specifications are:

| | |
|---|---|
| Size | 150 mm (6") |
| Orientation | <100> |
| Doping | n/n + epitaxial |
| Polish | Double-sided |
| Nominal thickness | 625 micron |
| Angle to crystal planes | ±1° |

The major manufacturing steps are as follows:

1) Complete the CMOS process, fabricating drive transistors, shift registers, clock distribution circuitry, and fault tolerance circuitry according to the normal CMOS process flow. A two level metal CMOS process with line widths 1.5 $\mu$m or less is preferred. The CMOS process is completed up until oxide over second level metal.

Figure 10:
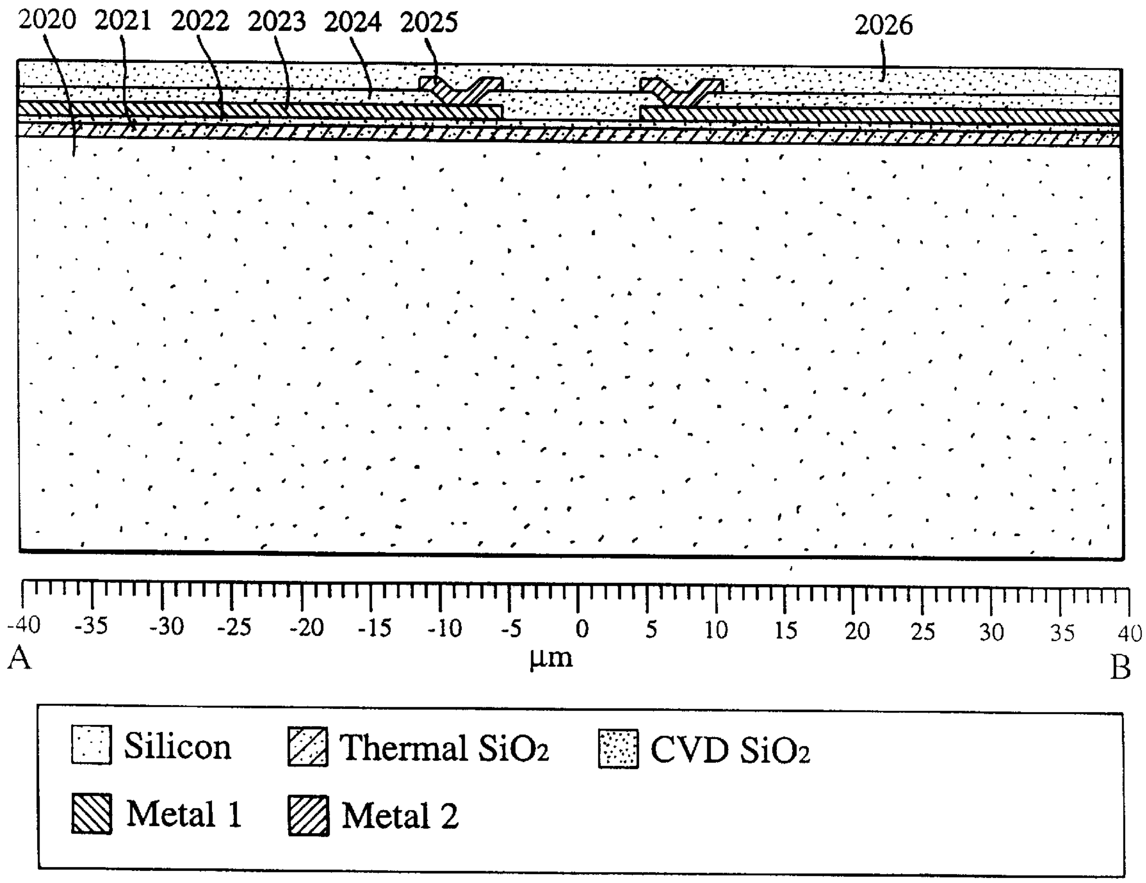
FIGS. 10 to 21 show cross sections of the print head in a small region at the tip of one nozzle at various stages during the manufacturing process.

FIG. 10 shows a cross section of wafer in the region of a nozzle tip after the completion of the standard CMOS process flow.

This diagram shows the silicon wafer 2020, field oxide 2021, first interlevel oxide 2022, first level metal 2023, second interlevel oxide 2024, second level metal 2025, and passivation oxide 2026.

The layer thicknesses in this example are as follows:

a) Field oxide 2021: 1 $\mu$m.

b) First interlevel oxide 2022: 0.5 $\mu$m.

c) First level metal 2023: 1 $\mu$m.

d) Second interlevel oxide 2024: 1.5 $\mu$m, planarized.

e) Second level metal 2025: 1 $\mu$m.

f) Passivation oxide 2026: 2 $\mu$m, planarized.

There are two interlevel vias at the nozzle tip, shown connecting the first level metal 2023 and a small patch of second level metal 2025.

2) Mask the nozzle tip using resist. The nozzle tip hole is formed to cut the interlevel vias at the nozzle tip in half This is to provide a 'taller' connection to the heater. On the same mask as the nozzle tip holes are openings which delineate the edge of the chip. This is for front-face etching of the chip boundary for chip separation from the wafer. The chip separation from the wafer is etched simultaneously to the ink channels and nozzles.

Figure 11:
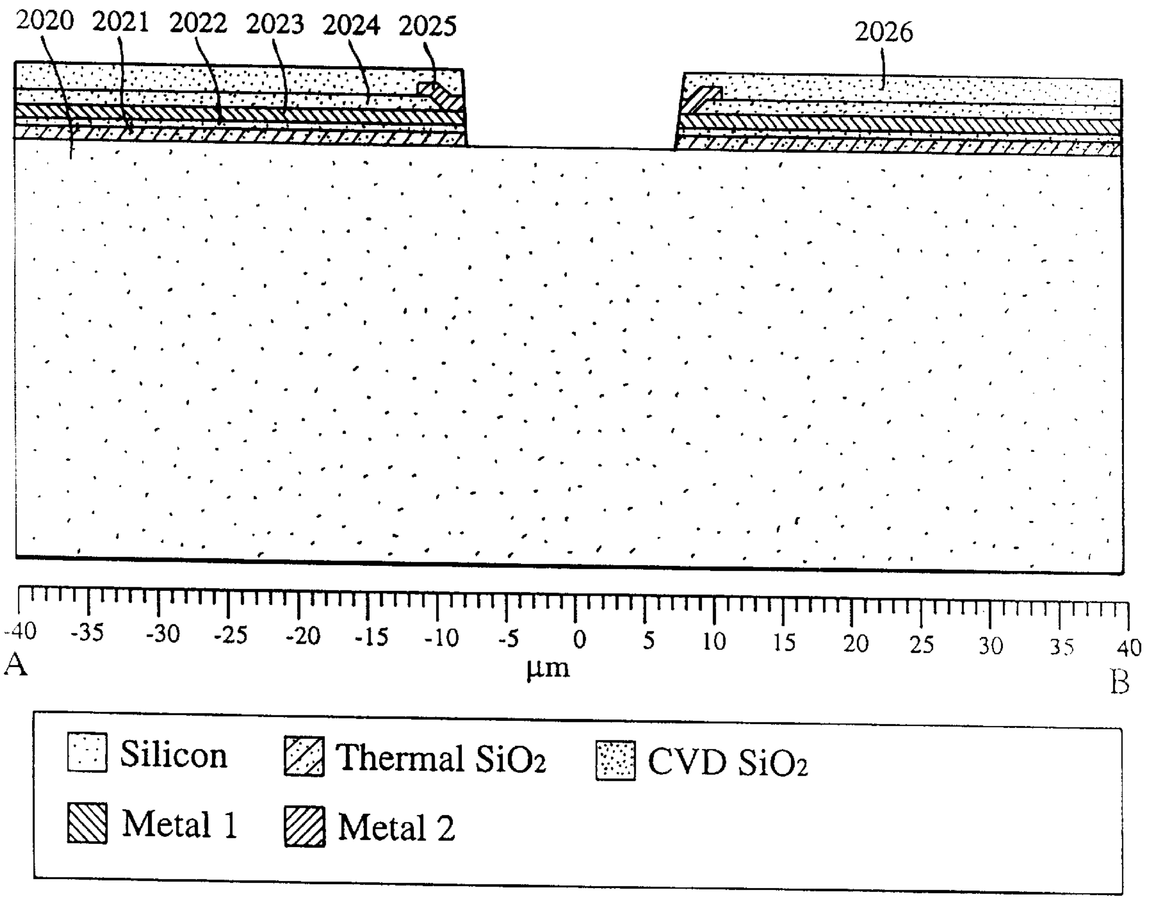

3) Plasma etch the nozzle tip and front face chip boundary. This is a anisotropic plasma etch of the surface oxide layers. This etch removes approximately 5 μm of $SiO_2$. Etch sidewalls should be as steep as possible. Here 85° sidewalls are assumed. The etch proceeds until the silicon is reached FIG. 11 is a cross section of the nozzle tip region after the nozzle tip has been etched.

Figure 12:
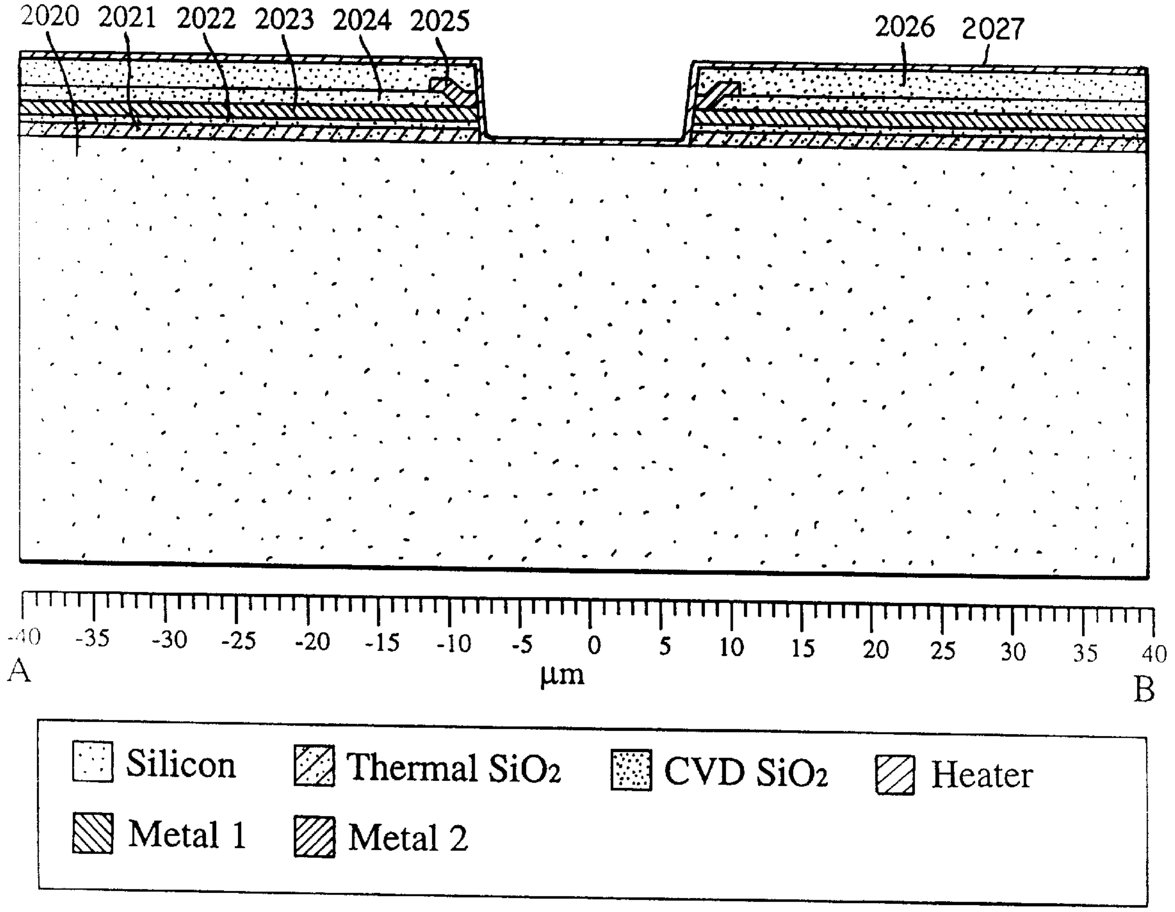

4) Deposit a thin layer of heater material 2027. The layer thickness depends upon the resistivity of the heater material chosen. Many different heater materials can be used, including nichrome, tantalum/aluminium alloy, tungsten, polysilicon doped with boron, zirconium diboride, hafnium diboride, and others. The melting point of the heater material does not need to be very high, so heater materials which can be evaporated instead of sputtered can be chosen. FIG. 12 is a cross section of the nozzle tip region after this deposition step.

5) Chemically thin the wafer to a thickness of approximately 300 microns.

Figure 13:
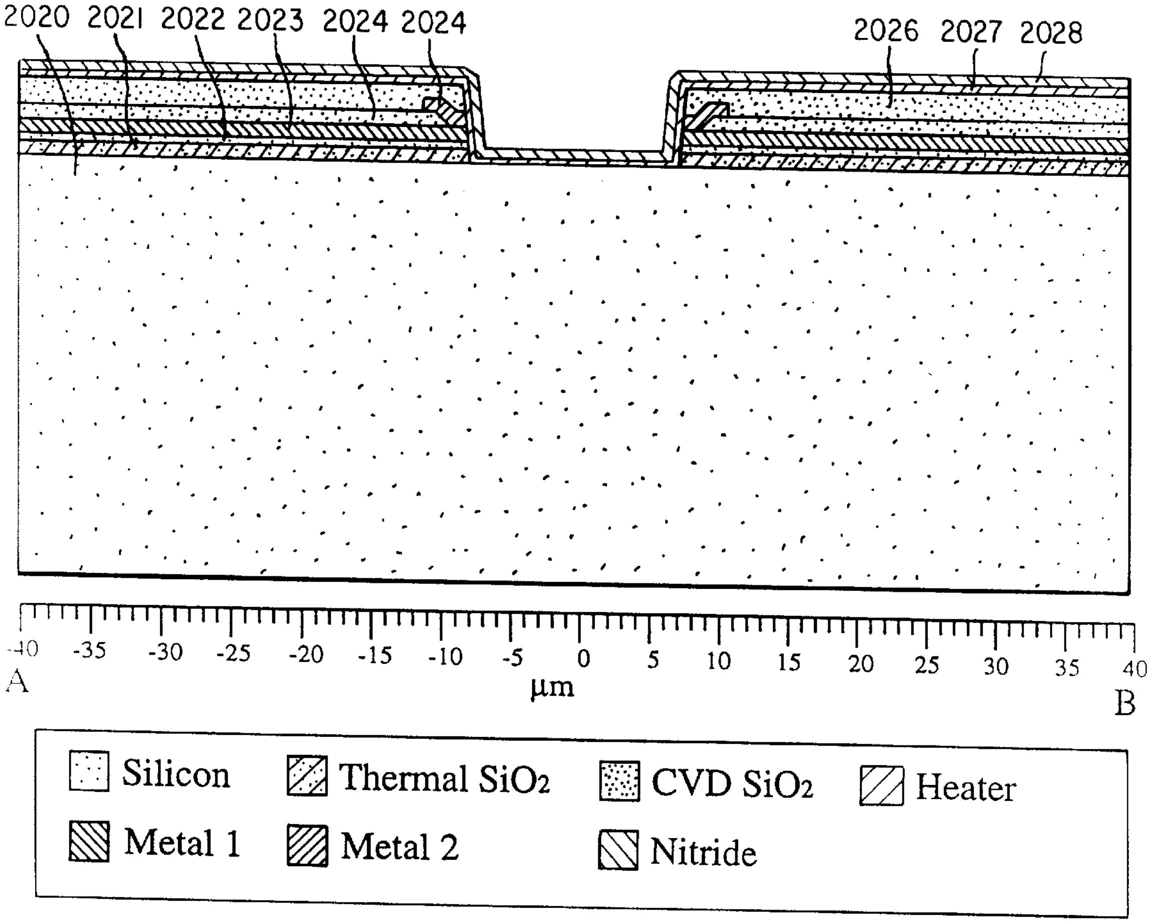

6) Deposit 0.5 micron of PECVD $Si_3N_4$ (nitride) 2028 on both the front and back face of the wafer. FIG. 13 is a cross section of the nozzle tip region after this deposition step.

7) Spin-coat resist on the back of the wafer. Mask the back face of the wafer for anisotropic etching of the ink channels, and chip separation (dicing). The mask contains concave rectangular holes to form the ink channels, and holes which delineate the edge of the chip. As some angles of the chip edge boundary are convex, mask undercutting will occur. The shape of the chip edge can be adjusted by placing protrusions on the mask at convex comers. The mask patterns are aligned to the {111} planes. The resist is used to mask the etching of the PECVD nitride previously deposited on the back face of the wafer. Etch the backface nitride, and strip the resist.

8) Etch the wafer in EDP at 110° C. until the wafer thickness in the nozzle tip region is approximately 100 μm. The etch time should be approximately 4 hours. The duration of this etch, and resulting silicon thickness in the nozzle region, can be adjusted to control the geometry of the chamber behind the nozzle tip (the nozzle barrel). While the etch is eventually right through the wafer, it is interrupted part way through to start etching from the front surface of the wafer as well as the back. This two stage etching allows precise control of the amount of undercutting of the nozzle tip region that occurs. An undercut of between 1 micron and 8 microns is desirable, with an undercut of approximately 3 microns being preferred. This etch is completed in step 12.

Figure 14:
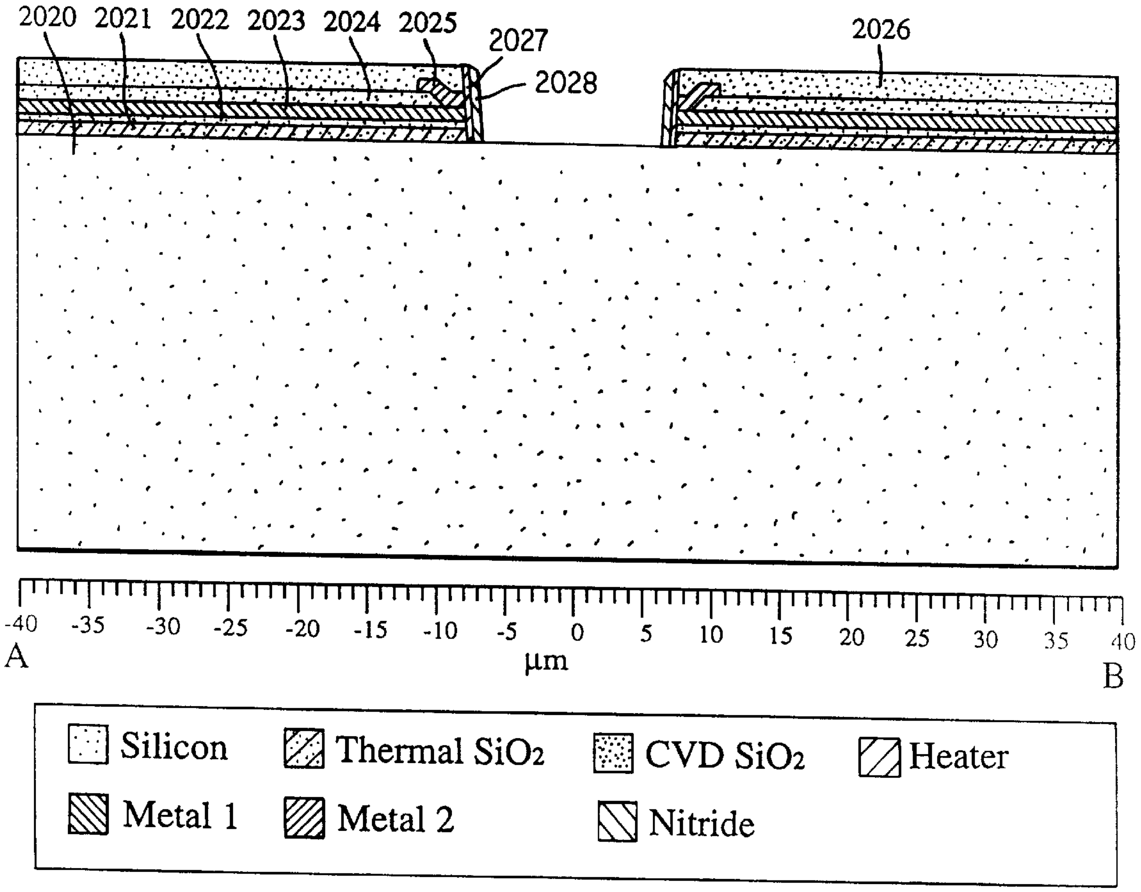

9) Anisotropically etch the surface nitride 2028 and heater 2027 layers. The anisotropic etch can be a reactive ion plasma etch (RIE). This etching step should remove all heater 2027 and nitride 2028 material from horizontal surfaces, while leaving most of the nitride 2028 and all of the heater 2027 material on the near vertical surface of the nozzle tip. FIG. 14 is a cross section of the nozzle tip region after this etching step.

10) Open the bonding pads using standard lithographic and etching processes.

Figure 15:
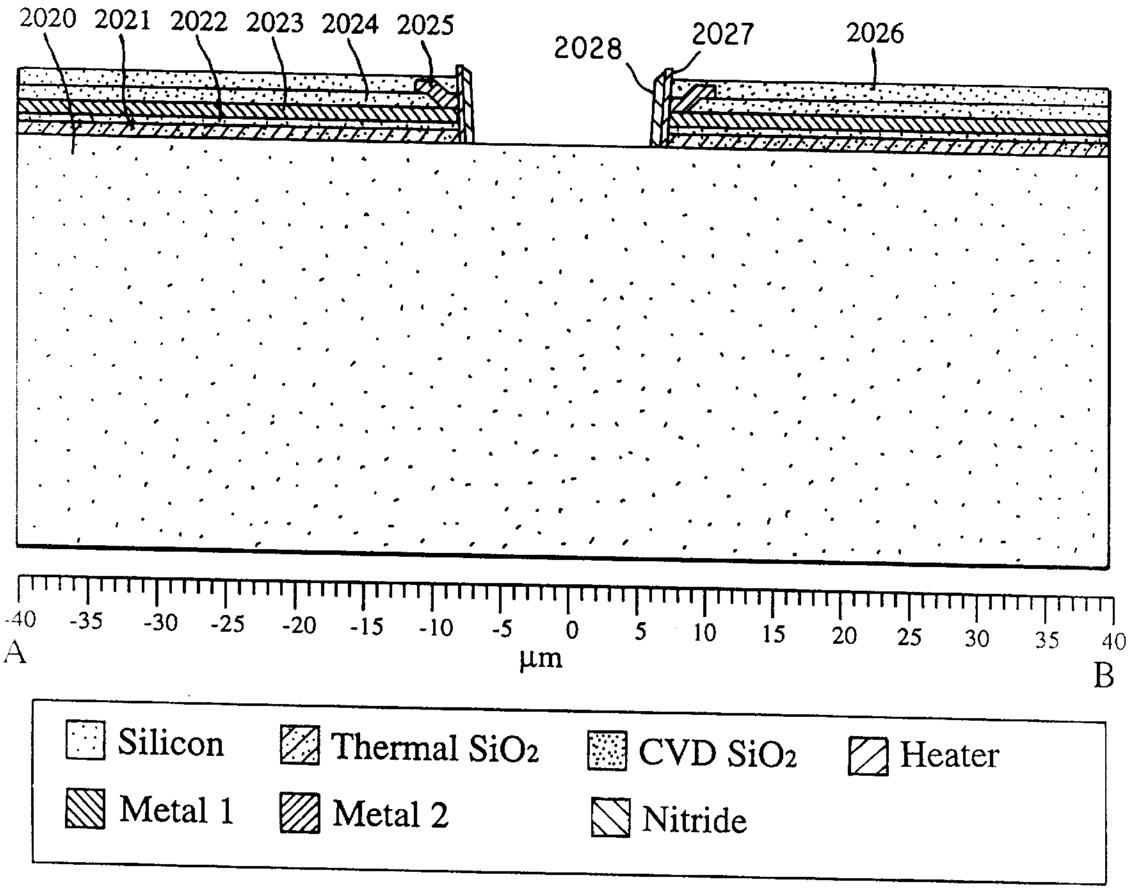

11) Isotropically etch 1 micron of $SiO_2$ 2026, without using a mask. This can be achieved with a wet etch which has a high selectivity against $Si_3N_4$. This forms a silicon nitride rim around the nozzle tip. FIG. 15 is a cross section of the nozzle tip region after this etching step.

12) Complete the wafer etch begun in step 8. Etch using EDP at 110° C. This etch proceeds from both sides of the wafer: through the nozzle tip holes from the front, and through the ink channel holes from the back. The etch rates are approximately as per the following table:

| | |
|---|---|
| Wet Etchant | BDP type S:<br>Ethylenediamine - 11<br>Water - 133 ml<br>Pyrocatechol - 160 grams<br>Pyrazine - 6 grams |
| Etch temperature | 110° C. |
| Silicon [100] etch rate | 55 μm per hour |
| Silicon [111] etch rate | 1.5 μm per hour |
| $SiO_2$ etch rate | 60 Å per hour |

These etch rates are from H. Seidel, "The Mechanism of Anisotropic Silicon Etching and its relevance for Micromachining," Transducers '87, Rec. of the 4th Int. Conf. on Solid State Sensors and Actuators, 1987, PP. 120–125.

The etch time is critical, as there is no etch stop. As each batch will vary somewhat in etch rate, wafers should be checked periodically near the end of the etch period. The etch is nearly complete when light first begins to shine through the nozzle tip holes. At this stage, the wafer is returned to the etch for another six minutes. It is desirable that the wafers that are processed simultaneously have matched wafer thicknesses.

Figure 16:
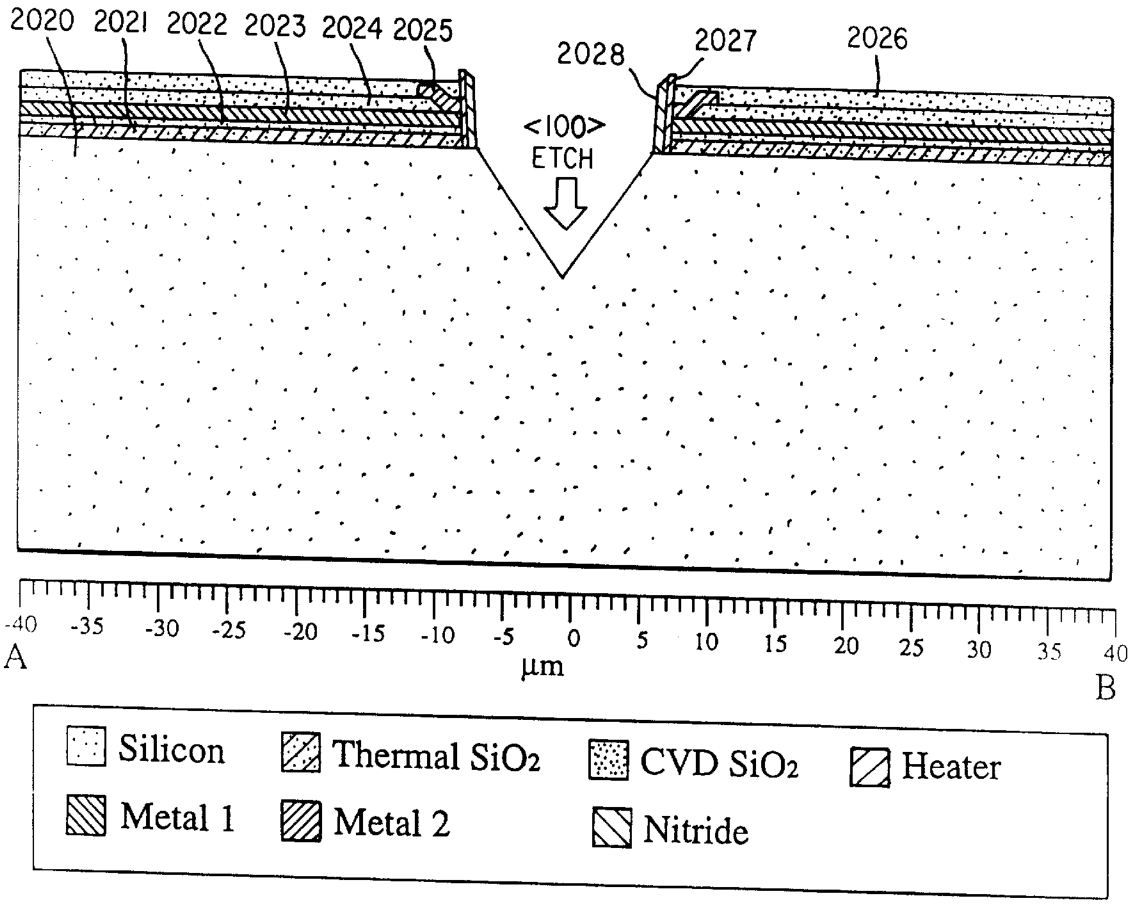
Figure 17:
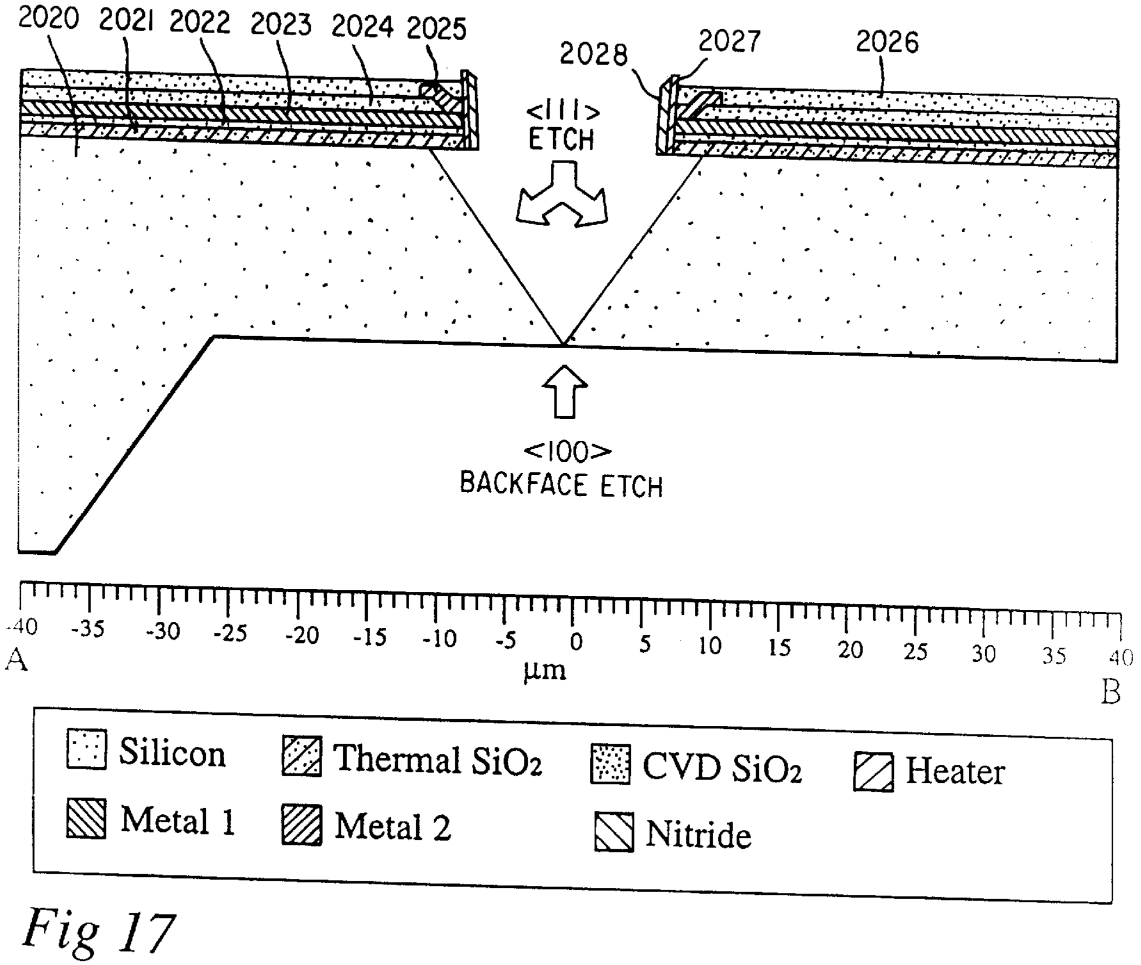

The etch proceeds in three stages:

a) During the first 10 minutes, the etch proceeds at the <100> etch rate from both the front side (through the nozzle tip) and the back side of the wafer. The depth of the etch from the front side will be the radius of the nozzle tip hole/÷2 (approximately 10 μm for a 7 μm radius nozzle tip hole). FIG. 16 is a cross section of the nozzle tip region at this time.

b) During the next approximately 1 hour and 40 minutes, the etch proceeds at the <100> rate from the back face of the wafer, but at the <111> rate through the nozzle tip holes. The etch depth through the back face holes is around 90 μm, and the etch depth through the nozzle tip holes is around 2.5 μm in the [111] directions (approximately 3 μm in the <100> direction). FIG. 17 is a cross section of the nozzle tip region at this time.

Figure 18:
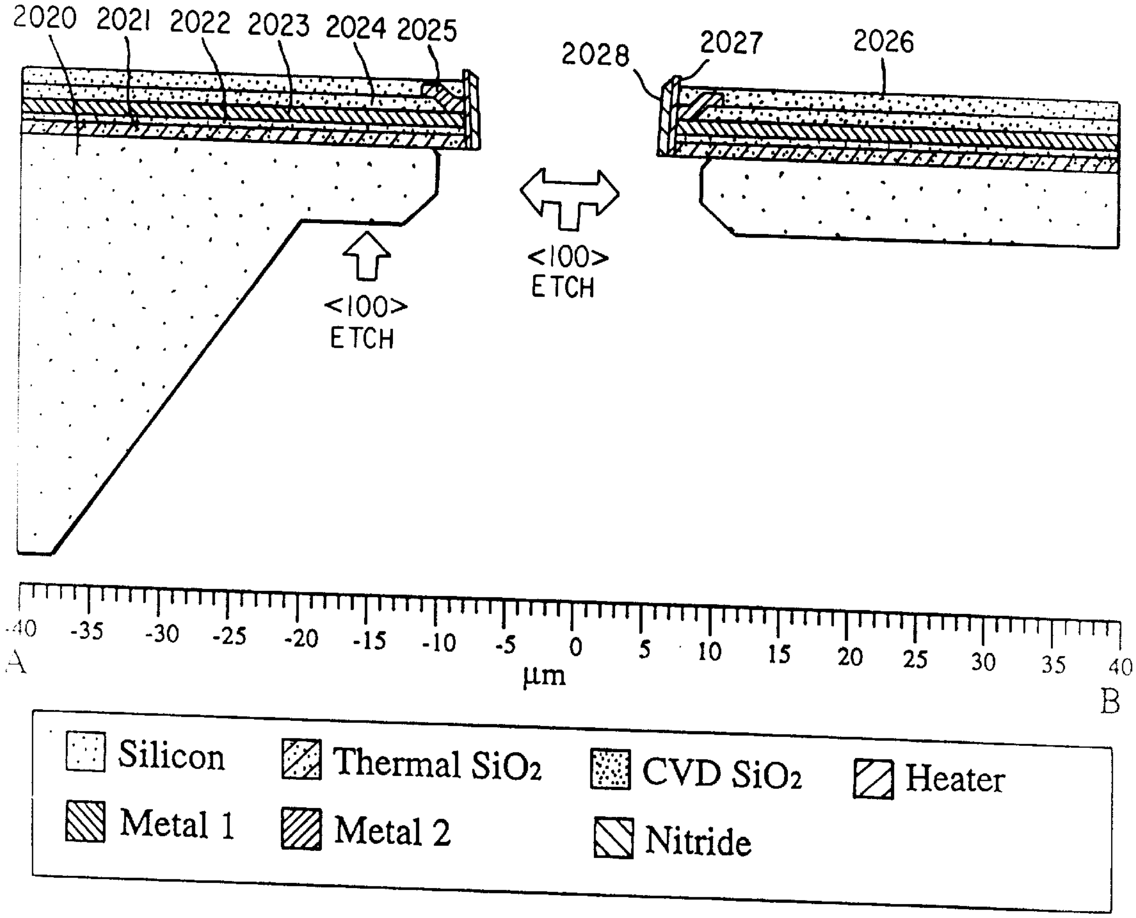

At this time, the nozzle tip holes meet the ink channel holes, resulting in exposed convex silicon surfaces, with relatively high etch rates. During the next six minutes, the etch proceeds at the <100> rate in the ink channels, and at various accelerated rates around the convex silicon. FIG. 18 is a cross section of the nozzle tip region at this time.

The amount of undercut of the nozzle tip can be controlled by altering the relative amount of etching from the front surface and the back surface. This can readily be achieved by starting the back surface etch some time before starting the front surface etch. As the total etch time is measured in hours, it is readily possible to accurately adjust the amount of time that the wafer is initially etched in EDP before removing the nitride from the nozzle tip region.

This method can compensate for different wafer thicknesses, different <111>/<100> etch ratios of the etchant, as well as give a high degree of control of the thickness of the silicon membrane and the amount of undercut of the heater.

At this stage the chip edges have also been etched, as the chip edge etch proceeds simultaneously to the ink channel etch. The design of the chip edge masking pattern can be adjusted so that the chips are still supported by the wafer at the end of the etching step, leaving only thin 'bridges' which are easily snapped without damaging the chips. Alternatively, the chips may be completely separated from the wafer at this stage.

To ensure that the chips are fully separated during the EDP etch, allow etching from both sides of the wafer.

The mask slots on the front side of the wafer can be much narrower than that those on the back side of the wafer (a 10 $\mu$m width is suitable). This reduces wasted wafer area between the chips to an insignificant amount.

Figure 19:
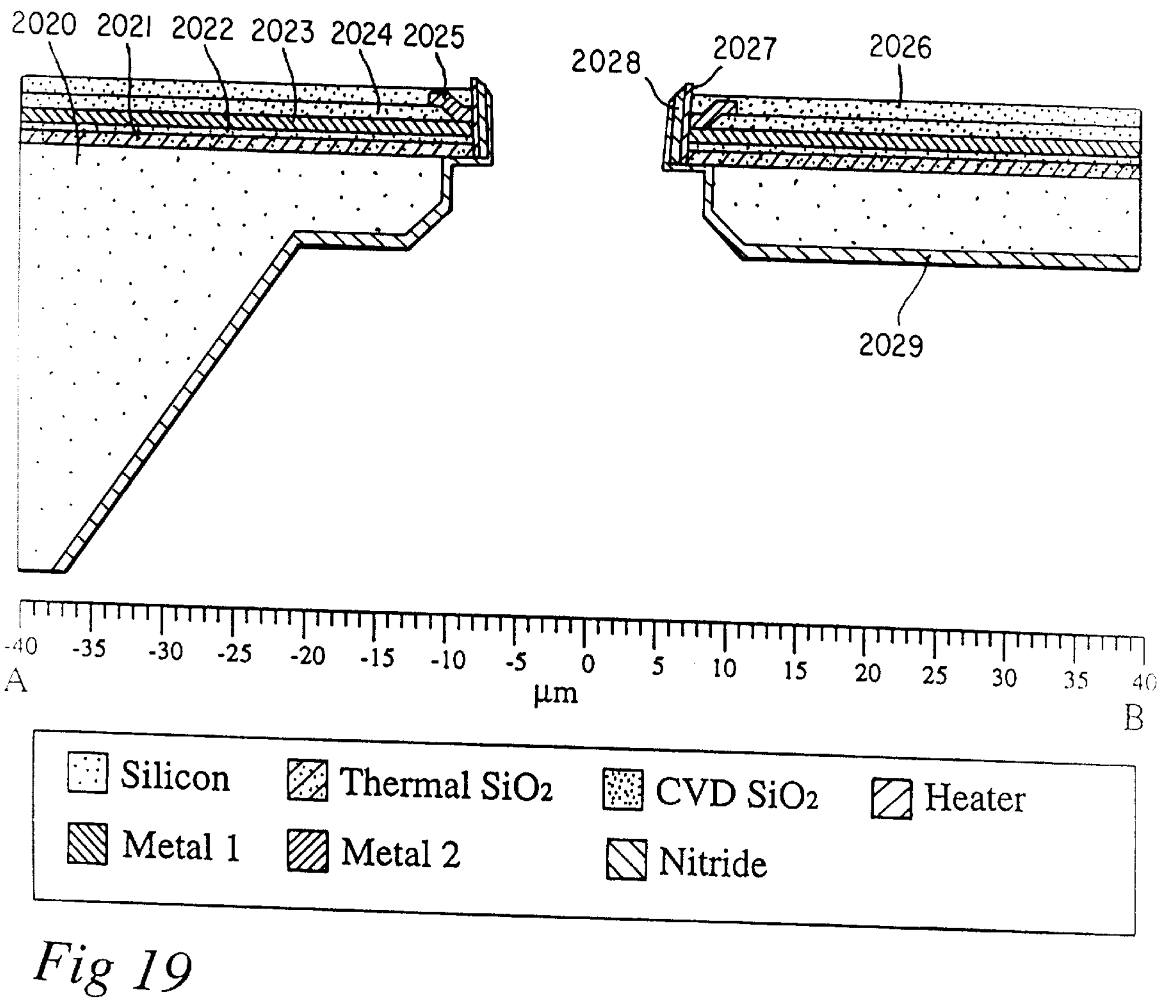

13) Deposit a passivation layer from the back surface of the chip. One micron of PECVD $Si_3N_4$ may be used. FIG. 19 is a cross section of the nozzle tip region after this deposition step.

14) Fill the print head with water 2030 under slight positive pressure (approx. 10 kPa). Care must be taken to prevent water droplets or condensation on the front face of the wafer, as this will block the hydrophobising process.

Expose the print head to fumes of a hydrophobising agent such as a fluorinated alkyl chloro silane. Suitable hydrophobising agents include (in increasing order of preference):

1) dimethyldichlorosilane $(CH_3)_2SiCl_2$ (not preferred)
2) (3,3,3-trifluoropropyl)-trichlorosilane $CF_3(CH_2)_2SiCl_3$
3) pentafluorotetrahydrobutyl-trichlorosilane $CF_3CF_2(CH_2)_2SiCl_3$
4) heptafluorotetrahydropentyl-trichlorosilane $CF_3(CF_2)_2(CH_2)_2SiCl_3$
5) nonafluorotetrahydrohexyl-trichlorosilane $CF_3(CF_2)_3(CH_2)_2SiCl_3$
6) undecafluorotetrahydroheptyl-trichlorosilane $CF_3(CF_2)_4(CH_2)_2SiCl_3$
7) tridecafluorotetrahydrooctyl-trichlorosilane $CF_3(CF_2)_5(CH_2)_2SiCl_3$
8) pentadecafluorotetrahydrononyl-trichlorosilane $CF_3(CF_2)_6(CH_2)_2SiCl_3$ Many other alternatives are available. A fluorinated surface is preferable to an alkylated surface, to reduce physical adsorption of the ink surfactant.

Figure 20:
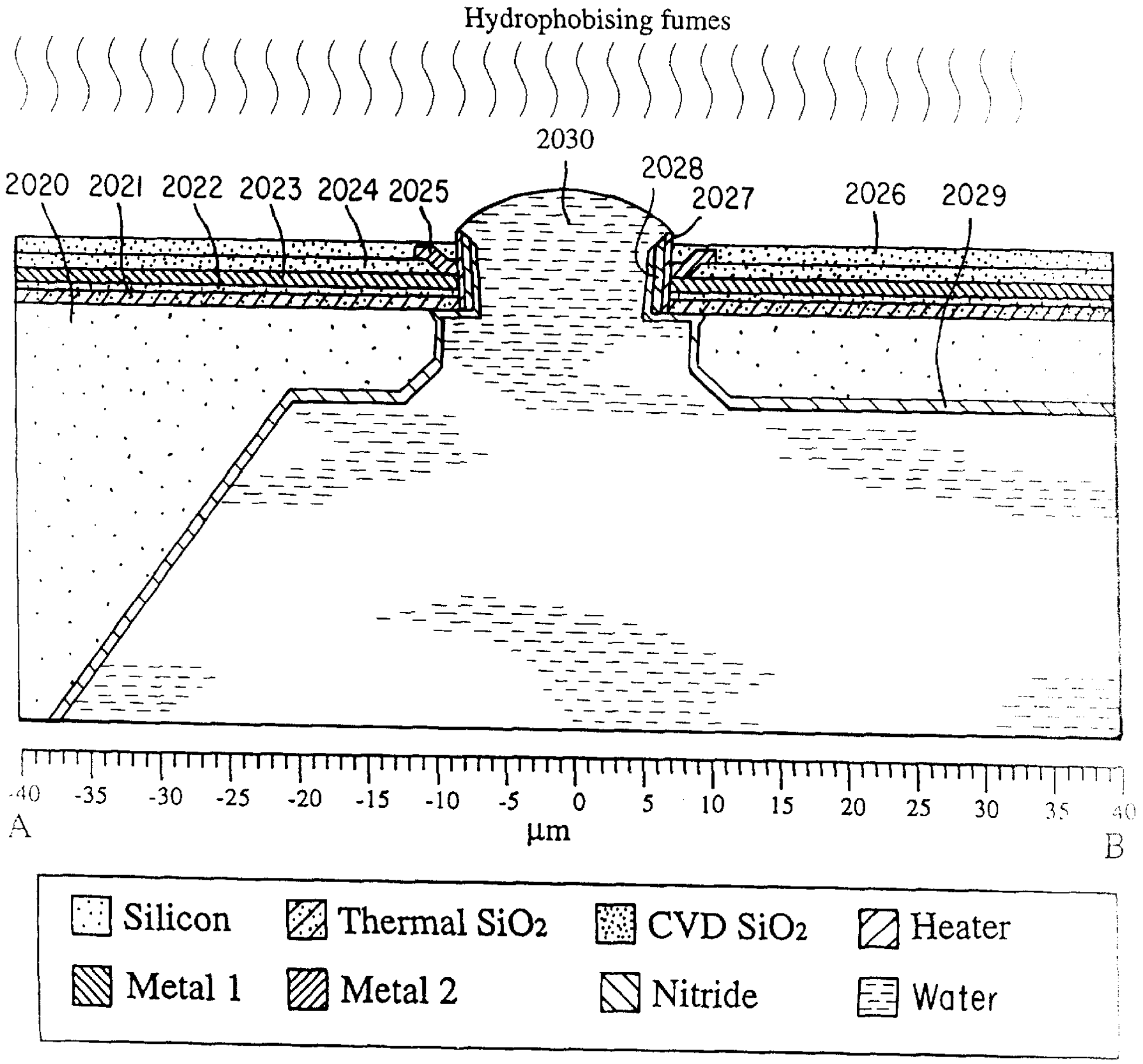

The water prevents the hydrophobising agent from affecting the inner surfaces of the print head, allowing the print head to fill by capillarity. FIG. 20 shows a cross section of the a nozzle during the hydrophobising process.

Figure 21:
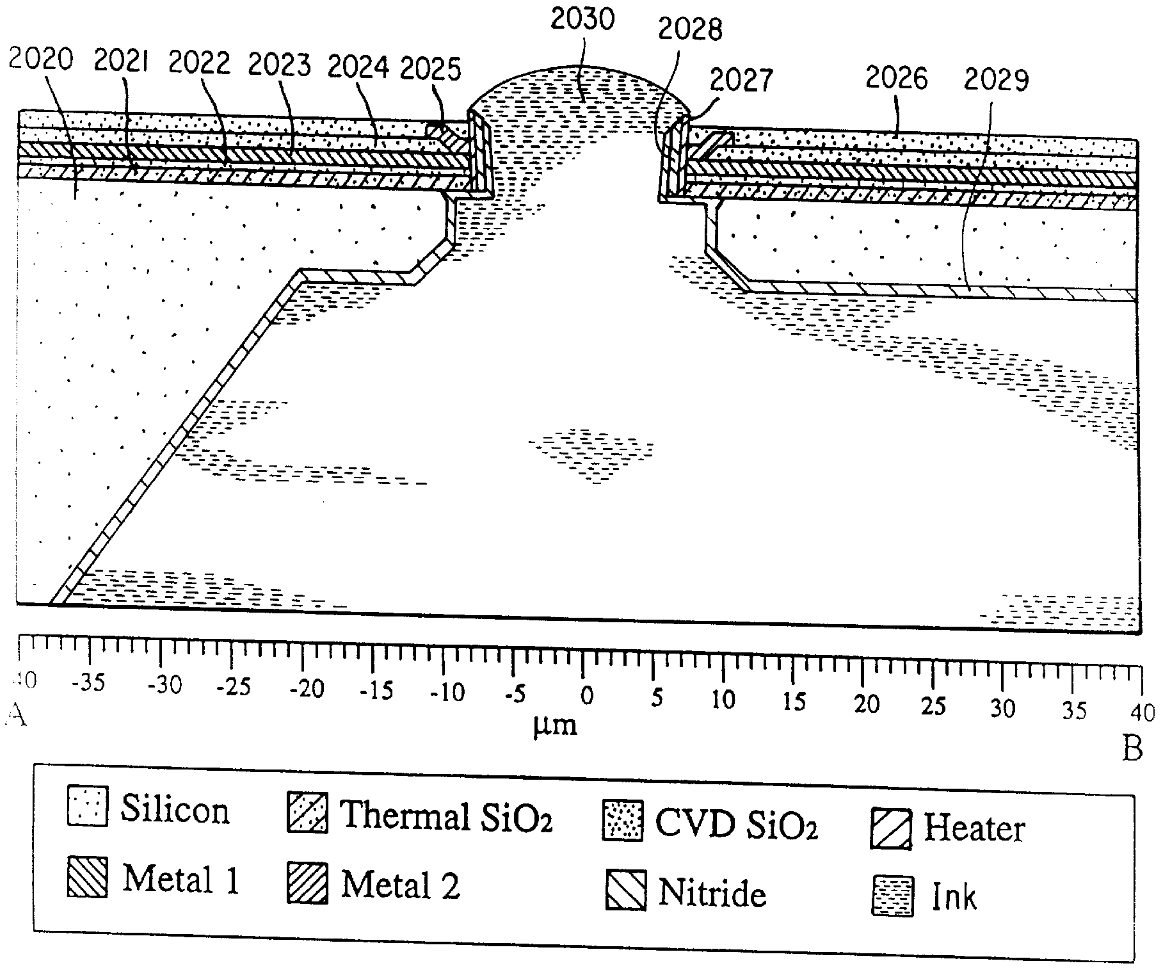

15) Package and wire bond. The device can then be connected to the ink supply, ink pressure applied, and functional testing can be performed. FIG. 21 shows a cross section of the a nozzle filled with ink 2031 in the quiescent state.

Figure 22:
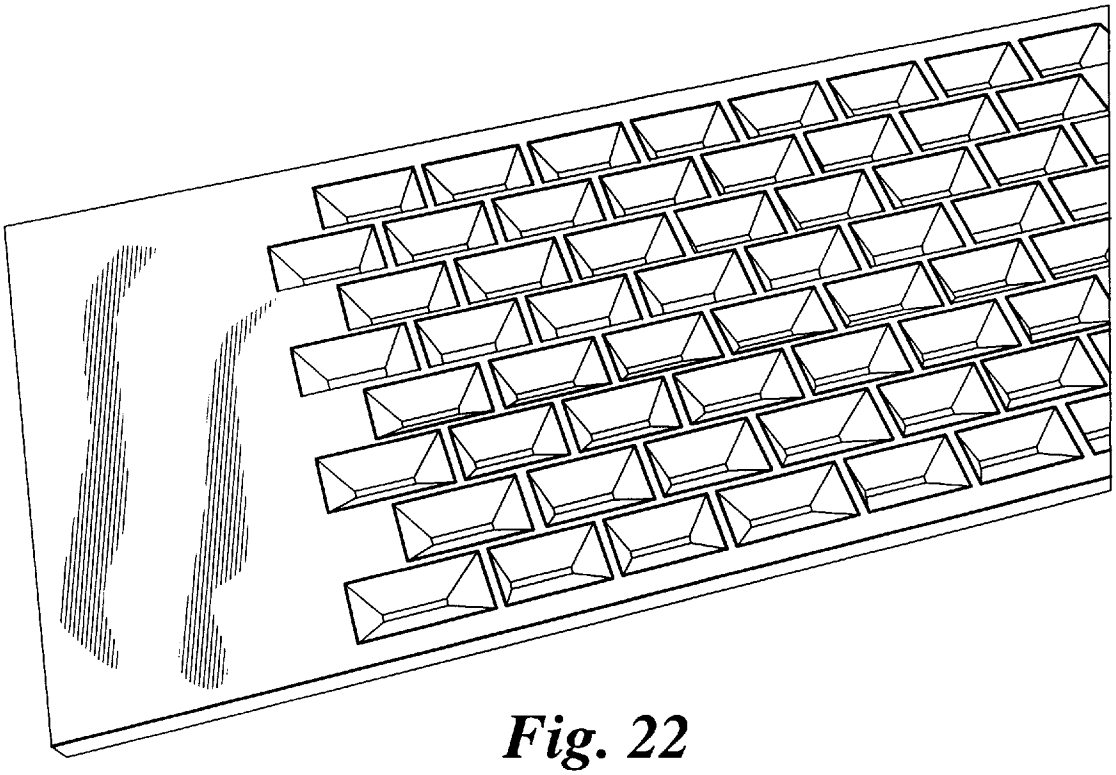
FIG. 22 shows a perspective view of the back on one print head chip.
Figure 23A:
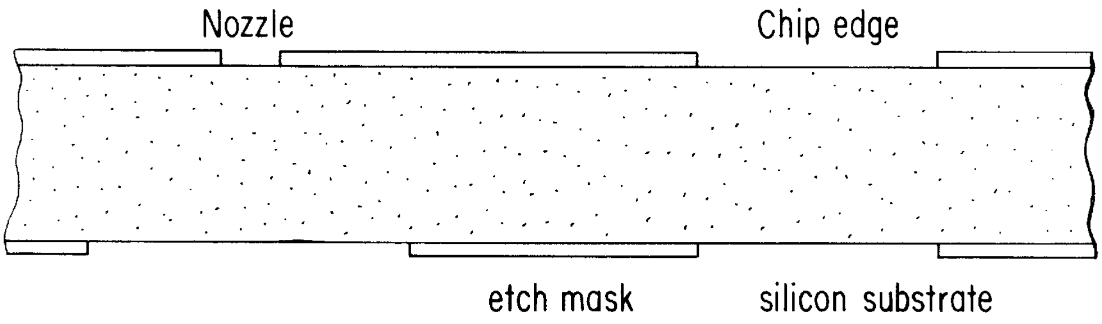
FIGS. 23(*a*) to 23(*e*) show the simultaneous etching of nozzles and chip separation. These diagrams are not to scale.
Figure 23B:
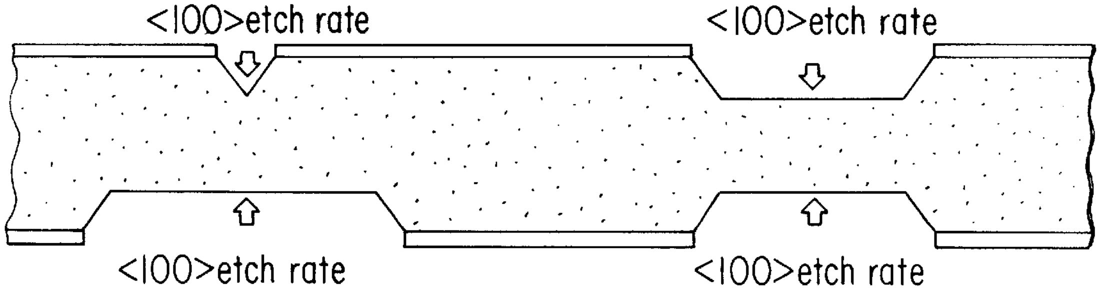
Figure 23C:
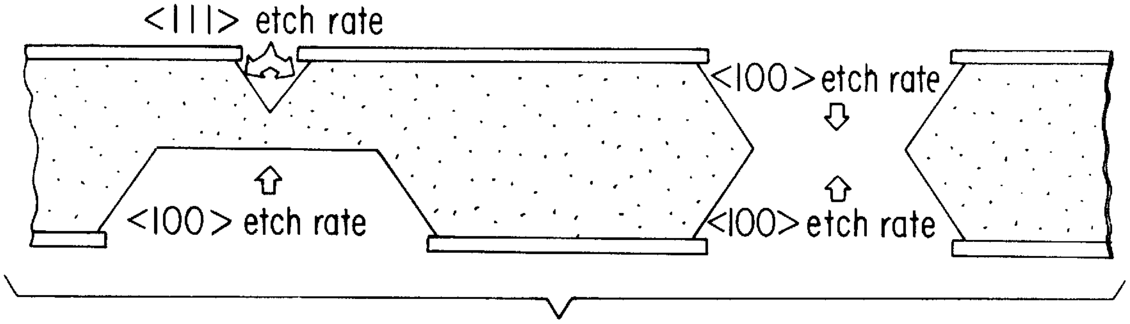
Figure 23D:
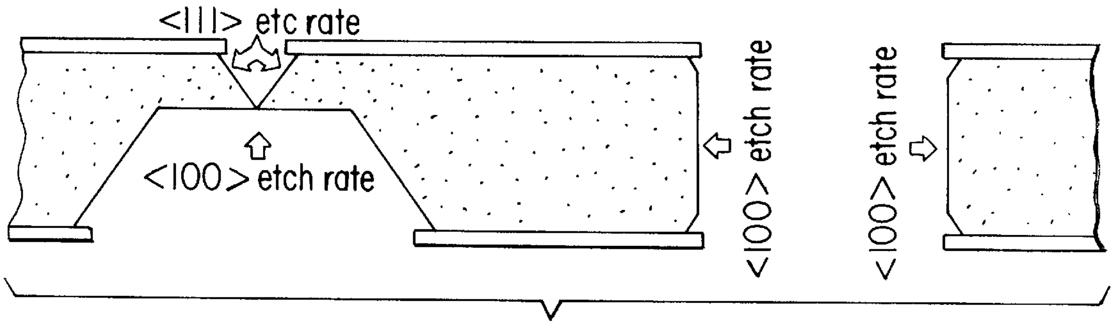
Figure 23E:
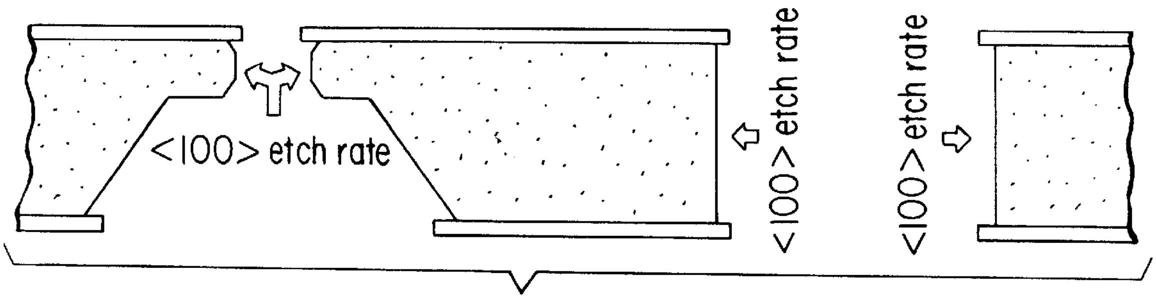

FIG. 22 shows a perspective view of the ink channels seen from the back face of a chip.

FIGS. 23(*a*) to 23(*e*) are cross sections of the wafer which show the simultaneous etching of nozzles and chip edges for chip separation. These diagrams are not to scale. FIG. 23(*a*) shows two regions of the chip, the nozzle region and the chip edge region before etching, along with the masked regions for nozzle tips, ink channels, and chip edges. FIG. 23(*b*) shows the wafer after the nozzle tip holes have been etched at the <100> etch rate, forming pyramidical pits. At this time, etching of the nozzle tip holes slows to the <111> etch rate. Etching of the chip edges and the ink channels proceeds simultaneously. FIG. 23(*c*) shows the wafer at the time that the pit being etched at the chip edge from the front side of the wafer meets the pit being etched from the back side of the wafer. FIG. 23(*d*) shows the wafer at the time that ink channel pit meets the nozzle tip pit. The etching of the edges of the wafer has proceeded simultaneously at the <100> rate in a horizontal direction. FIG. 23(*e*) shows the wafer after etching is complete, and the nozzles have been formed.

Figure 24:
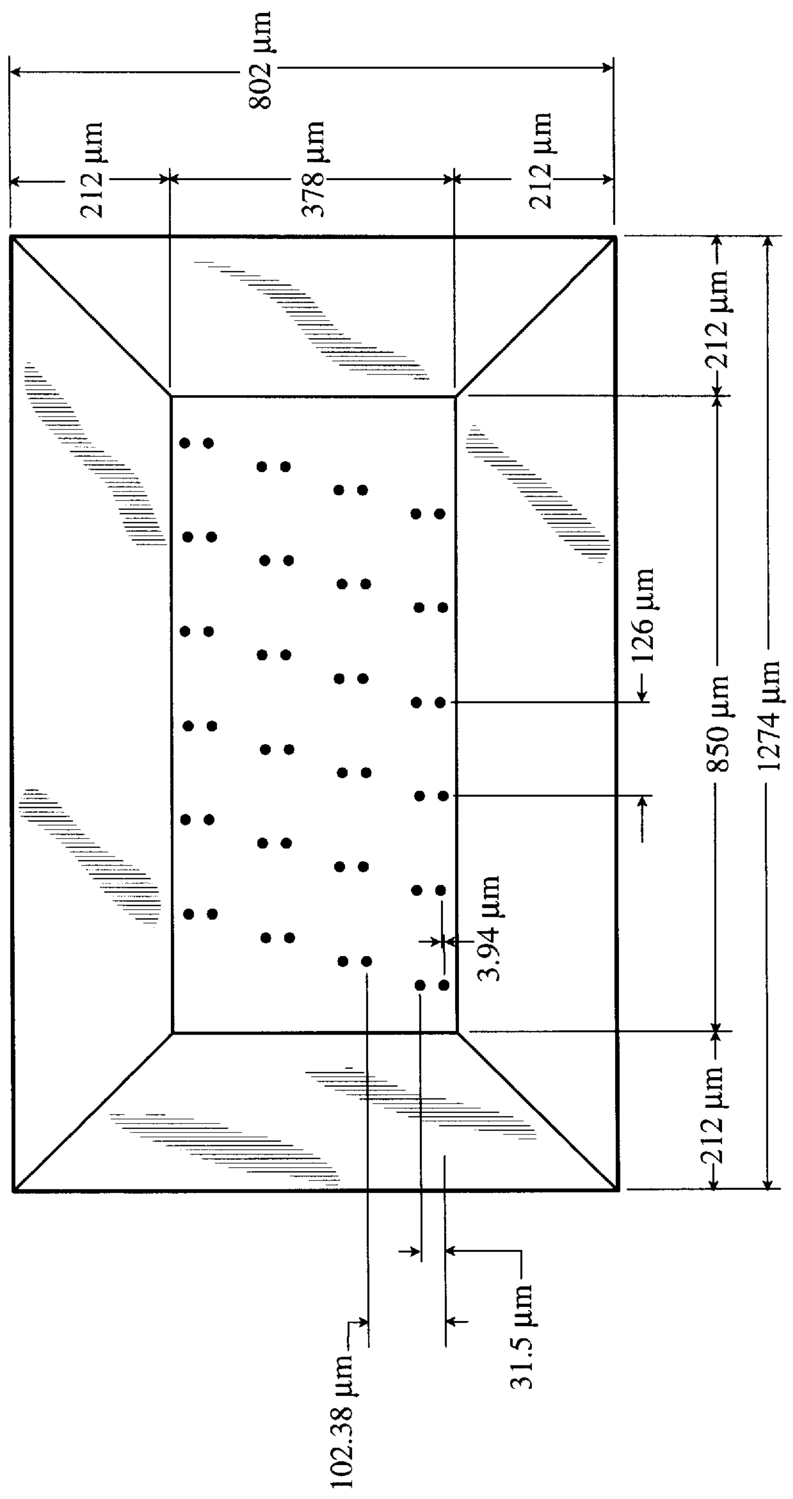
FIG. 24 shows dimensions of the layout of a single ink channel pit with 24 main nozzles and 24 redundant nozzles.

FIG. 24 shows dimensions of the layout of a single ink channel pit with 24 main nozzles and 24 redundant nozzles manufactured by the method disclosed herein.

Figure 25:
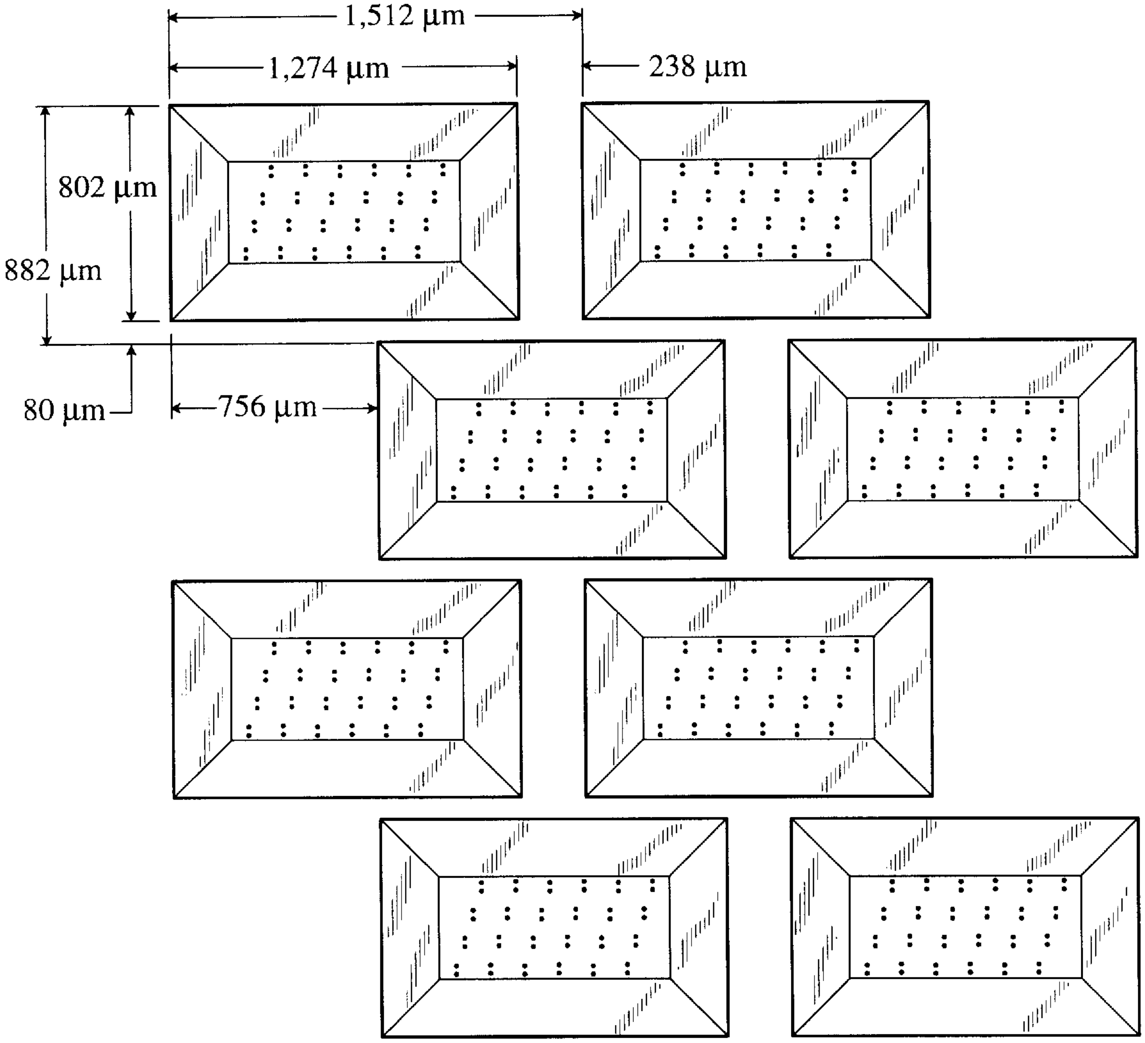
FIG. 25 shows an arrangement and dimensions of 8 ink channel pits, and their corresponding nozzles, in a print head.

FIG. 25 shows an arrangement and dimensions of 8 ink channel pits, and their corresponding nozzles, ink a print head.

Figure 26:
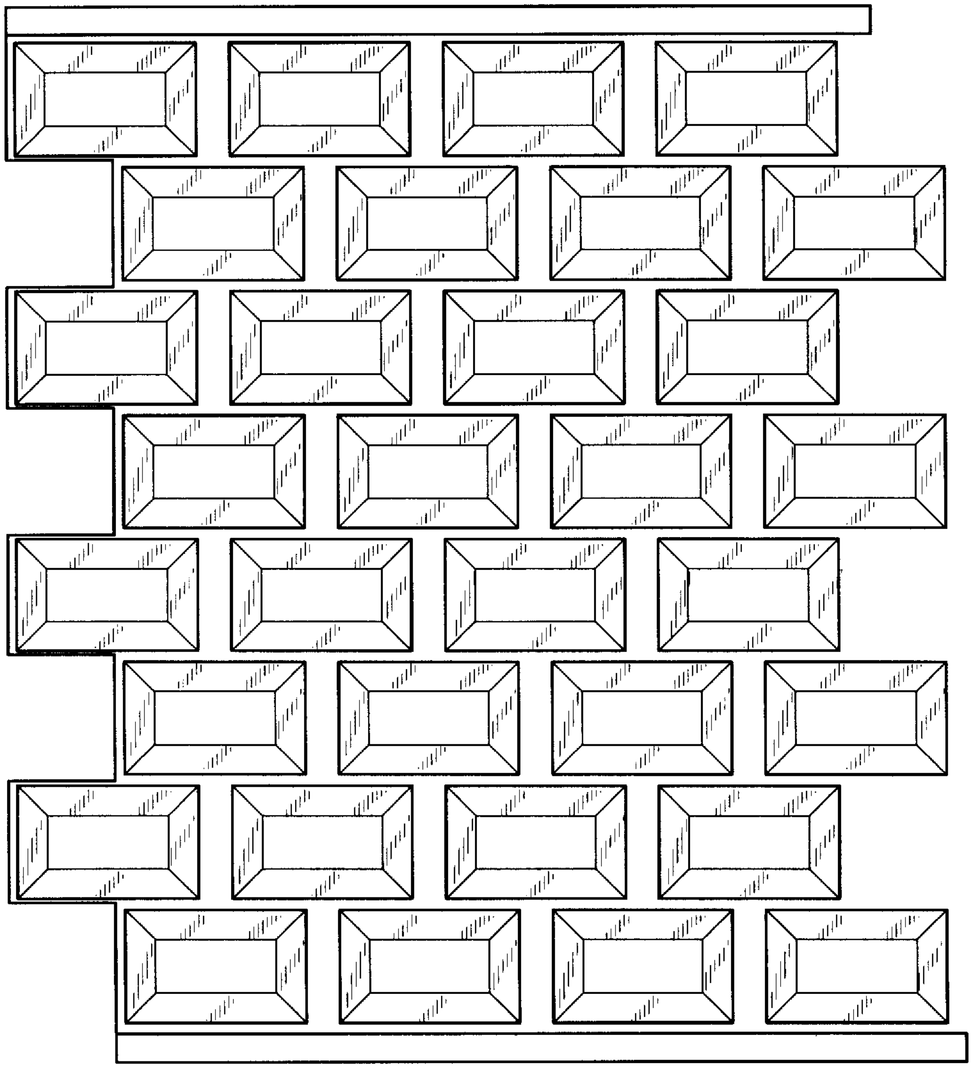
FIG. 26 shows 32 ink channel pits at one end of a four color print head.

FIG. 26 shows 32 ink channel pits at one end of a four color print head. There are two rows of ink channel pits for each of the four process colors: cyan, magenta, yellow and black.

Figure 27A:
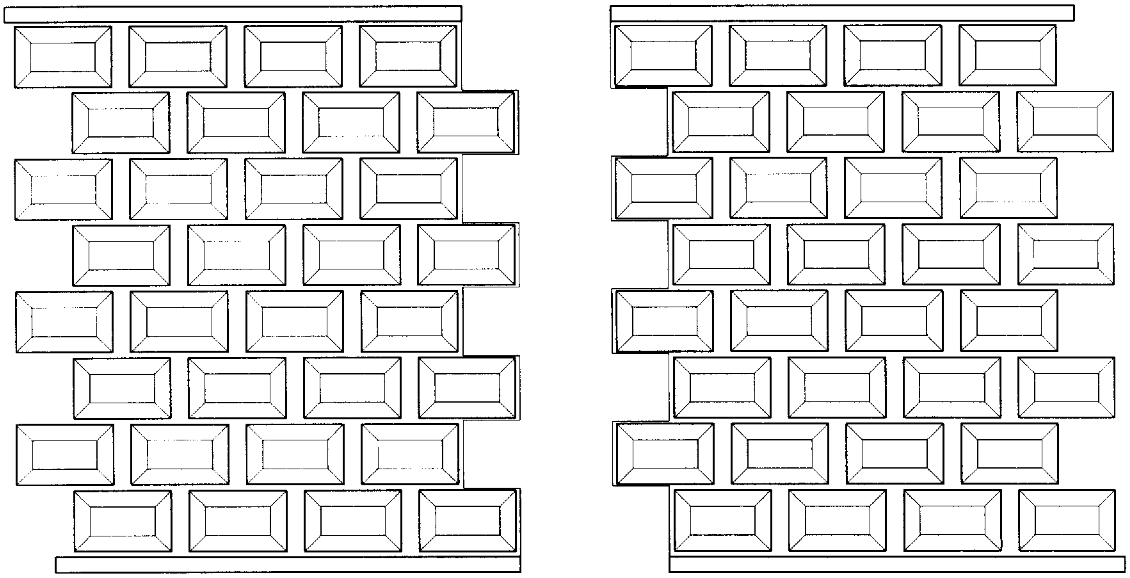
FIG. 27(*a*) and FIG. 27(*b*) show the ends of two adjacent print head chips (modules) as they are butted together to form longer print heads.
Figure 27B:
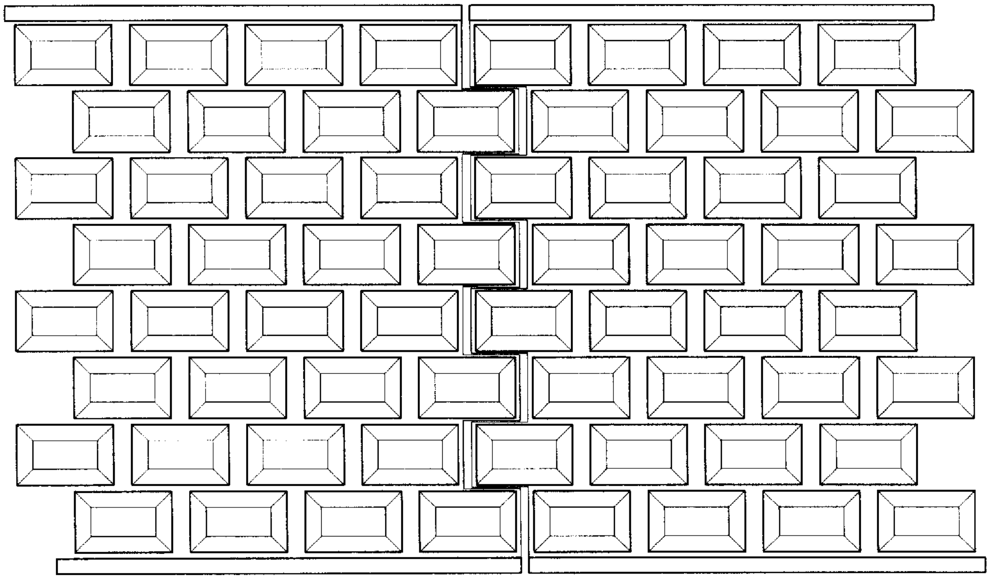

FIG. 27(*a*) and FIG. 27(*b*) show the ends of two adjacent print head chips (modules) as they are butted together to form longer print heads. The precise alignment of the print head chips, without offsetting the print head chips in the scan direction, allows printing without visible joins between the printed swaths on the page.

Figure 28:
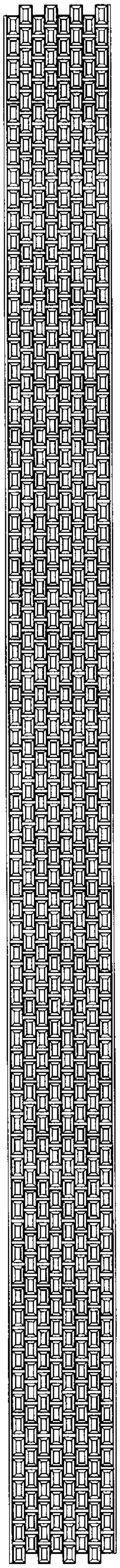
FIG. 28 shows the full complement of ink channel pits on a 4" (100 mm) monolithic print head module.

FIG. 28 shows the full complement of ink channel pits on a 4" (100 mm) monolithic print head module.

The foregoing describes preferred embodiments of the present invention. Modifications, obvious to those skilled in the art, can be made thereto without departing from the scope of the invention.

I claim:

1. A process for manufacturing a thermally activated drop on demand printing head said process including the following;

(a) forming, on a substrate surface, at least one generally planar electrode layer;

(b) etching a nozzle hole through said electrode layer to form separate electrode portions; and (c) forming a resistive heater coating on the surfaces of said nozzle hole, in such a manner that electrical contact is made between each of said electrode portions and said heater coating substance.

2. A process for manufacturing a thermally activated drop on demand printing head said process comprising:

(a) forming a plurality of electrodes on a silicon wafer substrate;

(b) forming a surface layer on the top of said substrate;

(c) etching a plurality of nozzle tip holes through said surface layer, intersecting said electrodes;

(d) coating said nozzle tip holes with a resistive heater substance, in such a manner that electrical contact is made between said electrodes and said resistive heater substance; and (e) selectively removing said resistive heater substance from regions apart from said nozzle tip holes.

3. A process as claimed in claim 2 further including the step of etching part of said surface layer so that said resistive heater substance forms a rim protruding from said surface layer.

4. A process as claimed in claim 2 further including the step of coating said resistive heater substance with a passivation layer before removing said heater substance from regions apart from said nozzle tip holes, and removing said passivation layer from regions apart from said nozzle tip holes.

5. A process as claimed in claim 4 wherein said passivation layer is composed of silicon nitride.

6. A process as claimed in claim 2 further including the step of etching a plurality of nozzle barrel holes wherein the etchant accesses the front surface of said substrate through said nozzle tip holes.

7. A process as claimed in claim 2 further including the step of anisotropically etching one or more ink channels from the back surface of said substrate.

8. A process as claimed in claim 2 wherein said substrate is composed of single crystal silicon.

9. A process as claimed in claim 2 wherein said substrate is a single crystal silicon wafer of <100> crystallographic orientation.

10. A process as claimed in claim 2 wherein said surface layer is substantially composed of silicon dioxide.

11. A process as claimed in claim 2 wherein said nozzle tip hole is fabricated with a radius less than 50 microns.

12. A process as claimed in claim 2 wherein said substrate is composed of single crystal silicon, and said ink channels are etched exposing {111} crystallographic planes of said substrate.

13. A process as claimed in claim 2 wherein drive circuitry is fabricated on the same substrate as the nozzles.

* * * * *